United States Patent
Singh

(10) Patent No.: US 11,593,456 B1
(45) Date of Patent: Feb. 28, 2023

(54) RESISTIVE MATRIX COMPUTATION CIRCUIT

(71) Applicant: Ambient Scientific, Inc., San Jose, CA (US)

(72) Inventor: Gajendra Prasad Singh, San Jose, CA (US)

(73) Assignee: Ambient Scientific, Inc., San Jose, CA (US)

( * ) Notice: Subject to any disclaimer, the term of this patent is extended or adjusted under 35 U.S.C. 154(b) by 95 days.

(21) Appl. No.: 16/922,634

(22) Filed: Jul. 7, 2020

Related U.S. Application Data

(63) Continuation of application No. 16/385,979, filed on Apr. 16, 2019, now abandoned.

(60) Provisional application No. 62/808,793, filed on Feb. 21, 2019.

(51) Int. Cl.
| | |
|---|---|
| *G06F 17/16* | (2006.01) |
| *G06F 7/544* | (2006.01) |
| *H03K 19/20* | (2006.01) |

(52) U.S. Cl.
CPC ............ *G06F 17/16* (2013.01); *G06F 7/5443* (2013.01); *H03K 19/20* (2013.01)

(58) Field of Classification Search
CPC ........ G06F 17/16; G06F 7/5443; H03K 19/20
USPC ........................................................ 708/209
See application file for complete search history.

(56) References Cited

U.S. PATENT DOCUMENTS

| | | | |
|---|---|---|---|
| 8,626,815 B1* | 1/2014 | Langhammer | G06F 17/16 708/607 |
| 10,819,362 B1* | 10/2020 | Singh | H03M 1/38 |
| 2020/0140834 A1* | 5/2020 | Wang | C07K 14/435 |
| 2022/0137924 A1* | 5/2022 | Wang | H03K 19/017581 708/200 |

* cited by examiner

*Primary Examiner* — Tan V Mai
(74) *Attorney, Agent, or Firm* — White and Williams, LLP

(57) ABSTRACT

A resistive matrix computation circuit and methods for using the same are disclosed. In one embodiment, a resistive matrix computation circuit includes a memory configured to store a first set of operands and a second set of operands, where the first set of input operands and the second set of input operands are programmable by a controller, and the first set of operands and the second set of operands are cross-multiplied to form a plurality of product pairs, a plurality of resistive multiplier circuits configured to generate a plurality of output voltages according to the plurality of product pairs; the controller is configured to control the plurality of resistive multiplier circuits to perform multiplications using the first set of operands and the second set of operands, and an aggregator circuit configured to aggregate the plurality of output voltages from the plurality of resistive multiplier circuits, where the plurality of output voltages represent an aggregated value of the plurality of product pairs.

24 Claims, 51 Drawing Sheets

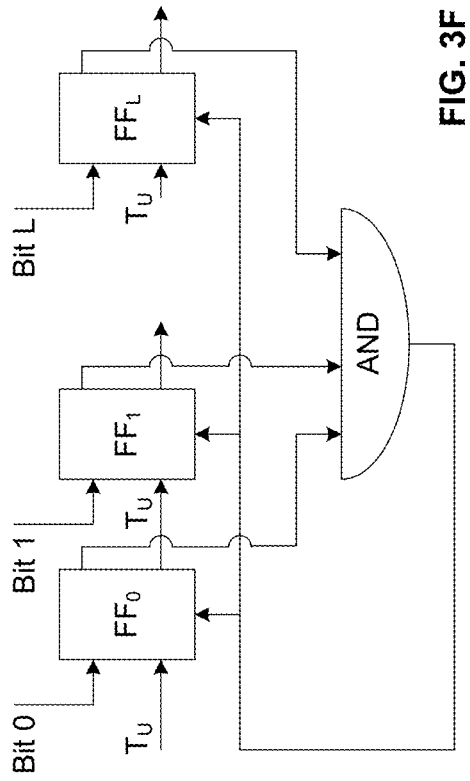
FIG. 3F
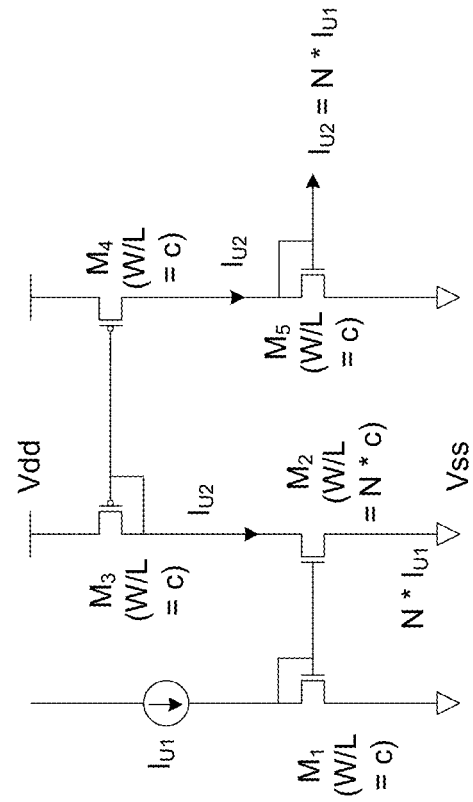
FIG. 3G
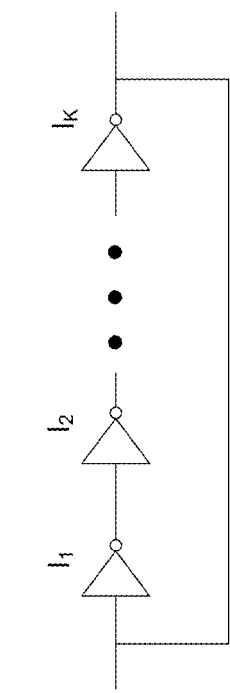
FIG. 3D
FIG. 3E

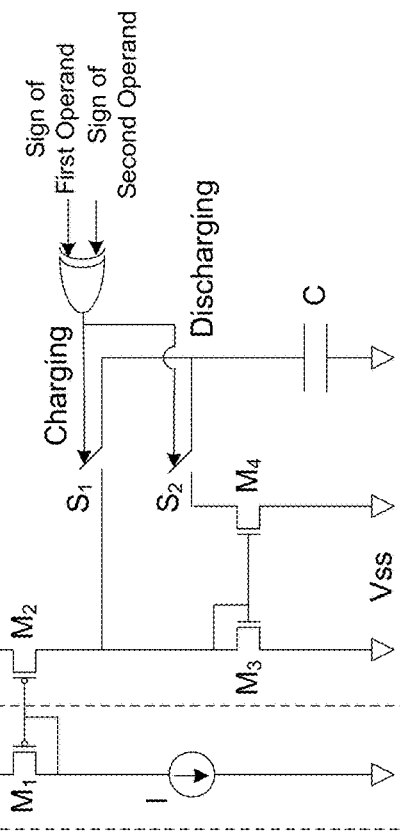
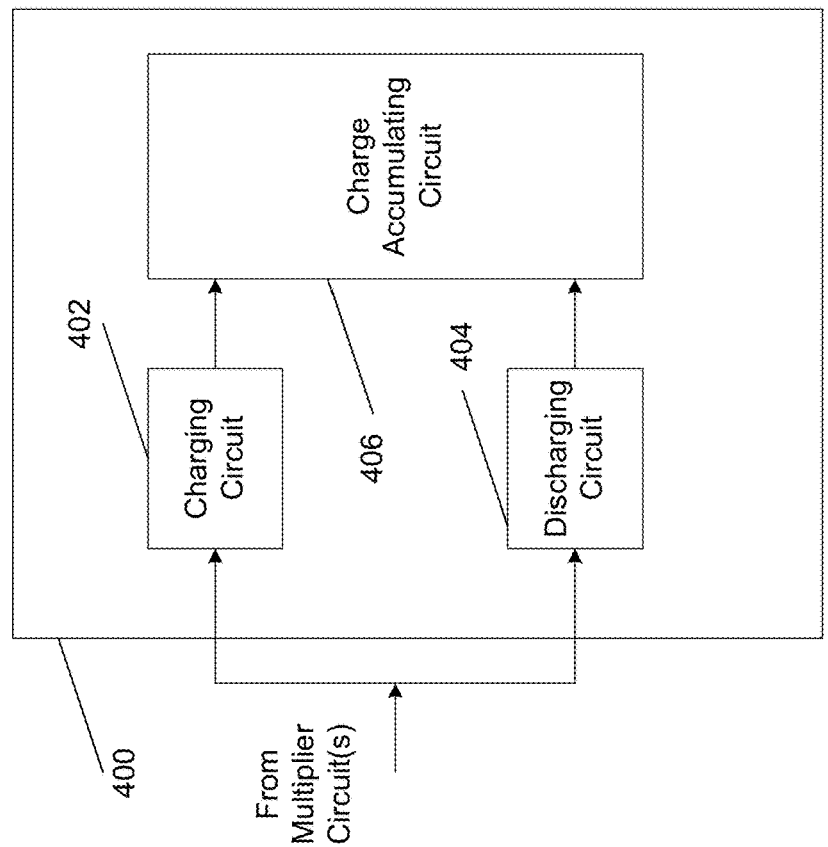
FIG. 4B
FIG. 4A

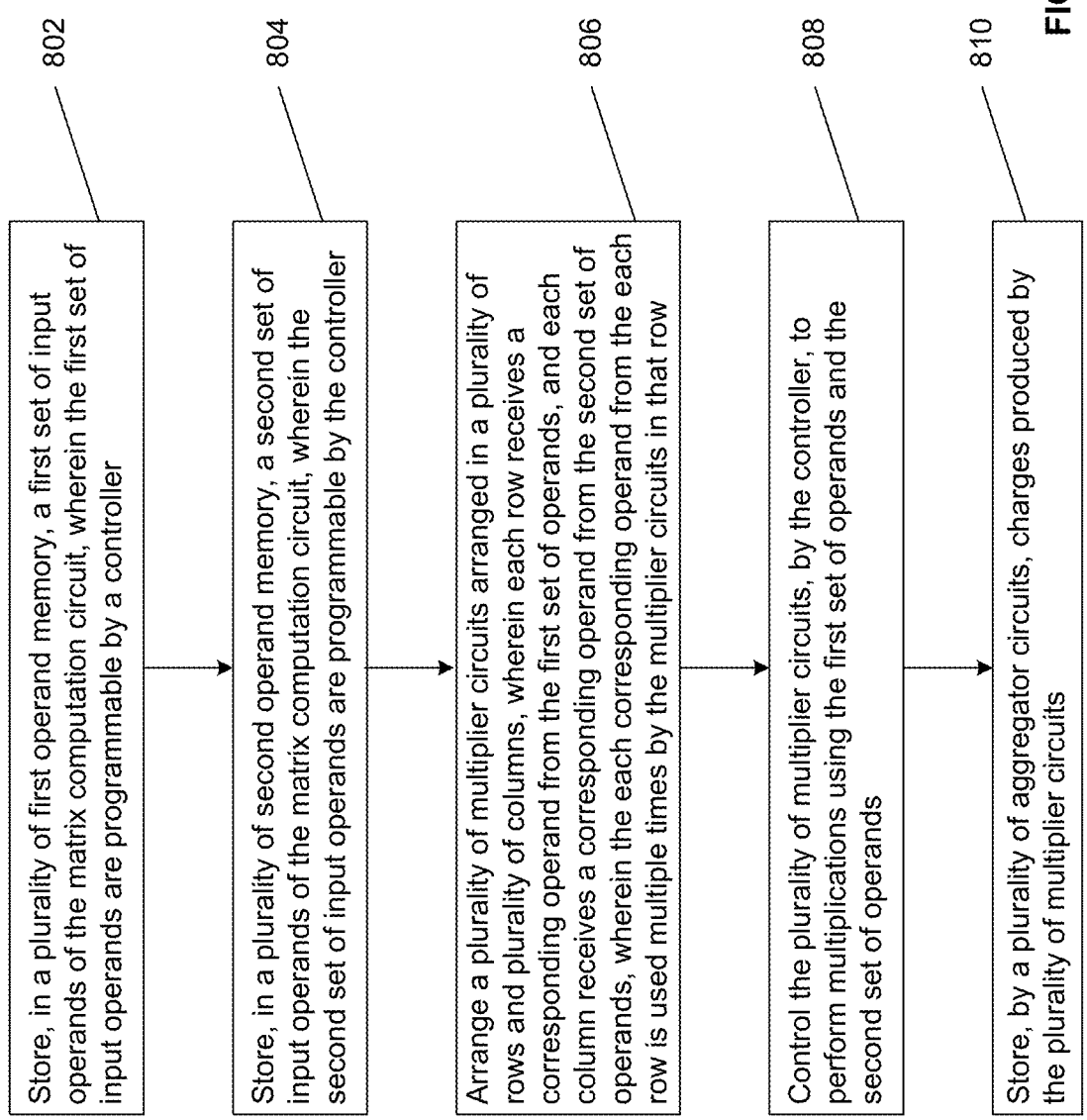

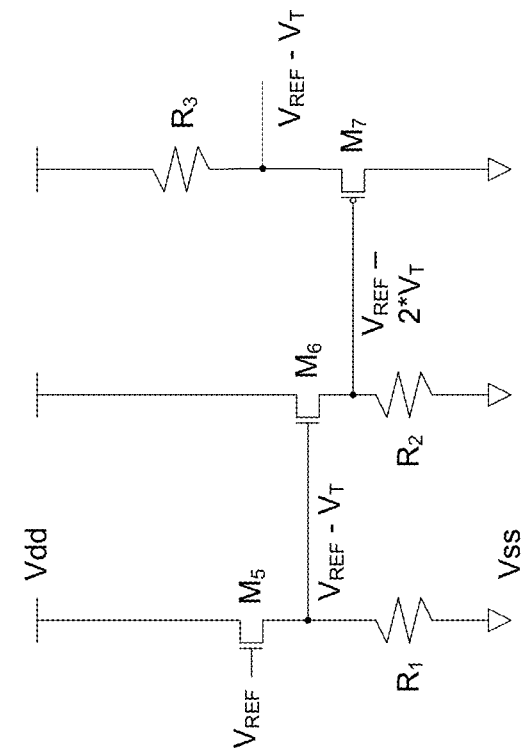
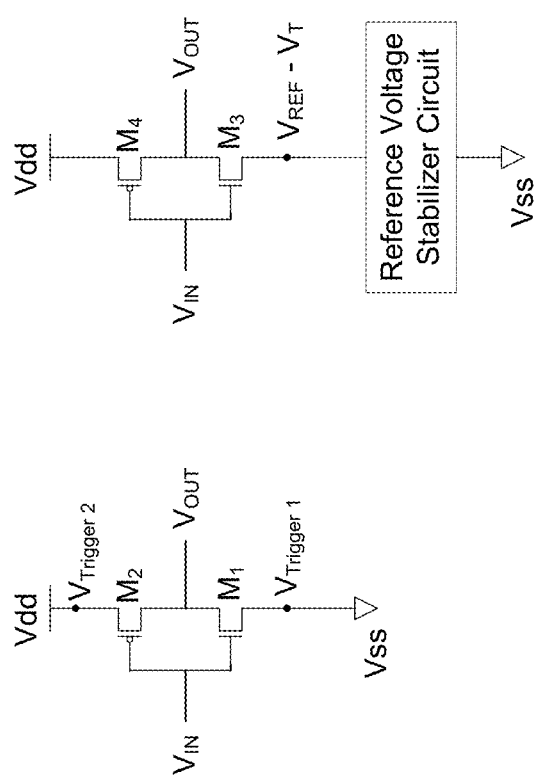
FIG. 10C
FIG. 10B
FIG. 10A

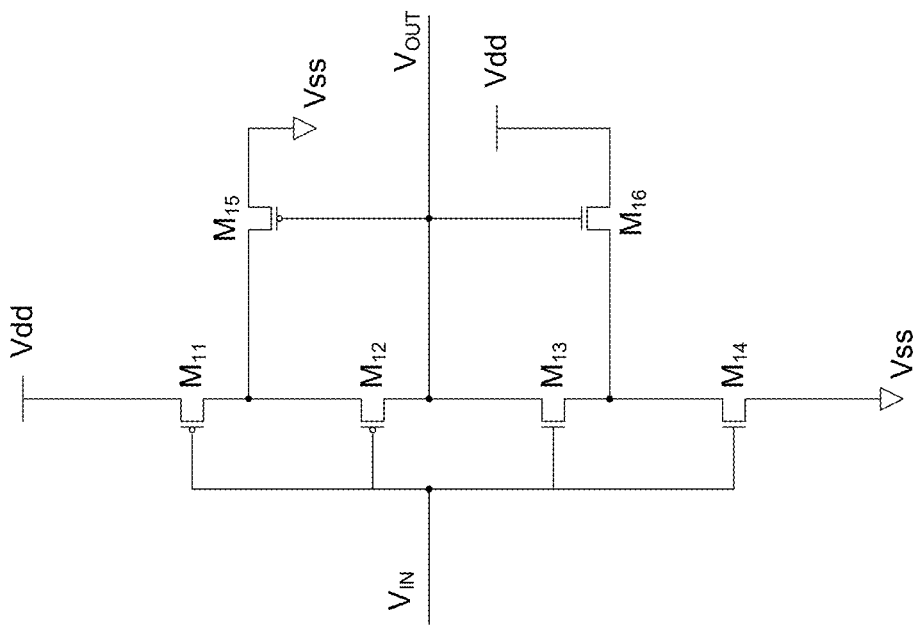
FIG. 11C
FIG. 11B
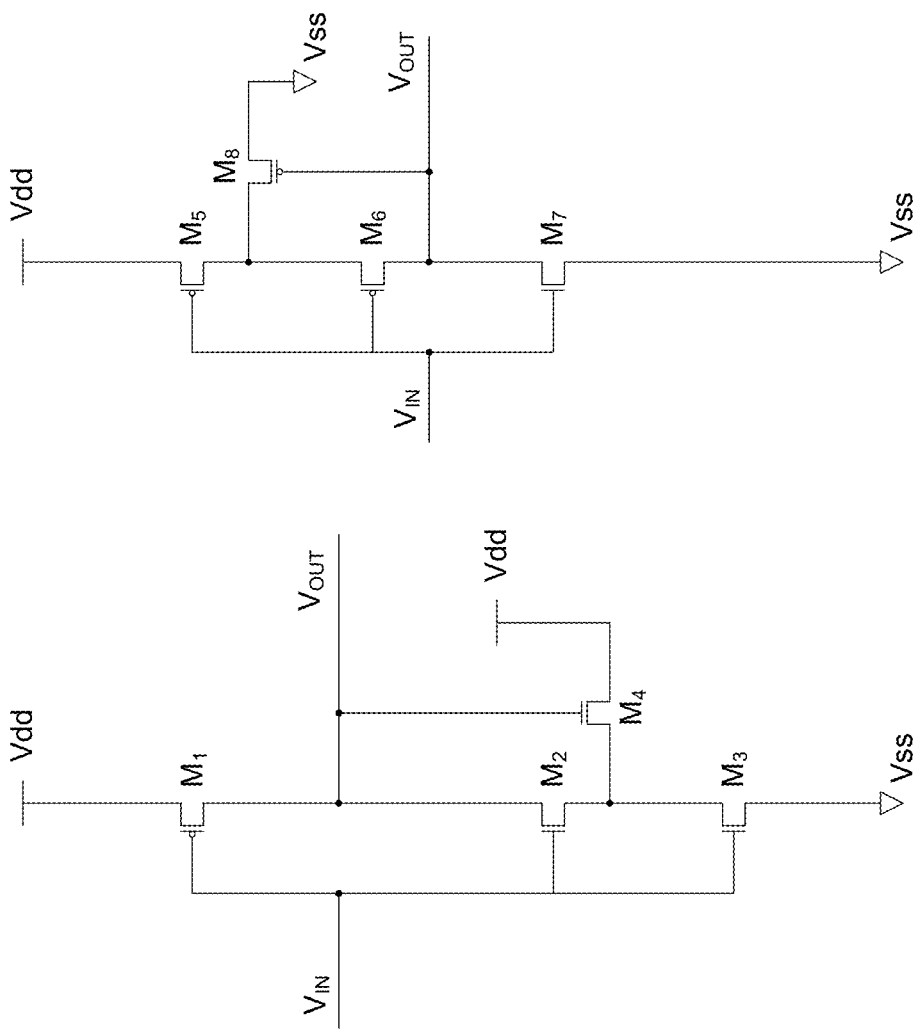
FIG. 11A

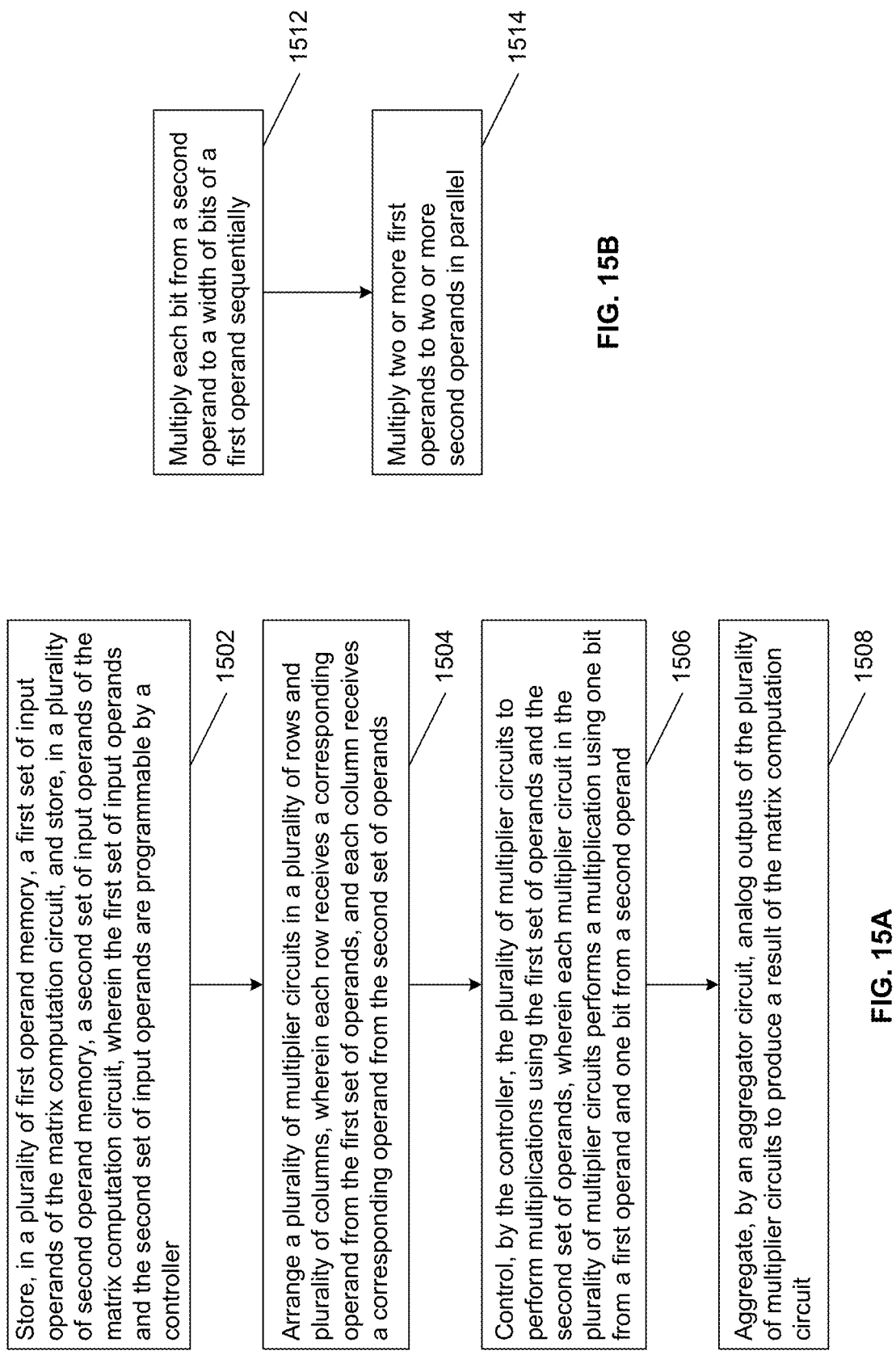

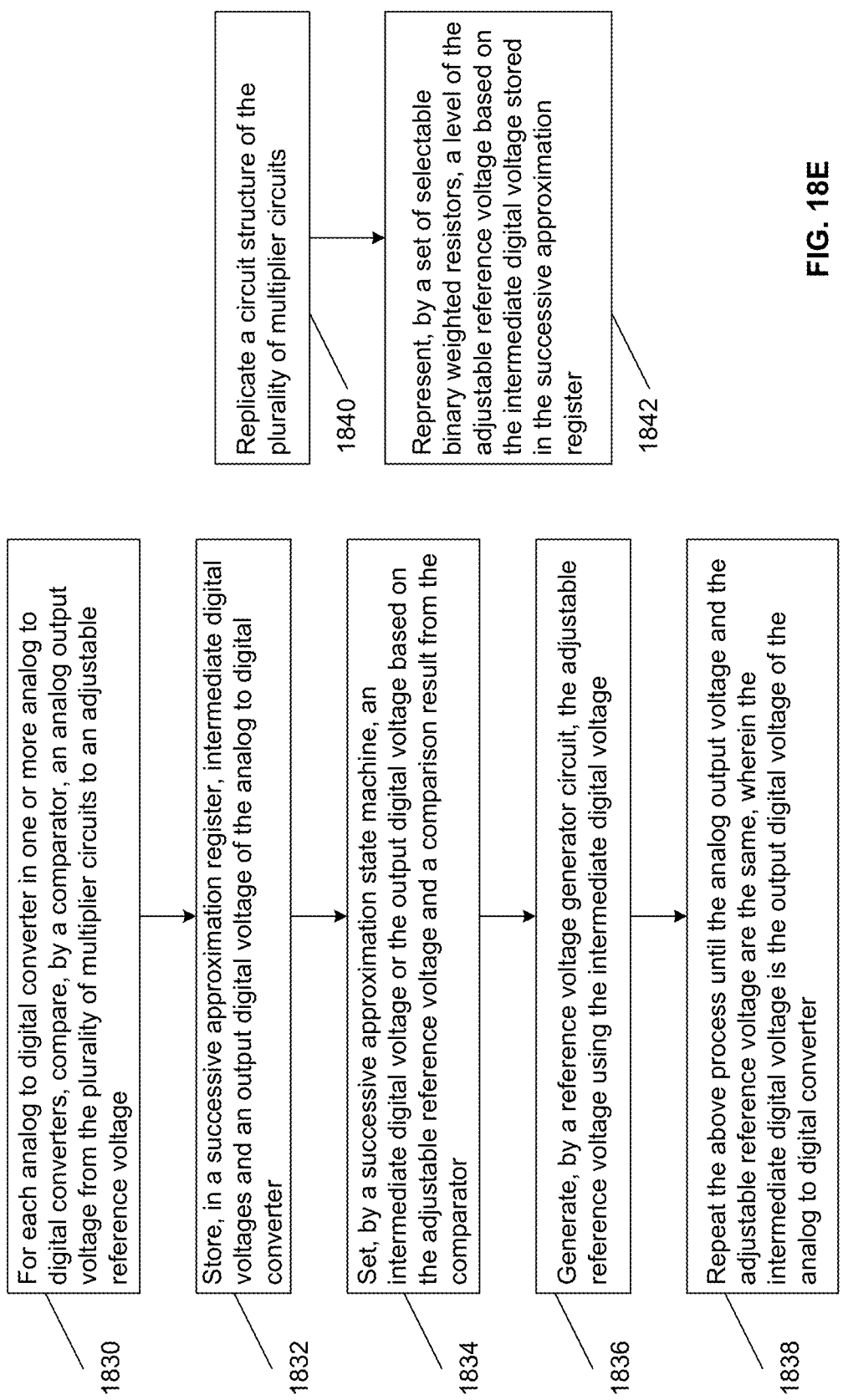

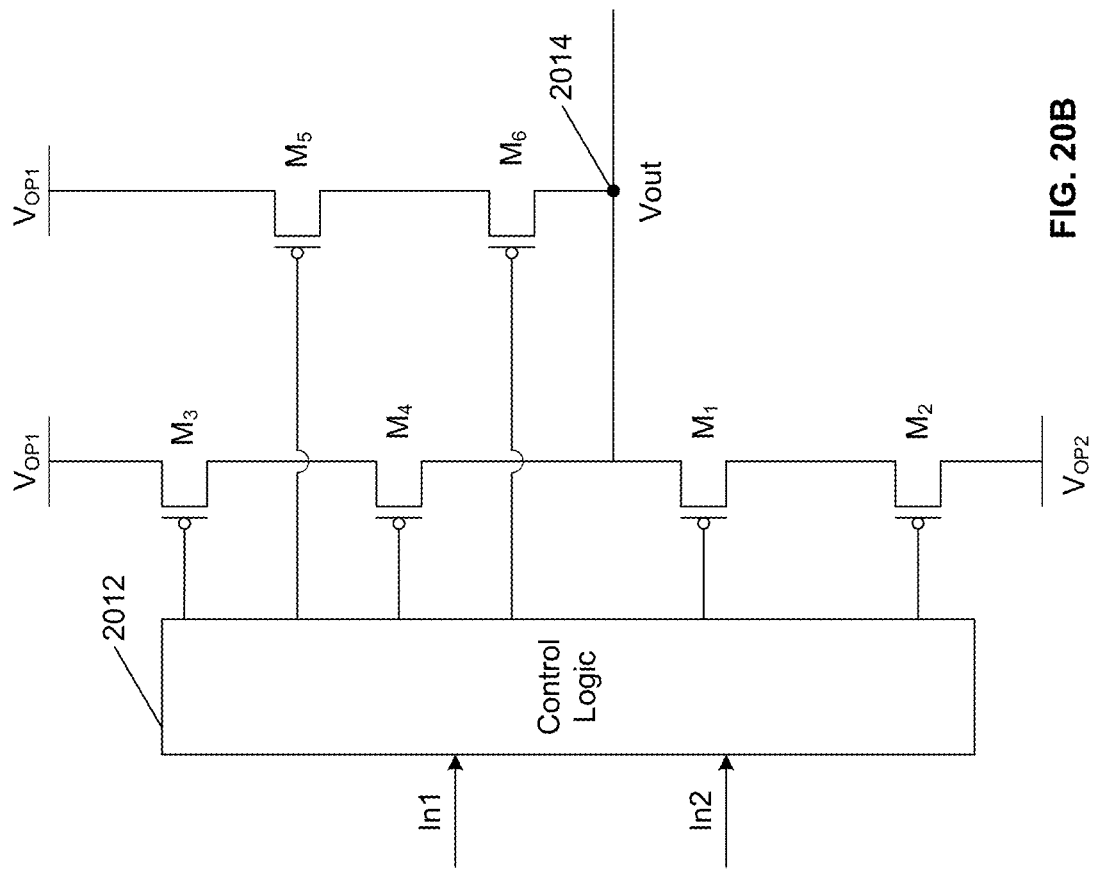
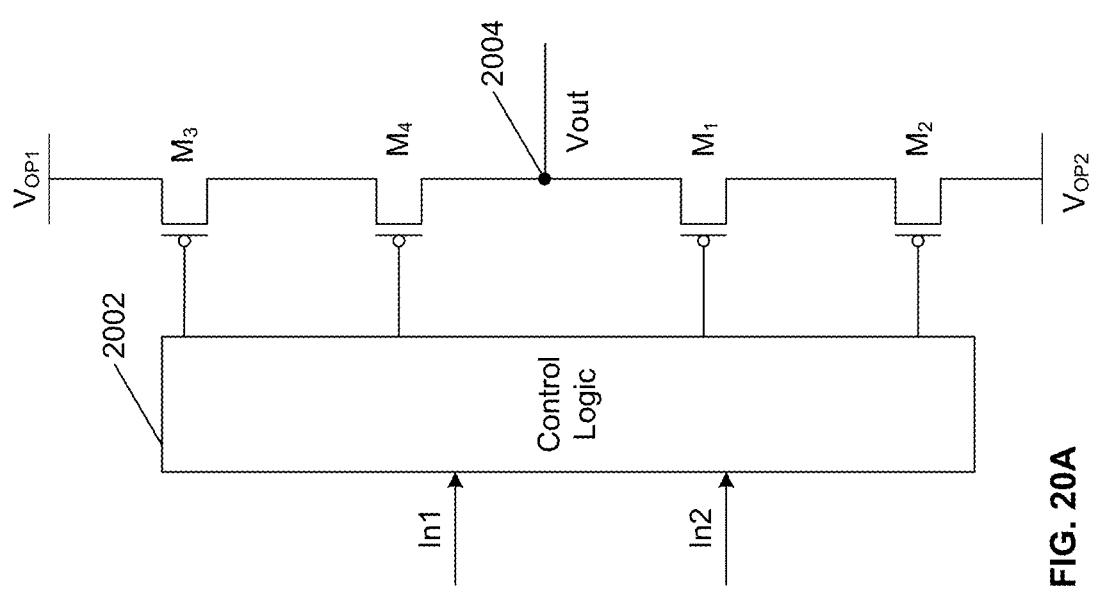
FIG. 20B
FIG. 20A

RESISTIVE MATRIX COMPUTATION CIRCUIT

CROSS-REFERENCE TO RELATED APPLICATIONS

This application is a continuation of U.S. patent application Ser. No. 16/385,979, "A Resistive Matrix Computation Circuit," filed Apr. 16, 2019, which claims the benefit of U.S. patent application No. 62/808,793, "Scalable Precision Analog Matrix Computation Circuit," filed Feb. 21, 2019. The aforementioned United States patent applications are hereby incorporated by reference in their entirety.

FIELD

The present invention relates to the field of integrated circuits. In particular, the present invention relates to a resistive matrix computation circuit and methods for using the same.

BACKGROUND

The multiply-accumulate (MAC) operation is commonly used in a broad spectrum of applications in scientific and engineering fields. To compute an expression such as $A_1*B_1+A_2*B_2+ \ldots +A_N*B_N$, a digital signal processor (DSP) may employ a dedicated MAC, consisting of a multiplier implemented in combinational logic followed by an adder and an accumulator register that stores the result. The output of the register is fed back to one input of the adder, so that on each clock cycle, the output of the multiplier is added to the register. Combinational multipliers require a large amount of logic, but can compute a product much more quickly than the method of shifting and adding approach used by conventional microprocessors. One drawback of this approach is that each multiplication operation or add operation is performed serially, which can significantly reduce the performance of the system. Another conventional approach is to employ multiple MACs to perform all the digital multiplications in parallel, store the intermediate results, and then perform all the additions in parallel. Although the latter approach has improved the performance over the single multiplier-adder approach, this latter approach still involves storing and reading intermediate results in registers. Not only it adds complications to the control logic, but it still introduces delays in storing and reading of the intermediate results. In modern real time artificial intelligence applications, when the number of product pairs increases, the conventional approach can reach performance bottlenecks and implementation bottlenecks.

Therefore, it is desirable to have a resistive matrix computation circuit and methods for using the same in order to improve the speed and efficiency of the above conventional computation methods.

SUMMARY

A resistive matrix computation circuit and methods for using the same are disclosed. In one embodiment, a resistive matrix computation circuit includes a memory configured to store a first set of operands and a second set of operands, where the first set of input operands and the second set of input operands are programmable by a controller, and the first set of operands and the second set of operands are cross-multiplied to form a plurality of product pairs, a plurality of resistive multiplier circuits configured to generate a plurality of output voltages according to the plurality of product pairs; the controller is configured to control the plurality of resistive multiplier circuits to perform multiplications using the first set of operands and the second set of operands, and an aggregator circuit configured to aggregate the plurality of output voltages from the plurality of resistive multiplier circuits, where the plurality of output voltages represent an aggregated value of the plurality of product pairs.

In another embodiment, a method performing resistive matrix computation includes storing in a memory a first set of operands and a second set of operands, where the first set of operands and the second set of operands are cross-multiplied to form a plurality of product pairs, generating, by a plurality of multiplier circuits, a plurality of output voltages according to the plurality of product pairs, and aggregating, by an aggregator circuit, the plurality of output voltages from the plurality of multiplier circuits, where the plurality of output voltages represent an aggregated value of the plurality of product pairs.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the specification.

FIG. 3D illustrates an exemplary implementation of generating a reference time unit according to aspects of the present disclosure.

FIG. 3E illustrates another exemplary implementation of generating a reference time unit according to aspects of the present disclosure.

FIG. 3F illustrates an exemplary implementation of a counter circuit of FIG. 3A according to aspects of the present disclosure.

FIG. 3G illustrates yet an exemplary implementation of a time multiplier circuit according to aspects of the present disclosure.

FIG. 4A illustrates an exemplary implementation of an aggregator circuit according to aspects of the present disclosure.

FIG. 4B illustrates an exemplary implementation of a charging and discharging circuit according to aspects of the present disclosure.

FIG. 8A illustrates an exemplary method of performing scalable matrix computation according to aspects of the present disclosure.

FIG. 10A illustrates an exemplary implementation of a voltage comparator circuit according to aspects of the present disclosure.

FIG. 10B illustrates another exemplary implementation of a voltage comparator circuit according to aspects of the present disclosure.

FIG. 10C illustrates an exemplary implementation of a reference voltage stabilizer circuit according to aspects of the present disclosure.

FIG. 11A illustrates an exemplary implementation of a voltage comparator according to aspects of the present disclosure.

FIG. 11B illustrates another exemplary implementation of a voltage comparator according to aspects of the present disclosure.

FIG. 11C illustrates yet another exemplary implementation of a voltage comparator according to aspects of the present disclosure.

FIG. 15A illustrates an exemplary implementation of a matrix computation circuit according to aspects of the present disclosure.

FIG. 15B illustrates an exemplary implementation of controlling the plurality of multiplier circuits to perform multiplications according to aspects of the present disclosure.

FIG. 18D illustrates an exemplary implementation of converting analog outputs of a set of multiplier circuits into one or more groups of digital values according to aspects of the present disclosure.

FIG. 18E illustrates an exemplary implementation of generating an adjustable reference voltage according to aspects of the present disclosure.

FIG. 20A-FIG. 20F illustrate exemplary implementations of a resistive multiplier circuit using PMOS transistors according to aspects of the present disclosure.

DESCRIPTION OF EMBODIMENTS

The following descriptions are presented to enable a person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

Figure 1A:
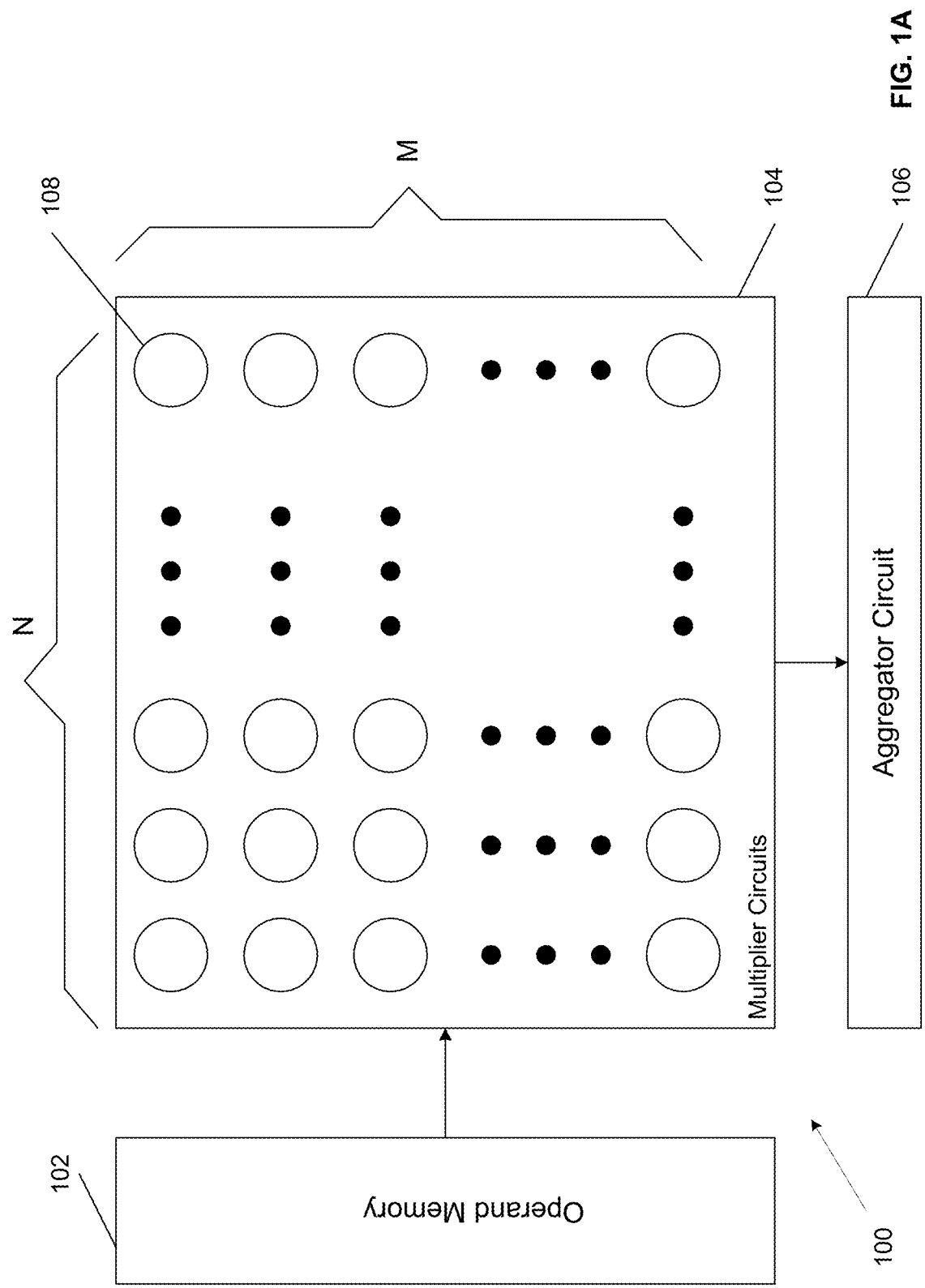
FIG. 1A illustrates an exemplary implementation of a multiply-accumulate circuit according to aspects of the present disclosure.

FIG. 1A illustrates an exemplary implementation of a multiply-accumulate circuit according to aspects of the present disclosure. In the example shown in FIG. 1A, a multiply-accumulate circuit 100 may include an operand memory 102, a plurality of computation circuits 104, and an aggregator circuit 106. The operand memory 102 may be configured to store a first set of operands and a second set of operands. The first set of operands and the second set of operands are cross-multiplied to form a plurality of product pairs. The plurality of computation circuits 104 may be configured to generate a plurality of charges according to the plurality of product pairs. The aggregator circuit 106 configured to aggregate the plurality of charges from the plurality of computation circuits to record variations of charges, where the variation of charges represent an aggregated value of the plurality of product pairs.

In some implementations, the plurality of computation circuits 104 may include multiple individual computation circuits, for example an individual computation circuit is represented by a circle 108. The plurality of computation circuits 104 may be arranged in rows and columns, such as the M rows and N columns as shown in the example of FIG. 1A. The number of rows and number of columns may be selected based on the requirements of a specific application. In one embodiment, an array of 64 rows and 8 columns may be used for certain applications. In another embodiment, an array of 32 rows and 16 columns may be used for certain other applications. According to aspects of the present disclosure, the M rows and N columns may be further partitioned to compute a smaller set of multiplications and accumulations, or to compute multiple smaller sets of multiplications and accumulations in parallel.

Figure 1B:
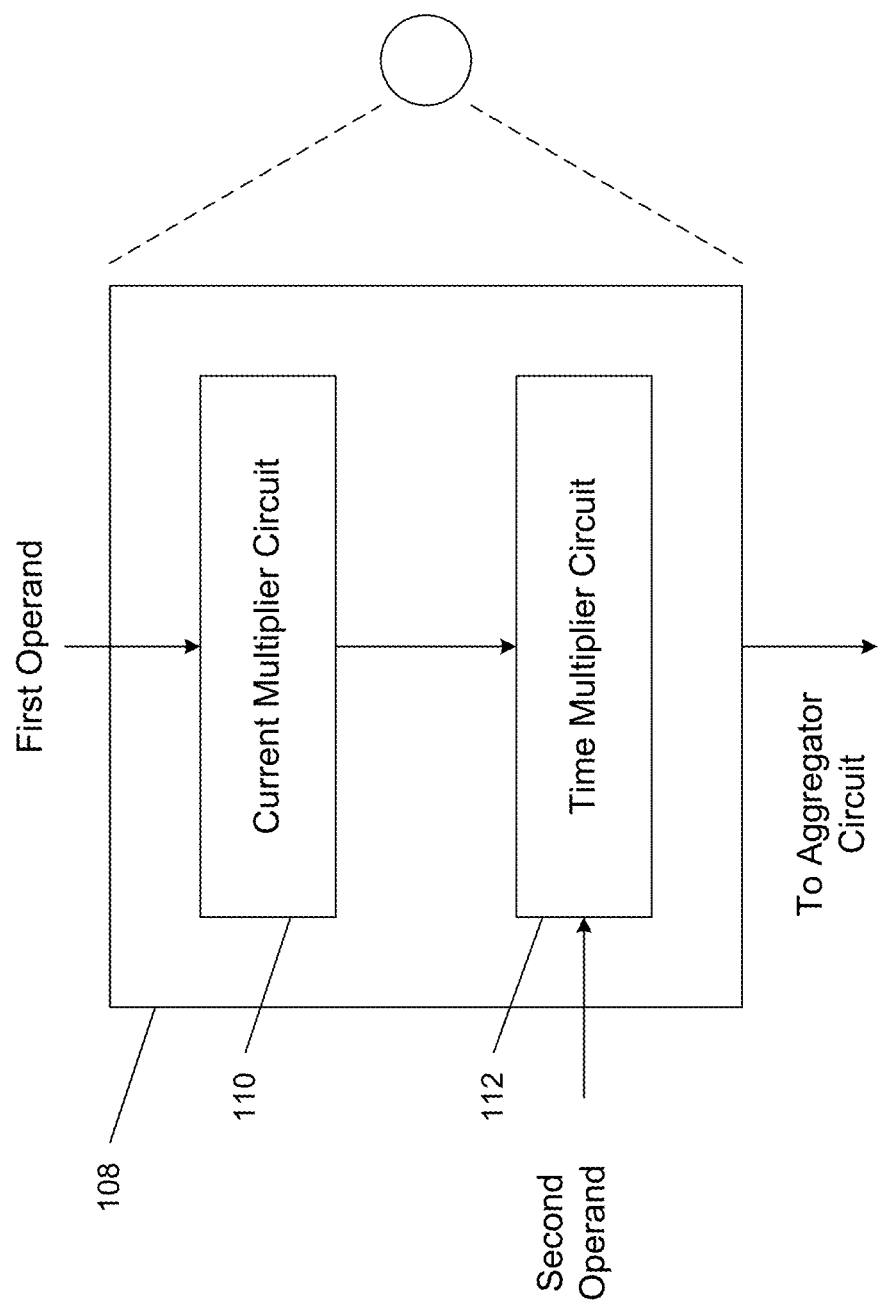
FIG. 1B illustrates an exemplary implementation of a computation circuit of the multiply-accumulate circuit of FIG. 1A according to aspects of the present disclosure.
Figure 1C:
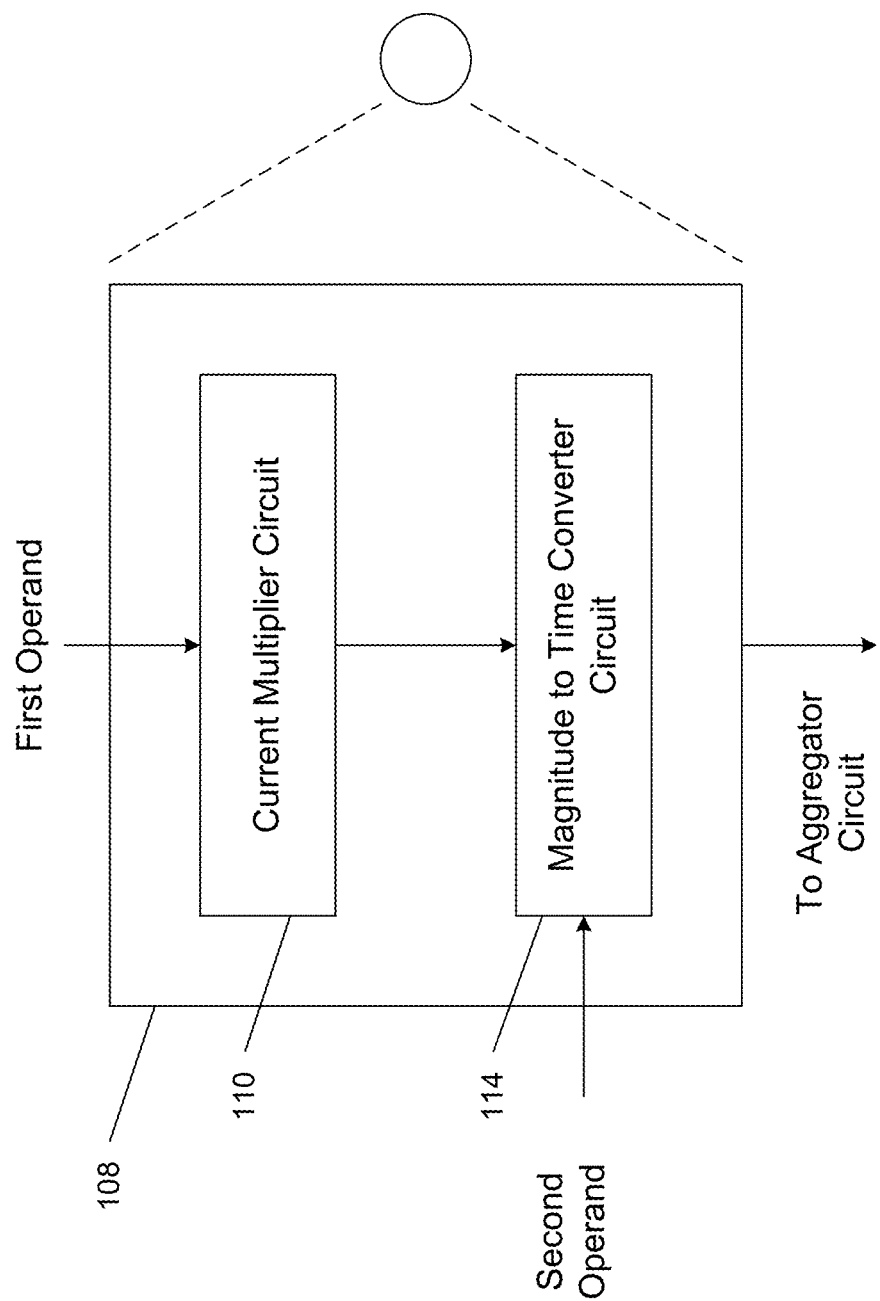
FIG. 1C illustrates another exemplary implementation of a computation circuit of the multiply-accumulate circuit of FIG. 1A according to aspects of the present disclosure.

FIG. 1B illustrates an exemplary implementation of a computation circuit of the multiply-accumulate circuit of FIG. 1A according to aspects of the present disclosure. As shown in FIG. 1B, a computation circuit 108 may be configured to perform the function of a multiplication by receiving a first operand and a second operand, and produce a product pair of the first operand and the second operand. The computation circuit 108 may include a current multiplier circuit 110 and a time multiplier circuit 112. The current multiplier circuit 110 may be configured to convert the first operand of the computation circuit 108 as a current that equals to a product of the first operand and a reference unit current. The time multiplier circuit 112 may be configured to convert the second operand of the computation circuit 108 as a duration that equals to a product of the second operand and a reference unit time period. In the exemplary implementation of FIG. 1C, a computation circuit 108 may be configured to perform the function of a multiplication by receiving a first operand and a second operand, and produce a product pair of the first operand and the second operand. The computation circuit 108 may include a current multiplier circuit 110 and a magnitude to time converter circuit 114. Electrical charges may be generated based on the current and the duration. The result of the computation circuit may be represented in terms of the electrical charges, which can be stored in an aggregator circuit.

Figure 2A:
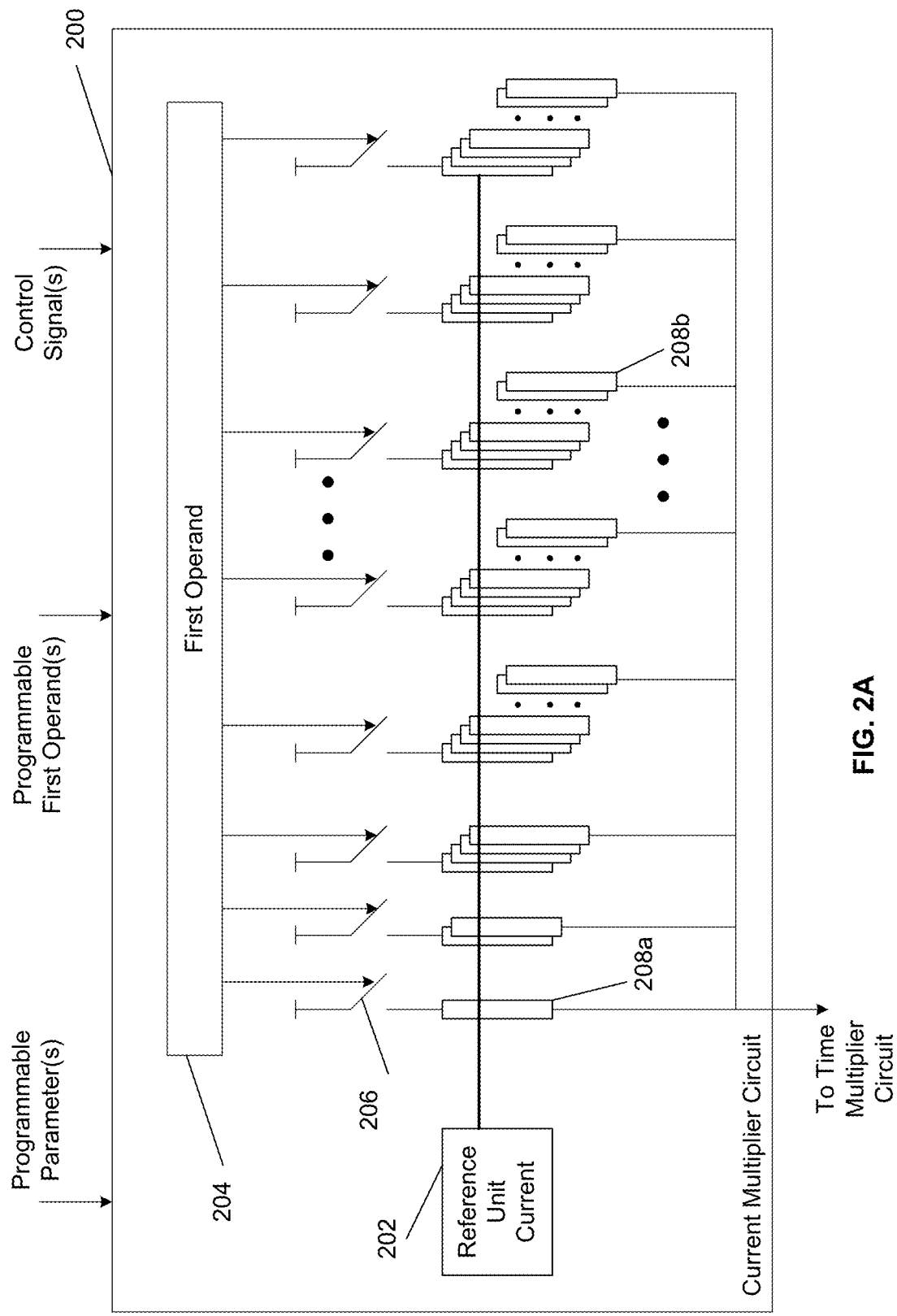
FIG. 2A illustrates an exemplary implementation of a current multiplier circuit of a computation circuit according to aspects of the present disclosure.

FIG. 2A illustrates an exemplary implementation of a current multiplier circuit of a computation circuit according to aspects of the present disclosure. In the exemplary implementation of FIG. 2A, a current multiplier circuit 200 may receive programmable parameter(s) and control signals, such as parameters and control signals used to determine a reference unit current 202. The current multiplier circuit 200 may further receive one or more programmable first operand(s), such as operand 204. In some implementations, the current multiplier circuit 200 includes a plurality of current mirrors connected in parallel, where each current mirror, such as current mirror 208a or 208b, in the plurality of current mirrors is configured to produce an output current according to a magnitude of current represented by a corresponding bit of the first operand. According to aspects of the present disclosure, a drive strength of the each current mirror may be controlled by adjusting a ratio of channel width to channel length of a transistor pair that forms the current mirror. Each bit of the first operand 204 may be used to control a switch, such as switch 206, which in turn controls a current mirror having a current drive strength corresponding the bit of the first operand.

Figures 2B, 2C, 2D:
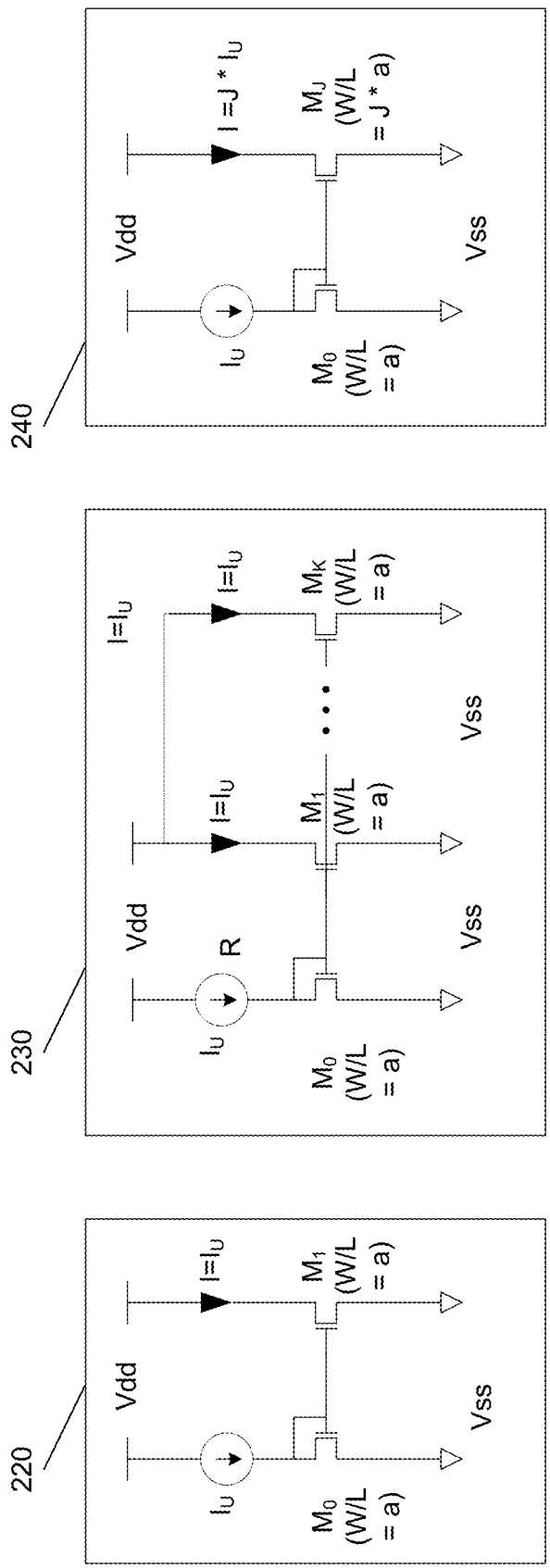
FIG. 2B illustrates an exemplary implementation of a current mirror of the current multiplier circuit of FIG. 2A according to aspects of the present disclosure.
FIG. 2C illustrates an exemplary implementation of another current mirror of the current multiplier circuit of FIG. 2A according to aspects of the present disclosure.
FIG. 2D illustrates an exemplary implementation of yet another current mirror of the current multiplier circuit of FIG. 2A according to aspects of the present disclosure.

FIG. 2B illustrates an exemplary implementation of a current mirror of the current multiplier circuit of FIG. 2A according to aspects of the present disclosure. In the example shown in FIG. 2B, the current mirror 220 includes a first transistor $M_0$, a second transistor $M_1$, and a resistor R, which are electrically coupled to each other as shown in FIG. 2B. Among other things, by choosing a same W/L ratio (in this case W/L=a) for the first transistor $M_0$ and the second transistor $M_1$, a current $I_U$ is being replicated by the current mirror. This 1 to 1 current mirror may be employed to implement one of the plurality of current mirrors shown in FIG. 2A.

FIG. 2C illustrates an exemplary implementation of another current mirror of the current multiplier circuit of FIG. 2A according to aspects of the present disclosure. As shown in FIG. 2C, the current mirror 230 includes a first transistor $M_0$, a group of parallel transistors $M_1$ through $M_K$, and a resistor R, which are electrically coupled to each other as shown in FIG. 2C. In particular, the gate terminal of the first transistor $M_0$ is electrically coupled to the gate terminals of the transistors $M_1$ through $M_K$. Among other things, by choosing a same W/L ratio (in this case W/L=a) for the first transistor $M_0$ and for the transistors $M_1$ through $M_K$, a current $I_U$ is being replicated K times by the current mirror, where K is a positive number. This 1 to K current mirror may be employed to implement one of the plurality of current mirrors shown in FIG. 2A.

FIG. 2D illustrates an exemplary implementation of yet another current mirror of the current multiplier circuit of FIG. 2A according to aspects of the present disclosure. As shown in the exemplary implementation of FIG. 2D, the current mirror 240 includes a first transistor $M_0$, a second transistor $M_J$, and a resistor R, which are electrically coupled to each other as shown in FIG. 2D. Among other things, by choosing different W/L ratios, (in this case W/L=a) for the first transistor $M_0$ and (W/L=J*a) for the second transistor $M_J$, a current $I_U$ is being replicated J times by the current mirror, where J is a positive number. This 1 to J current mirror may be employed to implement one of the plurality of current mirrors shown in FIG. 2A.

Figure 3A:
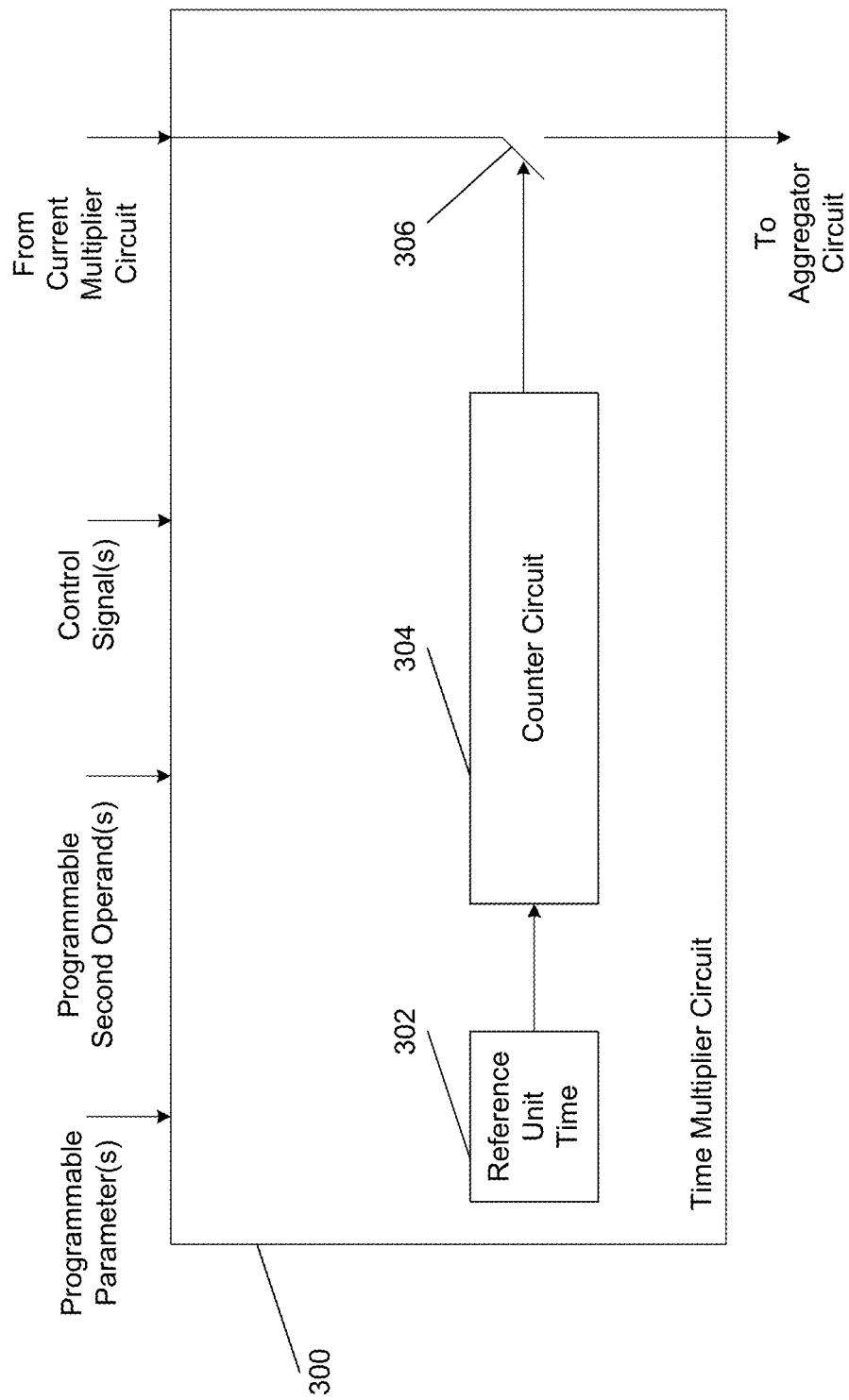
FIG. 3A illustrates an exemplary implementation of a time multiplier circuit of a computation circuit according to aspects of the present disclosure.

FIG. 3A illustrates an exemplary implementation of a time multiplier circuit of a computation circuit according to aspects of the present disclosure. In the example of FIG. 3A, a time multiplier circuit 300 may receive an input from a current multiplier circuit, such as current multiplier circuit 200, and produce an output to an aggregator circuit, such as the aggregator circuit 106. The time multiplier circuit 300 may receive programmable parameter(s) and control signal(s), such as parameters and control signals used to determine a reference unit time 302. The time multiplier circuit 300 may further receive one or more programmable second operand(s) used by a counter circuit 304 to control a switch 306. The counter circuit 304 may be configured to count the reference unit time period to a value of the second operand to produce the duration.

Figure 3B:
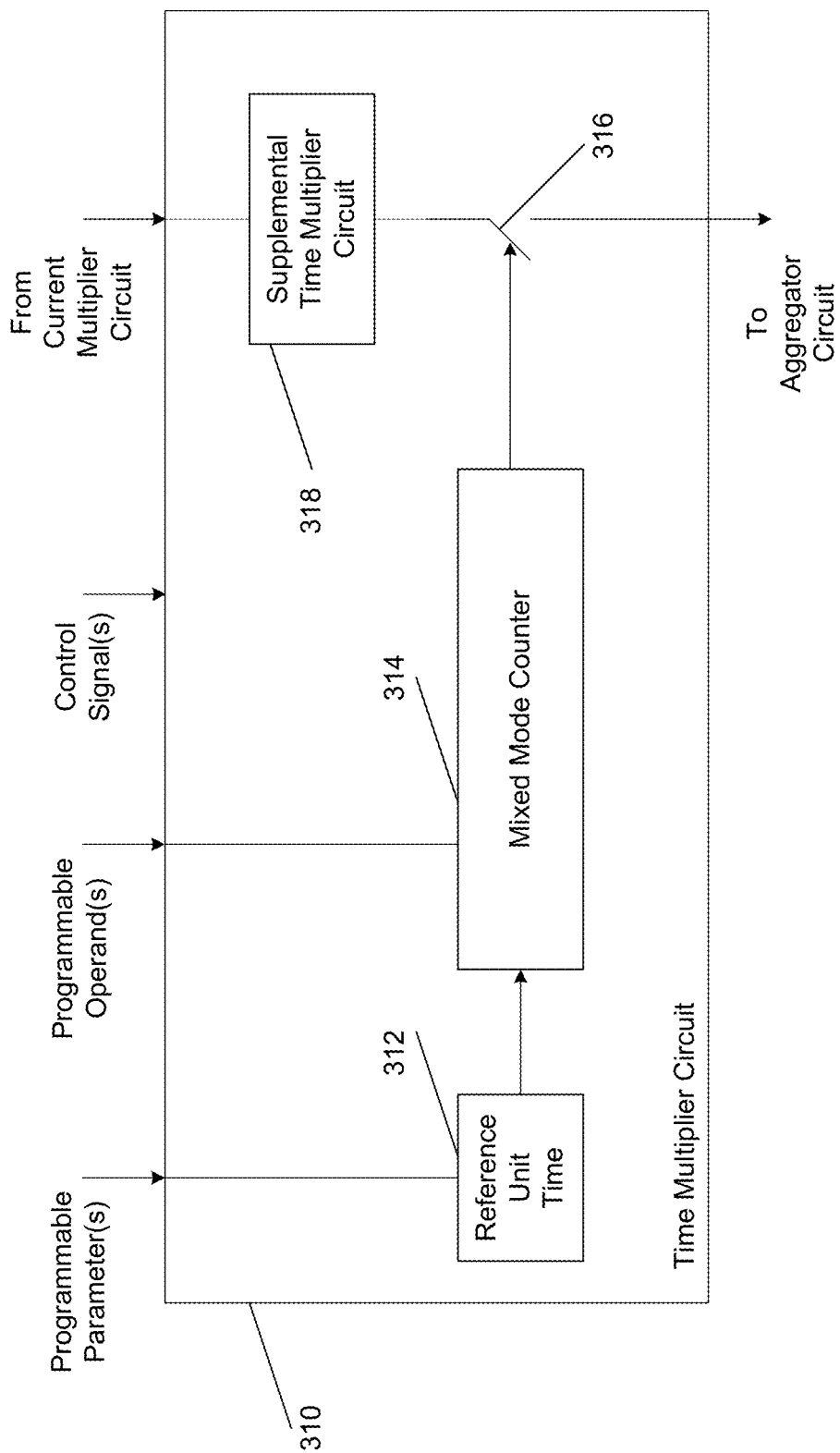
FIG. 3B illustrates an exemplary implementation of another time multiplier circuit of a computation circuit according to aspects of the present disclosure.

FIG. 3B illustrates an exemplary implementation of another time multiplier circuit of a computation circuit according to aspects of the present disclosure. As shown in FIG. 3B, a time multiplier circuit 310 may receive an input from a current multiplier circuit, such as current multiplier circuit 200, and produce an output to an aggregator circuit, such as the aggregator circuit 106. The time multiplier circuit 310 may receive programmable parameter(s) and control signal(s), such as parameters and control signals used to determine a reference unit time 312. The time multiplier circuit 310 may further receive one or more programmable second operand(s) used by a mixed mode counter circuit 314 to control a switch 316. In some implementations, the time multiplier circuit 310 may further include a supplemental time multiplier circuit 318, configured to produce a multiplied reference current based on the reference unit current and a magnitude of current represented by a bit of the second operand, where the multiplied reference current is a product of the reference unit current and the magnitude of current represented by the bit of the second operand. The mixed mode counter circuit 314 may be configured to count the multiplied reference current according to the reference unit time period.

Figure 3C:
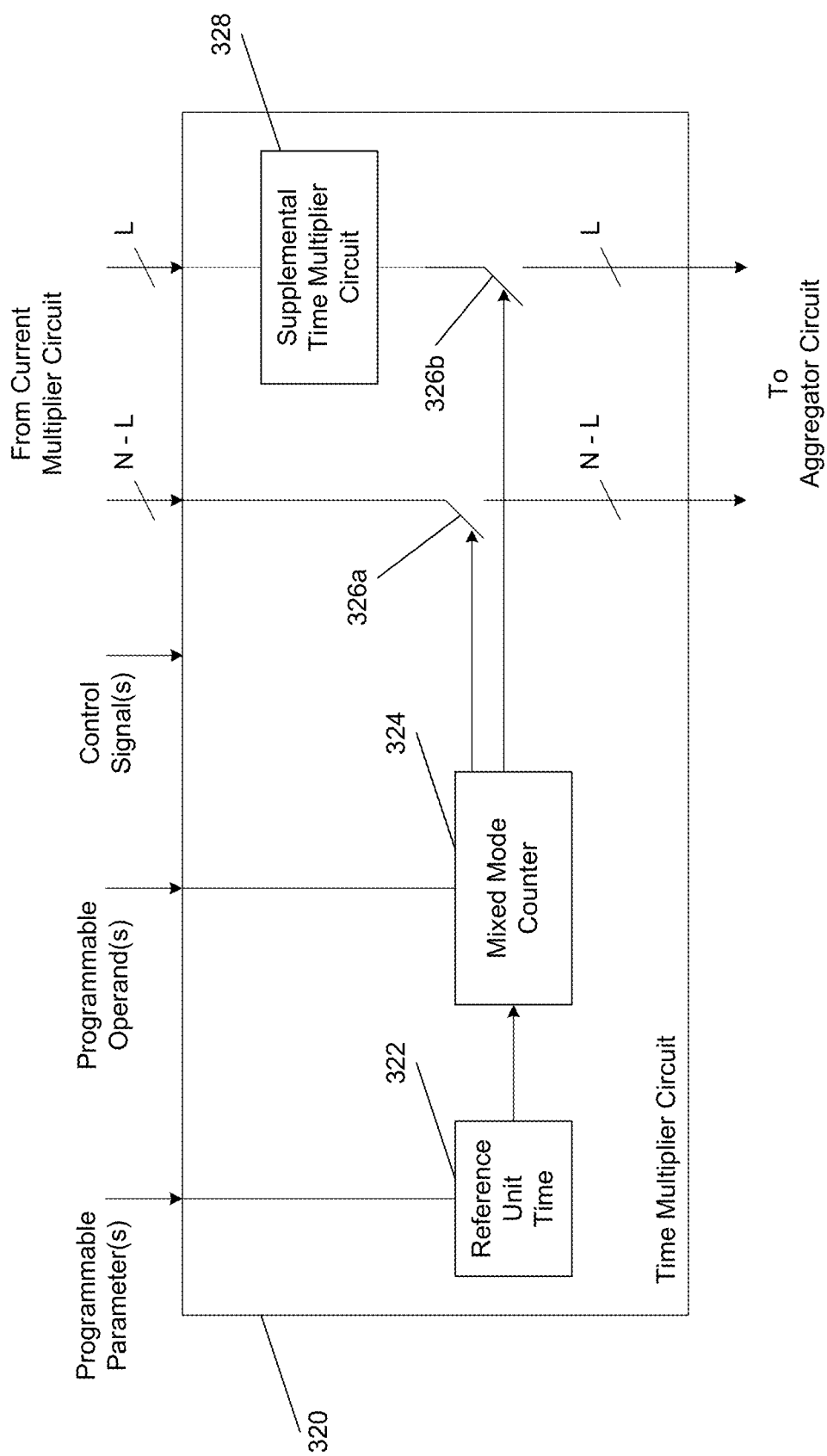
FIG. 3C illustrates an exemplary implementation of yet another time multiplier circuit of a computation circuit according to aspects of the present disclosure.

FIG. 3C illustrates an exemplary implementation of yet another time multiplier circuit of a computation circuit according to aspects of the present disclosure. In the exemplary implementation of FIG. 3C, a time multiplier circuit 320 may receive an input from a current multiplier circuit, such as current multiplier circuit 200, and produce an output to an aggregator circuit, such as the aggregator circuit 106. The time multiplier circuit 320 may receive programmable parameter(s) and control signal(s), such as parameters and control signals used to determine a reference unit time 322. The time multiplier circuit 320 may further receive one or more programmable second operand(s) used by a mixed mode counter circuit 324 to control switches 326a and 326b.

In some implementations, the input from the current multiplier circuit may be split into one or more subgroups, for example inputs correspond to a first subgroup of bits (e.g., N−L bits) of the first operand may be counted by the mixed mode counter 324 in the manner as described in FIG. 3A, while inputs correspond to a second subgroup of bits (e.g., L bits) of the first operand may be counted by the mixed mode counter 324 in the manner as described in FIG. 3B. In some implementations, the time multiplier circuit 320 may further include a supplemental time multiplier circuit 328, configured to produce a multiplied reference current based on the reference unit current and a magnitude of current represented by a bit of the second operand, where the multiplied reference current is a product of the reference unit current and the magnitude of current represented by the bit of the second operand. The mixed mode counter circuit 324 may be configured to count the multiplied reference current according to the reference unit time period.

FIG. 3D illustrates an exemplary implementation of generating a reference time unit according to aspects of the present disclosure. In the example of FIG. 3D, a reference time unit may be generated by a ring oscillator with a series of inverters, for example $I_1, I_2 \ldots I_K$, as shown in FIG. 3D. Note that the number of inverters is an odd number.

FIG. 3E illustrates another exemplary implementation of generating a reference time unit according to aspects of the present disclosure. As shown in FIG. 3E, a reference time unit generator may include transistor $M_1$, variable resistor $R_1$, capacitor $C_1$, and inverters $I_1$ and $I_2$ forming a feedback path. The transistor $M_1$, variable resistor $R_1$, capacitor $C_1$, and inverters $I_1$ and $I_2$ are electrically coupled to one another as shown in FIG. 3E.

FIG. 3F illustrates an exemplary implementation of a counter circuit of FIG. 3A according to aspects of the present disclosure. In the exemplary implementation of FIG. 3F, the counter circuit includes a plurality of toggle flip-flops, for example $FF_0$, $FF_1$, and $FF_L$, connected in series. The plurality of toggle flip-flops receives the reference time unit as a clock. An output of a toggle flip-flop in the plurality of flip-flops corresponds to a bit of the second operand. A reset circuit, that includes an AND gate, is configured to reset the counter circuit using outputs of the plurality of toggle flip-flops upon counting the reference time unit to the value of the second operand.

FIG. 3G illustrates yet an exemplary implementation of a supplemental time multiplier circuit according to aspects of the present disclosure. In the example of FIG. 3G, the supplemental time multiplier circuit includes a cascade of two current mirrors. A first current mirror is formed with transistor $M_1$ and $M_2$. By using transistor $M_2$ having a W/L ratio N times larger than transistor $M_1$, a mirrored current of $I_{U2}$ is generated that is N times larger than the input current $I_{U1}$ at transistor $M_1$. A second current mirror is formed with transistor $M_3$ and $M_4$. By using transistor $M_3$ having a W/L ratio being the same as transistor $M_4$, a mirrored output current of $I_{U2}$ is generated by transistors $M_4$ and $M_5$ that is the same as the current $I_{U2}$ by transistor $M_3$. In this manner, the supplemental time multiplier circuit can enable a counter circuit to count a larger current unit than a reference current unit, and thus enables the counter to count faster.

Figure 3H:
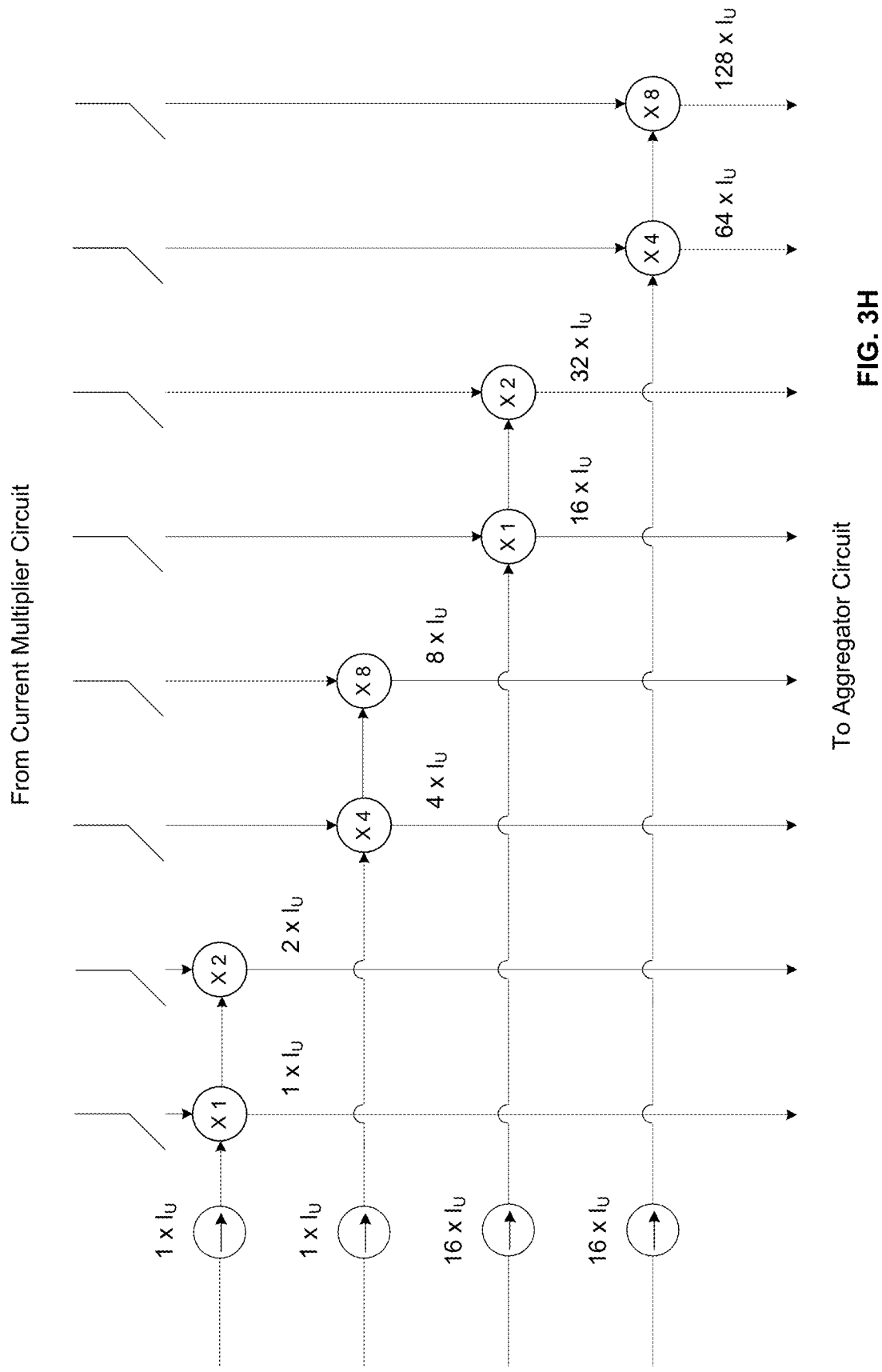
FIG. 3H illustrates an exemplary implementation of a supplemental time multiplier circuit according to aspects of the present disclosure.

FIG. 3H illustrates an exemplary implementation of a supplemental time multiplier circuit according to aspects of the present disclosure. In the example shown in FIG. 3H, a supplemental time multiplier circuit 330 may receive an input from a current multiplier circuit, such as current multiplier circuit 200, and produce an output to an aggregator circuit, such as the aggregator circuit 106. The supplemental time multiplier circuit 330 may receive programmable parameter(s) and control signal(s), such as parameters and control signals used to determine various magnitudes of reference unit current 332a through 332d. The supplemental time multiplier circuit 330 may further receive one or more programmable second operand(s) used to control switches $S_0$ through $S_7$. Note that in other implementations, other magnitudes of reference unit currents may be used; and different operand widths may be implemented than the 8 bit operand shown in FIG. 3H.

In this example, the supplemental time multiplier circuit 330 may be configured to produce output currents of magnitudes of 1, 2, 4, 8, 16, 32, 64, and 128 times of the reference unit current $I_U$, where each output current may be controlled by a corresponding bit of the second operand via the switches $S_0$ through $S_7$. The magnitude of 1 unit reference current may be produced by multiplying the reference unit current by 1; the magnitude of 2 units reference current may be produced by multiplying the reference unit current by 2; the magnitude of 4 units reference current may be produced by multiplying the reference unit current by 4; the magnitude of 8 units reference current may be produced by multiplying the reference unit current by 8; the magnitude of 16 units reference current may be produced by multiplying a 16 units reference current by 1; the magnitude of 32 units reference current may be produced by multiplying the 16 units reference current by 2; the magnitude of 64 units reference current may be produced by multiplying the 16 units reference current by 4; the magnitude of 128 units reference current may be produced by multiplying the 16 units reference current by 8. Different magnitudes of reference currents and different multipliers may be employed to achieve the output currents or to achieve different output currents.

FIG. 4A illustrates an exemplary implementation of an aggregator circuit according to aspects of the present disclosure. As shown in FIG. 4A, an aggregator circuit 400 may include charging circuit 402, discharging circuit 404 and charge accumulating circuit 406. According to aspects of the present disclosure, for charges produced by each computation circuit in the plurality of computation circuits, the charging circuit 402 is configured to add charges to the charge accumulating circuit 406 in response to a product of a first operand and a second operand of the computation circuit being positive. On the other hand, the discharging circuit 404 is configured to remove charges from the charge accumulating circuit 406 in response to a product of a first operand and a second operand of the computation circuit being negative. In some implementations, the charge accumulating circuit 406 may be implemented with one or more capacitors.

FIG. 4B illustrates an exemplary implementation of a charging and discharging circuit according to aspects of the present disclosure. In the exemplary implementation of FIG. 4B, a first current mirror formed by transistors $M_1$ and $M_2$ is configured to receive an input from one or more computation circuit(s), represented by current I. A second current mirror formed by transistors $M_3$ and $M_4$ is configured to add or remove charges from capacitor C, based on states of a charging switch $S_1$ and a discharging switch $S_2$.

In some implementations, the charging switch $S_1$ is coupled to the capacitor C. The charging switch $S_1$ is controlled based on a sign bit of a first operand and a sign bit of a second operand, and where charging of the capacitor is performed, with the charging switch $S_1$ closed, in response to the sign bit of the first operand and the sign bit of the second operand being the same. Similarly, the discharging switch $S_2$ is coupled to the capacitor, and the discharging switch $S_2$ is also controlled based on a sign bit of a first operand and a sign bit of a second operand, where discharging of the capacitor is performed, with the discharging switch $S_2$ closed, in response to the sign bit of the first operand and the sign bit of the second operand being different. In one embodiment, a control signal to the charging switch $S_1$ and the discharging switch $S_2$ is generated using an XOR gate with a sign bit from the first operand and a sign bit from the second operand of a computation circuit.

According to aspects of the present disclosure, the disclosed multiply-accumulate circuit has a number of benefits. For example, using the method of aggregating charges, through a reference unit current and a reference unit time, to represent a sum of multiple product pairs in analog circuits can be magnitudes faster than the conventional methods of computing sum of multiple product pairs using combinatorial logic, general/specialized processors, and/or software. In addition, the disclosed multiply-accumulate circuit can be implemented in less area and consumes less power during operation because of the reduction or elimination in computational logic and intermediate storage registers in the computation process.

Figure 5A:
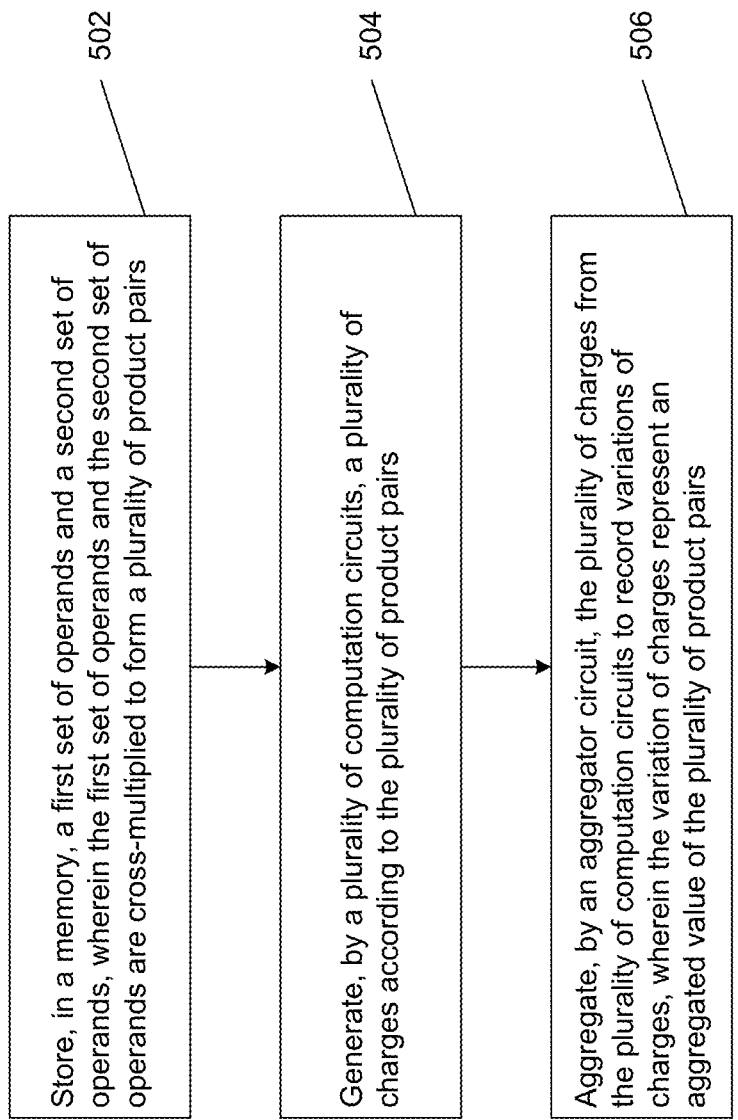
FIG. 5A illustrates an exemplary method of performing multiply-accumulate according to aspects of the present disclosure.

FIG. 5A illustrates an exemplary method of performing multiply-accumulate according to aspects of the present disclosure. In the example of FIG. 5A, in block 502, the method stores, in a memory, a first set of operands and a second set of operands, where the first set of operands and the second set of operands are cross-multiplied to form a plurality of product pairs. In block 504, the method generates, by a plurality of computation circuits, a plurality of charges according to the plurality of product pairs. In block 506, the method aggregates, by an aggregator circuit, the plurality of charges from the plurality of computation circuits to record variations of charges, where the variation of charges represent an aggregated value of the plurality of product pairs.

Figure 5B:
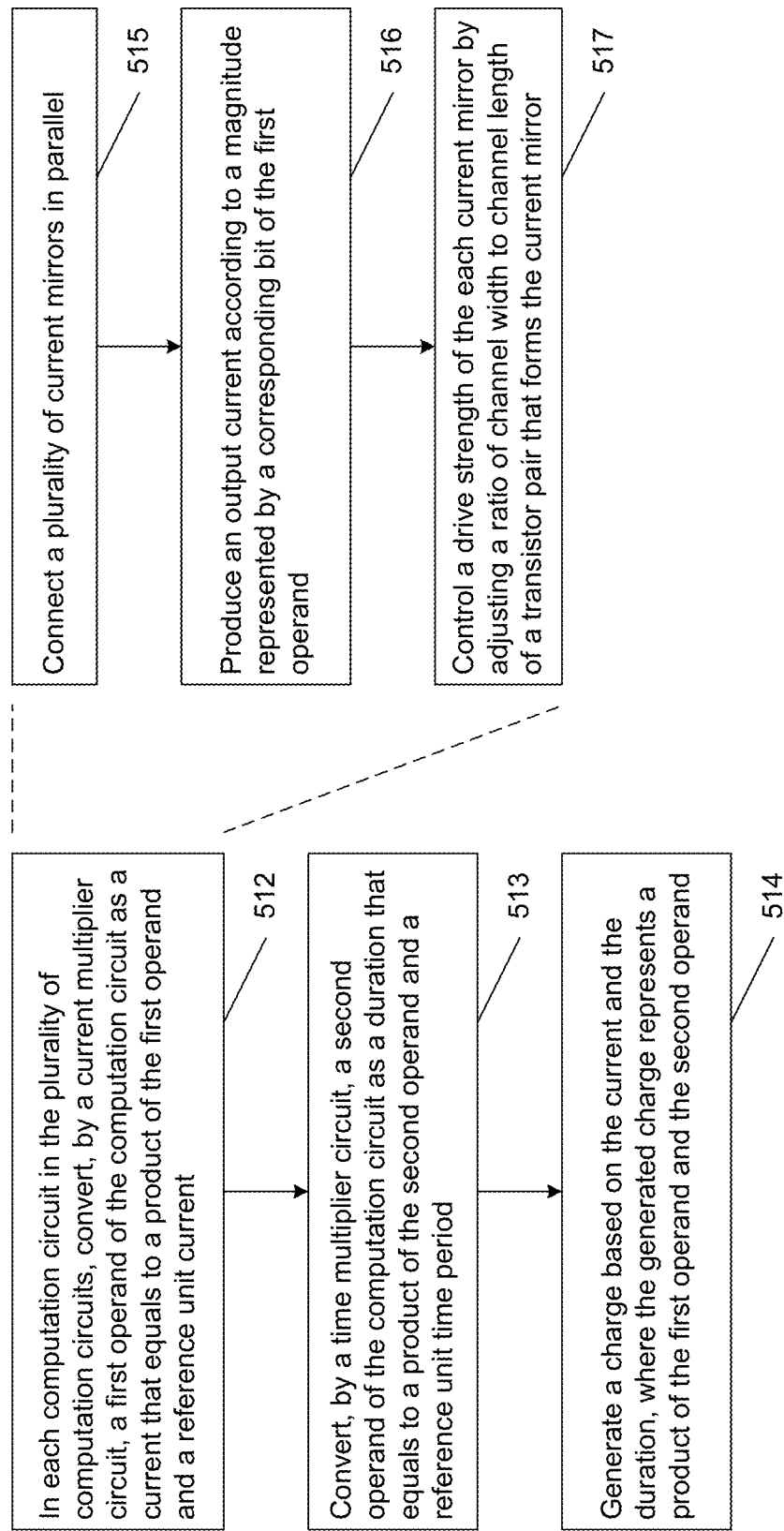
FIG. 5B illustrates an exemplary method of generating the plurality of charges according to aspects of the present disclosure.

FIG. 5B illustrates an exemplary method of generating the plurality of charges according to aspects of the present disclosure. As shown in FIG. 5B, in block 512, in each computation circuit in the plurality of computation circuits, the method converts, by a current multiplier circuit, a first operand of the computation circuit as a current that equals to a product of the first operand and a reference unit current. In block 513, the method converts, by a time multiplier circuit, a second operand of the computation circuit as a duration that equals to a product of the second operand and a reference unit time period. In block 514, the method generates a charge based on the current and the duration, where the generated charge represents a product of the first operand and the second operand.

In some implementations, the method performed in block 512 may further include the method performed in block 515, block 516 and block 517. In block 515, the method connects a plurality of current mirrors in parallel. In block 516, in each current mirror in the plurality of current mirrors, the method produces an output current according to a magnitude represented by a corresponding bit of the first operand. In block 517, the method controls a drive strength of the each current mirror by adjusting a ratio of channel width to channel length of a transistor pair that forms the current mirror.

Figures 5C, 5D:
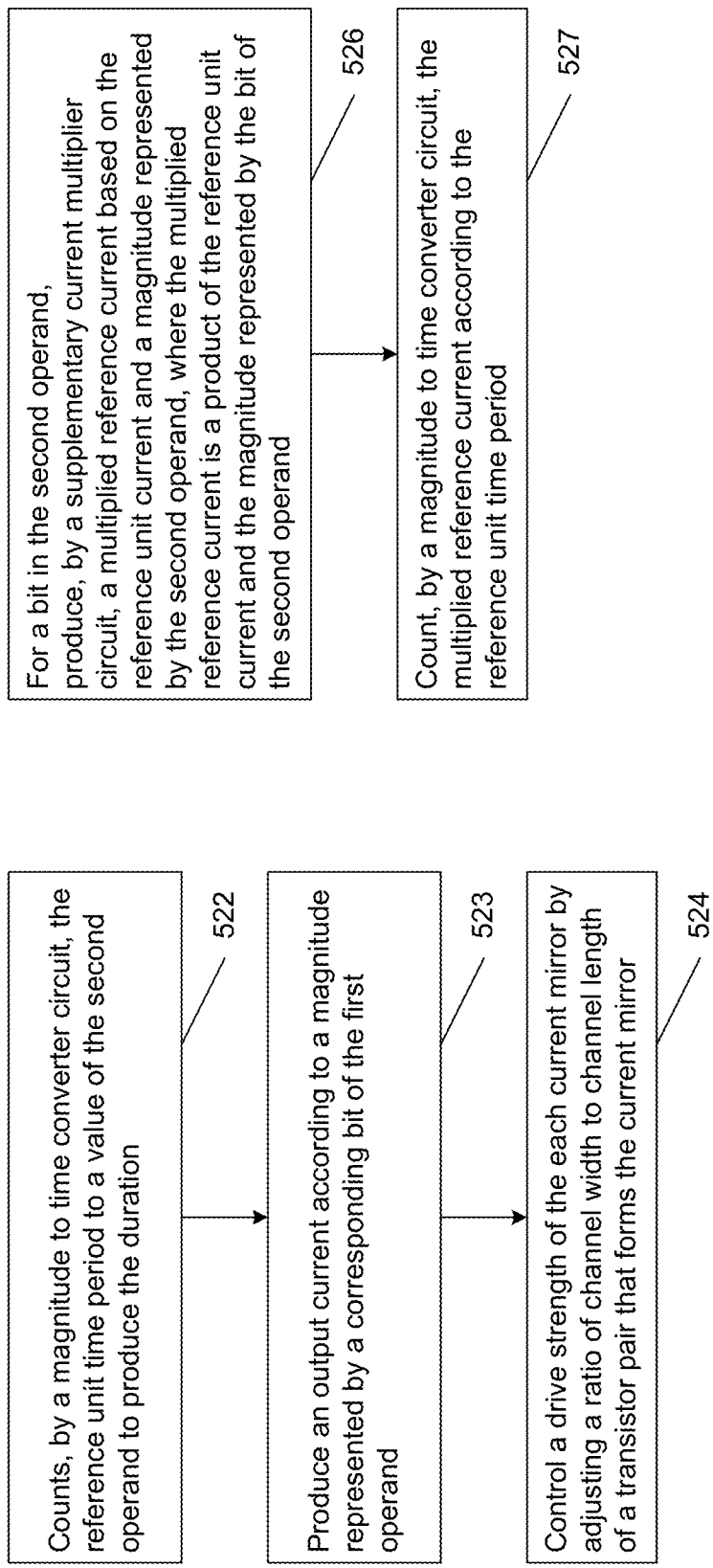
FIG. 5C illustrates an exemplary method of converting a magnitude of an operand to time according to aspects of the present disclosure.
FIG. 5D illustrates an exemplary method of converting a magnitude of an operand to current according to aspects of the present disclosure.

FIG. 5C illustrates an exemplary method of converting a magnitude of an operand to time according to aspects of the present disclosure. In this example, in block 522, the method counts, by a magnitude to time converter circuit, the reference unit time period to a value of the second operand to produce the duration. In some implementations, the method performed in block 522 may further include the method performed in block 523 and block 524. In block 523, the method connects, a plurality of toggle flip-flops in series, where an output of a toggle flip-flop in the plurality of flip-flops corresponds to a bit of the second operand. In block 524, the method resets, by a reset circuit, the counter circuit using outputs of the plurality of toggle flip-flops upon reaching the value of the second operand.

FIG. 5D illustrates an exemplary method of converting a magnitude of an operand to current according to aspects of the present disclosure. In the example of FIG. 15D, in block 526, for a bit in the second operand, the method produces, by a supplementary current multiplier circuit, a multiplied reference current based on the reference unit current and a magnitude represented by the second operand, where the multiplied reference current is a product of the reference unit current and the magnitude represented by the bit of the second operand. In block 527, the method counts, by a magnitude to time converter circuit, the multiplied reference current according to the reference unit time period.

Figure 5E:
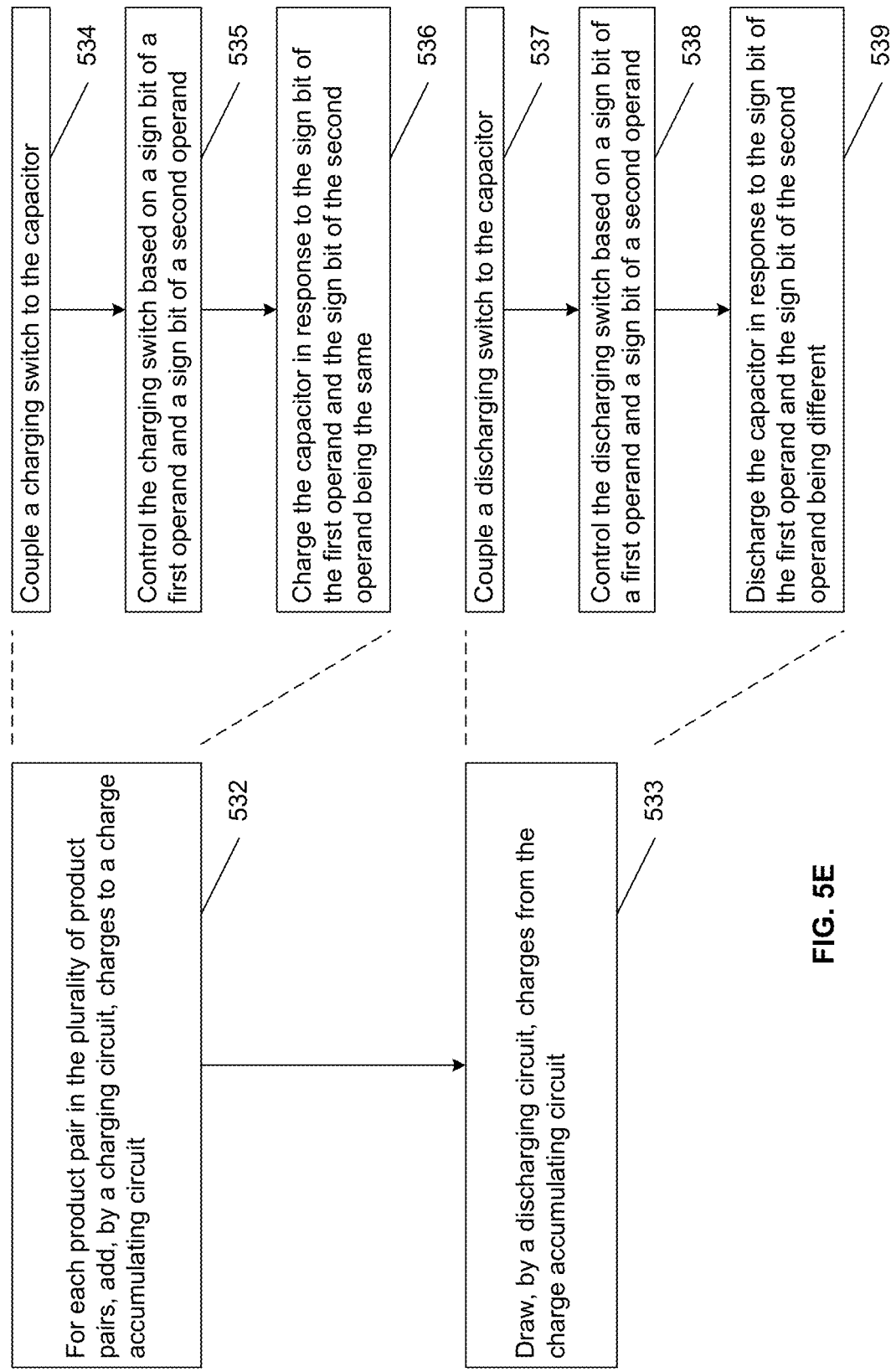
FIG. 5E illustrates an exemplary method of aggregating the plurality of charges from the plurality of computation circuits according to aspects of the present disclosure.

FIG. 5E illustrates an exemplary method of aggregating the plurality of charges from the plurality of computation circuits according to aspects of the present disclosure. As shown in FIG. 5E, in block 532, for each product pair in the plurality of product pairs, the method adds, by a charging circuit, charges to a charge accumulating circuit. In block 533, the method draws, by a discharging circuit, charges from the charge accumulating circuit.

In some implementations, the method performed in block 532 may further include the method performed in block 534, block 535 and block 536. In block 534, the method couples a charging switch to the capacitor. In block 535, the method controlling the charging switch based on a sign bit of a first operand and a sign bit of a second operand. In block 536, the method charges the capacitor in response to the sign bit of the first operand and the sign bit of the second operand being the same.

In some implementations, the method performed in block 533 may further include the method performed in block 537, block 538 and block 539. In block 537, the method couples a discharging switch to the capacitor. In block 538, the method controls the discharging switch based on a sign bit of a first operand and a sign bit of a second operand. In block 539, the method discharges the capacitor in response to the sign bit of the first operand and the sign bit of the second operand being different.

Figure 6A:
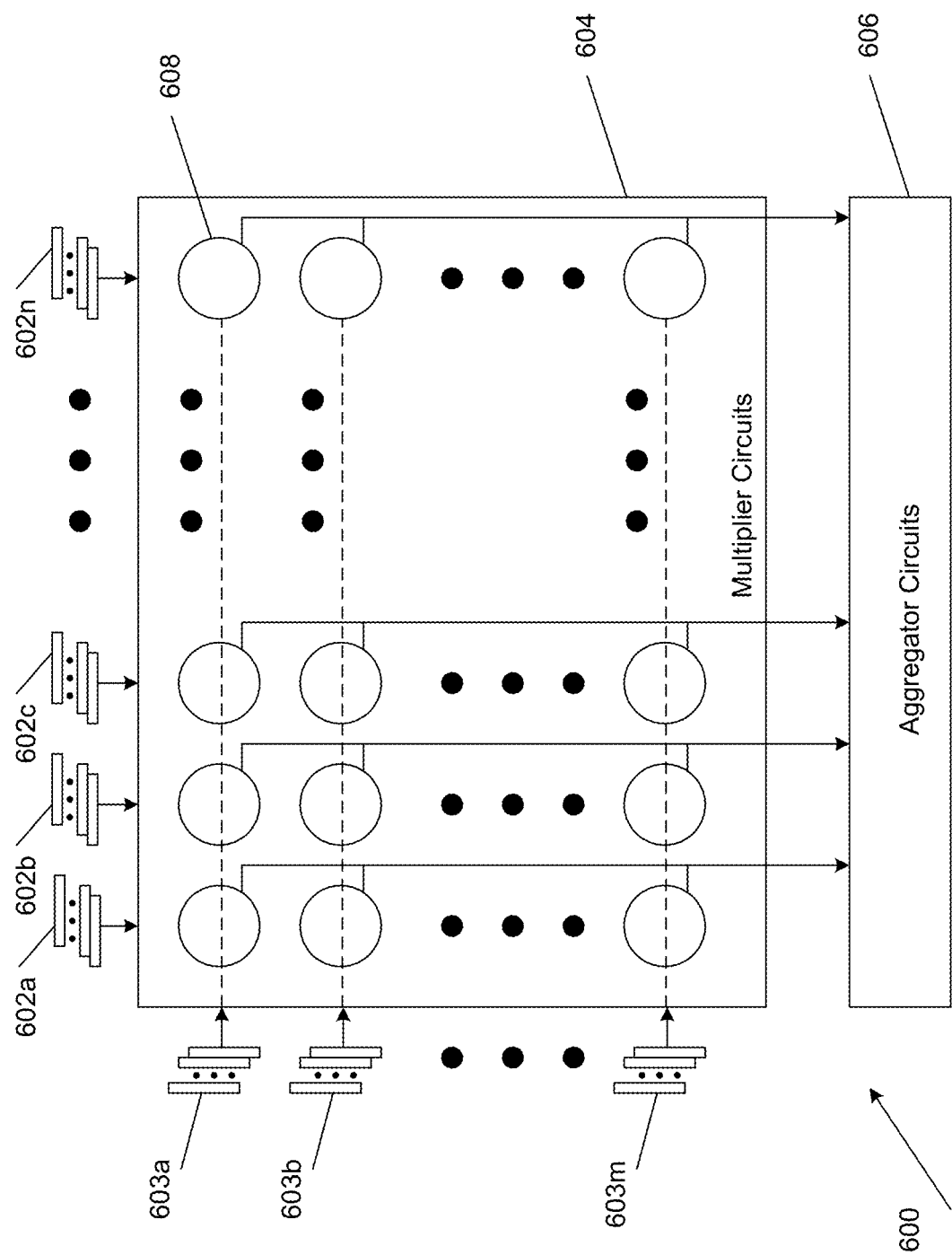
FIG. 6A illustrates an exemplary implementation of a scalable matrix computation circuit according to aspects of the present disclosure.

FIG. 6A illustrates an exemplary implementation of a scalable matrix computation circuit according to aspects of the present disclosure. As shown in FIG. 6A, a scalable matrix computation circuit 600 may include a plurality of first operand memory (labelled as 602a through 602n), a plurality of second operand memory (labelled as 603a through 603m), a plurality of multiplier circuits 604, and a plurality of aggregator circuits 606. A controller (not shown) may be configured to program the plurality of first operand memory and the plurality of second operand memory. The first set of operands and the second set of operands are cross-multiplied to form a plurality of product pairs. The plurality of multiplier circuits 604 may be configured to generate a plurality of charges according to the plurality of product pairs. The plurality of aggregator circuits 606 are configured to aggregate the plurality of charges from the plurality of multiplier circuits to record variations of charges, where the variation of charges represent an aggregated value of the plurality of product pairs. The plurality of multiplier circuits 604 may be arranged in a plurality of rows and a plurality of columns, where each row receives a corresponding operand from the first set of operands, and each column receives a corresponding operand from the second set of operands, where the each corresponding operand from the each row is used multiple times by the multiplier circuits in that row. This configuration is advantageous as it enables the controller to reuse the first operand in applications where the first operand changes less frequently than the second operand. The reuse of an operand saves time in loading the operand and saves memory in storing the operand.

In some implementations, the plurality of multiplier circuits 604 may include multiple individual multiplier circuits, for example an individual multiplier circuit is represented by a circle 608. The plurality of multiplier circuits 604 may be arranged in rows and columns, such as the M rows and N columns. The number of rows and number of columns may be selected based on the requirements of a specific application. In one embodiment, an array of 64 rows and 8 columns may be used for certain applications. In another embodiment, an array of 32 rows and 16 columns may be used for certain other applications. According to aspects of the present disclosure, the M rows and N columns may be further partitioned to compute a smaller set of multiplications and accumulations, or to compute multiple smaller sets of multiplications and accumulations in parallel. The plurality of aggregator circuits may include an aggregator circuit to aggregate variations of charges from each column, shown as an arrow from each column of multiplier circuits that points to the plurality aggregator circuits 606.

Figure 6B:
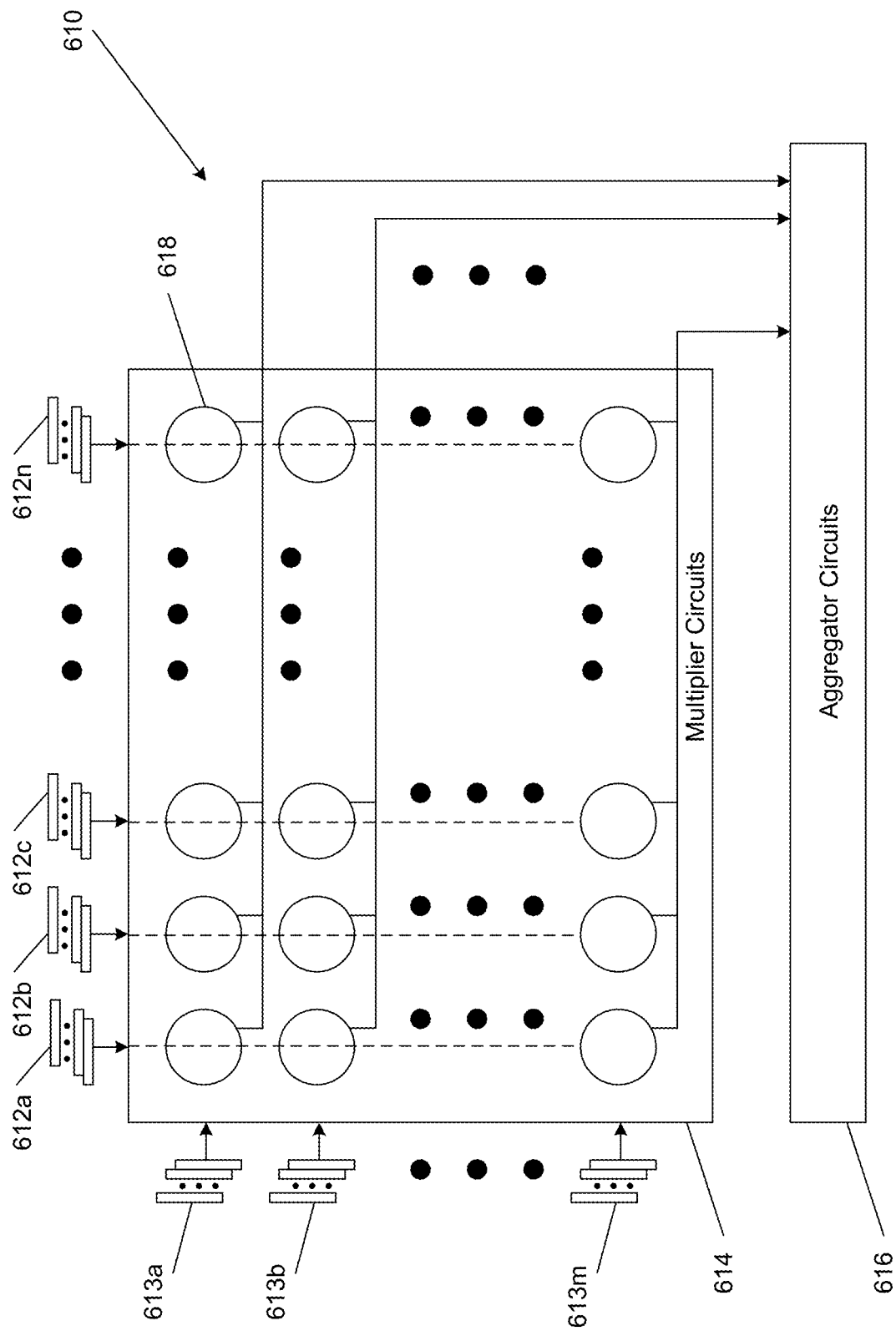
FIG. 6B illustrates another exemplary implementation of a scalable matrix computation circuit according to aspects of the present disclosure.

FIG. 6B illustrates another exemplary implementation of a scalable matrix computation circuit according to aspects of the present disclosure. Similar to the exemplary implementation of FIG. 6A, a scalable matrix computation circuit 610 may include a plurality of first operand memory (labelled as 612a through 612n), a plurality of second operand memory (labelled as 613a through 613m), a plurality of multiplier circuits 614, and a plurality of aggregator circuits 616. A controller (not shown) may be configured to program the plurality of first operand memory and the plurality of second operand memory. The first set of operands and the second set of operands are cross-multiplied to form a plurality of product pairs. The plurality of multiplier circuits 614 may be configured to generate a plurality of charges according to the plurality of product pairs. The plurality of aggregator circuits 616 are configured to aggregate the plurality of charges from the plurality of multiplier circuits to record variations of charges, where the variation of charges represent an aggregated value of the plurality of product pairs. The plurality of multiplier circuits 614 may be arranged in a plurality of rows and a plurality of columns, where each row receives a corresponding operand from the first set of operands, and each column receives a corresponding operand from the second set of operands. In the example of FIG. 6B, the each corresponding operand from the each column is used multiple times by the multiplier circuits in that column. This configuration is advantageous as it enables the controller to reuse the second operand in applications where the second operand changes less frequently than the first operand. The reuse of an operand saves time in loading the operand and saves memory in storing the operand.

In some implementations, the plurality of multiplier circuits 614 may include multiple individual multiplier circuits, for example an individual multiplier circuit is represented by a circle 618. The plurality of multiplier circuits 104 may be arranged in rows and columns, such as the M rows and N columns. The number of rows and number of columns may be selected based on the requirements of a specific application. The plurality of aggregator circuits may include an aggregator circuit to aggregate variations of charges from each row, shown as an arrow from each row of multiplier circuits that points to the plurality aggregator circuits 616.

Figure 6C:
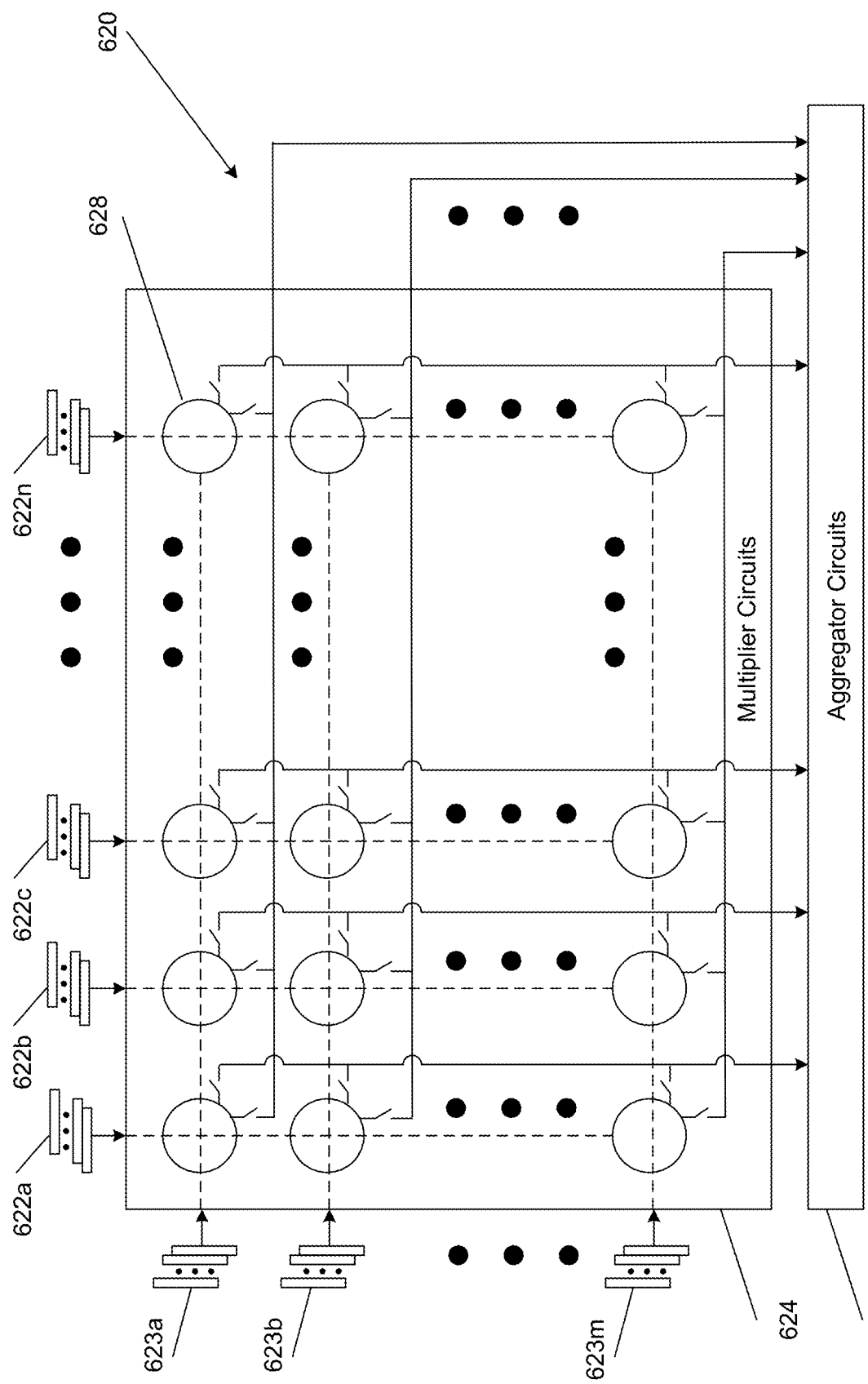
FIG. 6C illustrates yet another exemplary implementation of a scalable matrix computation circuit according to aspects of the present disclosure.

FIG. 6C illustrates yet another exemplary implementation of a scalable matrix computation circuit according to aspects of the present disclosure. Similar to the examples shown in FIG. 6A and FIG. 6B, a scalable matrix computation circuit 620 may include a plurality of first operand memory (labelled as 622*a* through 622*n*), a plurality of second operand memory (labelled as 623*a* through 623*m*), a plurality of multiplier circuits 624, and a plurality of aggregator circuits 626. A controller (not shown) may be configured to program the plurality of first operand memory and the plurality of second operand memory. The first set of operands and the second set of operands are cross-multiplied to form a plurality of product pairs. The plurality of multiplier circuits 624 may be configured to generate a plurality of charges according to the plurality of product pairs. The plurality of aggregator circuits 626 are configured to aggregate the plurality of charges from the plurality of multiplier circuits to record variations of charges, where the variation of charges represent an aggregated value of the plurality of product pairs. The plurality of multiplier circuits 624 may be arranged in a plurality of rows and a plurality of columns, where each row receives a corresponding operand from the first set of operands, and each column receives a corresponding operand from the second set of operands.

In the example of FIG. 6C, the each corresponding operand from the each row may be used multiple times by the multiplier circuits in that row; and the each corresponding operand from the each column may be used multiple times by the multiplier circuits in that column. This configuration is advantageous as it enables the controller to reuse either the first operand or the second operand in different situations where at certain times the first operand changes less frequently than the second operand, and at certain other times the second operand changes less frequently than the first operand. The reuse of an operand saves time in loading the operand and saves memory in storing the operand.

In some implementations, the plurality of multiplier circuits 624 may include multiple individual multiplier circuits, for example an individual multiplier circuit is represented as a circle 628. The controller may be configured to control the connection switches of an individual multiplier circuit to the corresponding aggregator circuit of a row or a column, based on the corresponding bit of an operand. This control allows the individual multiplier circuit to add charges to or subtract charges from the corresponding aggregator circuit of a row or a column. The plurality of multiplier circuits 624 may be arranged in rows and columns, such as the M rows and N columns. The number of rows and number of columns may be selected based on the requirements of a specific application. The plurality of aggregator circuits may include an aggregator circuit to aggregate variations of charges from each row or from each column, shown as an arrow from each row of multiplier circuits or from each column of multiplier circuits that points to the plurality aggregator circuits 626.

Figure 6D:
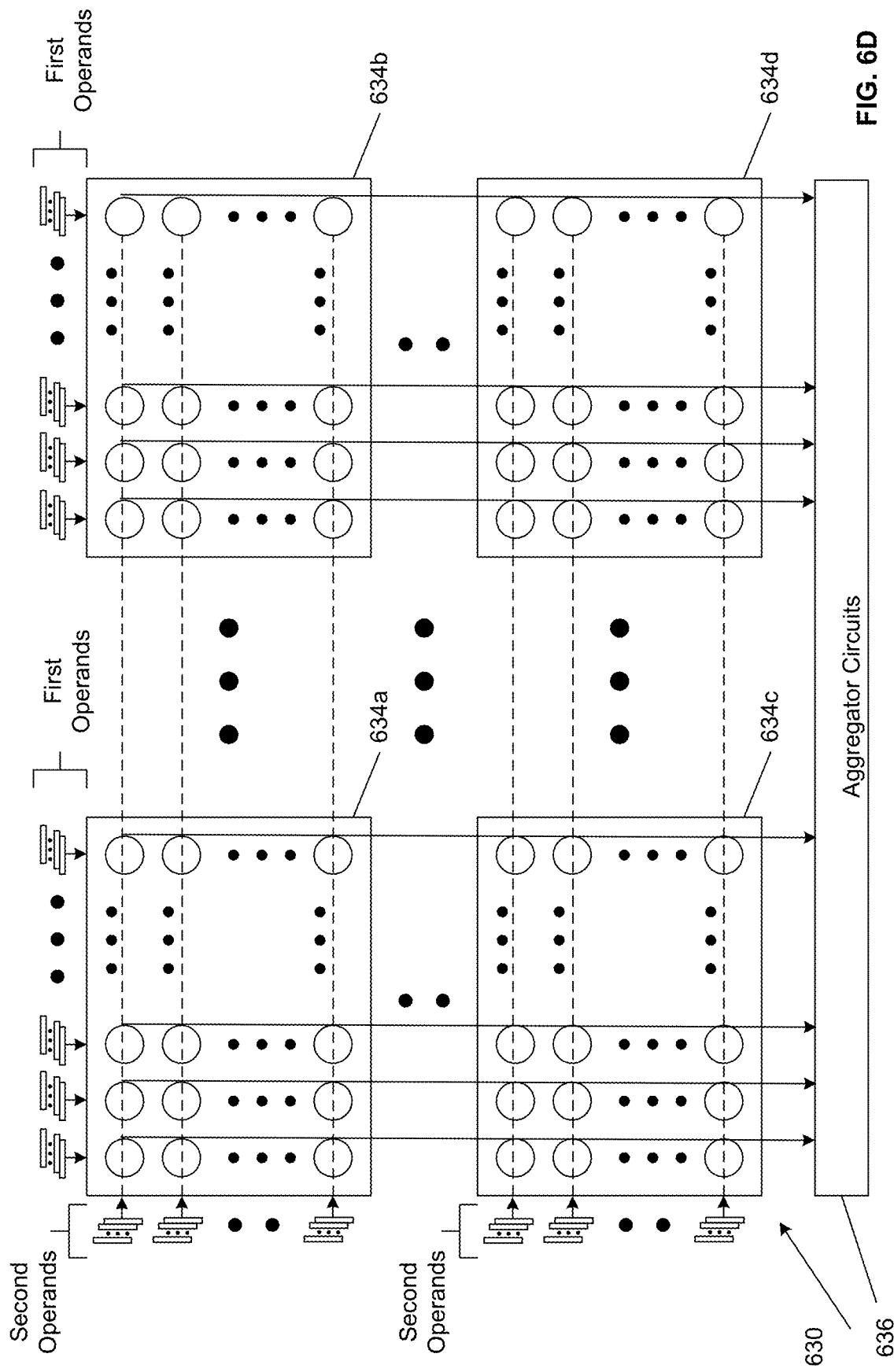
FIG. 6D illustrates yet another exemplary implementation of a scalable matrix computation circuit according to aspects of the present disclosure.

FIG. 6D illustrates yet another exemplary implementation of a scalable matrix computation circuit according to aspects of the present disclosure. In the example of FIG. 6D, the scalable matrix computation circuit may be partitioned to compute multiple set of multiplications and accumulations in parallel, labelled as 634*a*, 634*b*, 634*c*, and 634*d*. The plurality of aggregator circuits may be configured to aggregate variations of charges from each column, shown as an arrow from each column or row of multiplier circuits that points to the plurality aggregator circuits 636. Each set of the multiplications and accumulations, such as 634*a*, 634*b*, 634*c*, or 634*d*, may be configured to implement the functions of the scalable matrix computation circuit as described in FIG. 6A, FIG. 6B, or FIG. 6C.

Figure 7A:
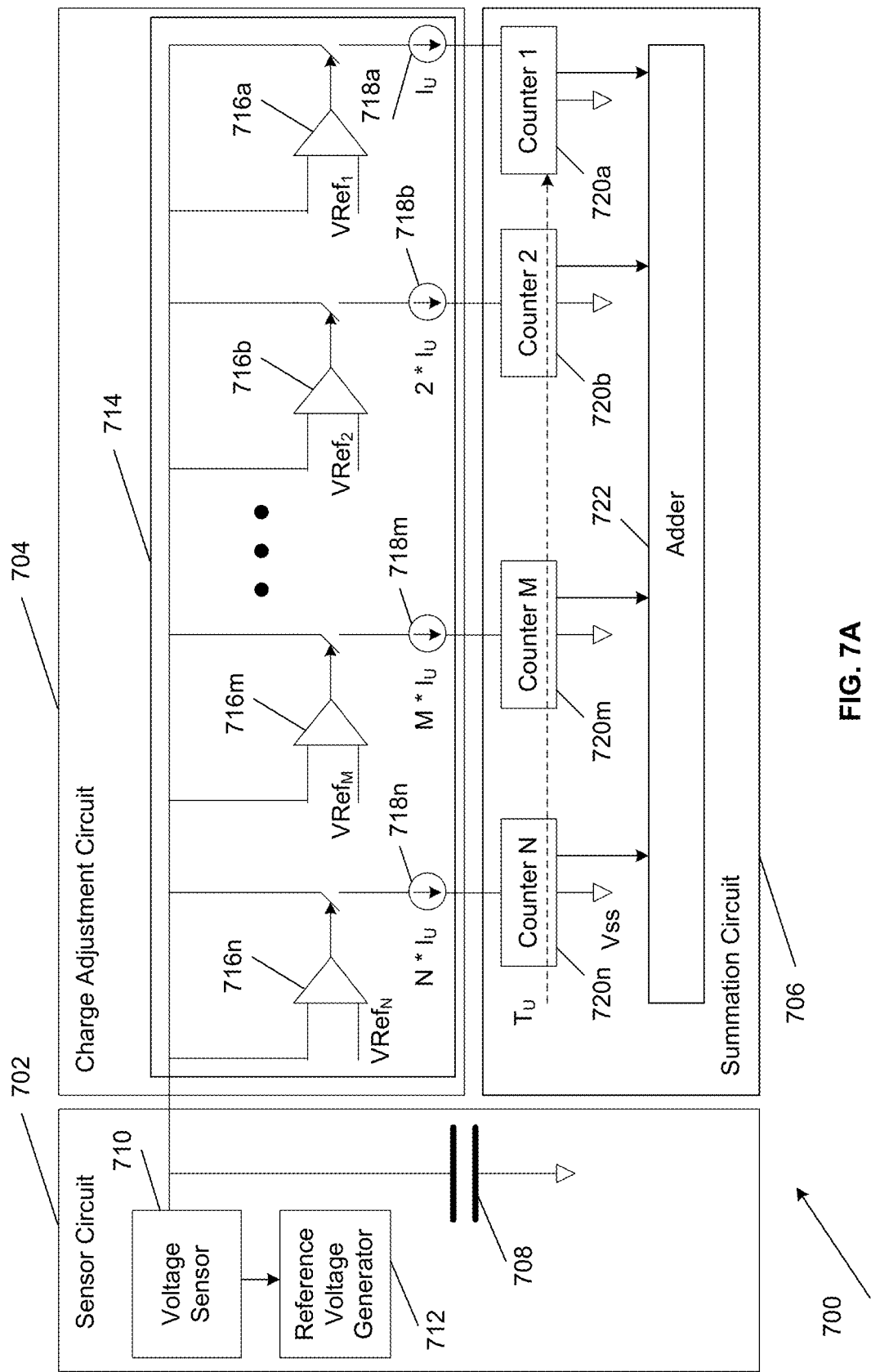
FIG. 7A illustrates an exemplary implementation of an analog to digital converter according to aspects of the present disclosure.

FIG. 7A illustrates an exemplary implementation of an analog to digital converter according to aspects of the present disclosure. As shown in FIG. 7A, an analog to digital converter 700 includes a sensor circuit 702, a charge adjustment circuit 704, and a summation circuit 706. The sensor circuit 702 is configured to determine a variation in voltage across a capacitor 708. The charge adjustment circuit 704 is configured to adjust charges in the capacitor based on the variation in voltage across the capacitor and based on a reference charge unit. The summation circuit 706 is configured to represent a digital value of the charges adjusted in response to the variation in voltage across the capacitor. The reference charge unit includes a product of a reference current unit and a reference time unit.

Figure 9B:
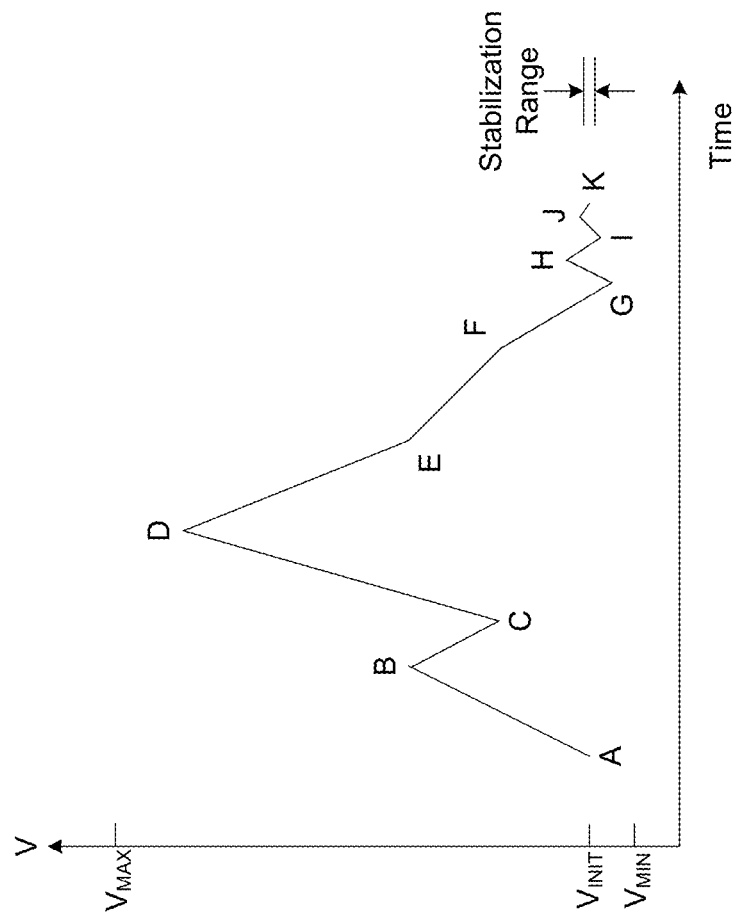
FIG. 9B illustrates an exemplary representation of variations in voltage across a capacitor of a sensor circuit according to aspects of the present disclosure.
Figure 9A:
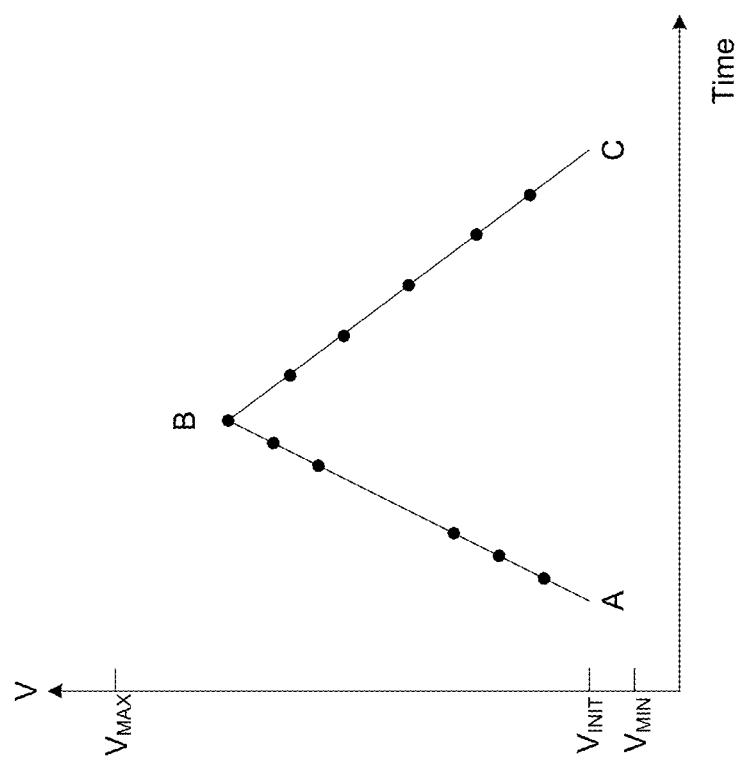
FIG. 9A illustrates an exemplary representation of variations in voltage across a capacitor of a sensor circuit according to aspects of the present disclosure.

The sensor circuit 702 includes a voltage sensor 710 configured to determine the variation in voltage across the capacitor with respect to an initial voltage of the capacitor 708, where the variation in voltage across the capacitor 708 is within a range of a minimum voltage and a maximum voltage across the capacitor 708 as shown in FIG. 9A; and a reference voltage generator 712 configured to produce a set of intermediate reference voltages configured to indicate levels in the variations of the charges, as indicated by the dots alone Point A to Point and Point B to Point C of FIG. 9A, in the capacitor 708.

The charge adjustment circuit 704 includes a subtraction circuit 714 configured to draw charges from the capacitor 708. The subtraction circuit 714 includes a plurality of voltage comparators, labelled as 716*a* through 716*n*, where each voltage comparator in the plurality of voltage comparators is configured to compare the voltage across the capacitor 708 and a corresponding reference voltage in a first set of reference voltages, namely $VRef_1$ through $VRef_N$. The subtraction circuit 714 further includes a set of current sources, labelled as 718a through 718n, configured to draw charges from the capacitor, where each current source is controlled based on the comparison between the voltage across the capacitor 708 and the corresponding reference voltage in the first set of intermediate reference voltages.

The summation circuit includes a plurality of counters, labelled as 720a through 720n, corresponding to the plurality of voltage comparators, where the plurality of counters are configured to count a number of reference time units, where one reference time unit is represented by $T_U$ in FIG. 7A, the corresponding current source in the set of current sources has drawn charges from the capacitor or has added charges to the capacitor. The summation circuit further includes an adder 722 configured to sum values of the plurality of counters that represent a digital value of the charges adjusted in response to the variation in voltage across the capacitor 708.

Figure 7B:
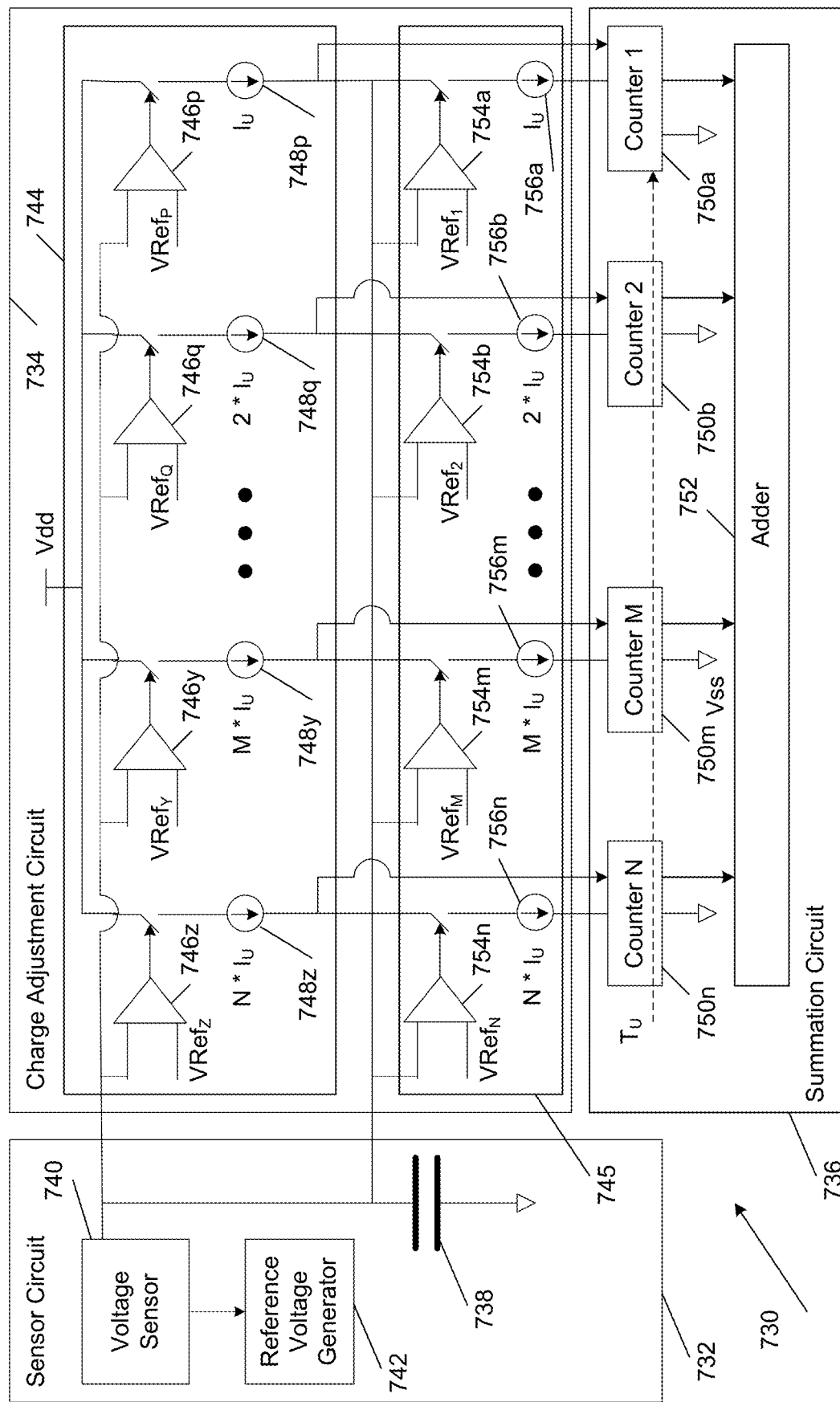
FIG. 7B illustrates another exemplary implementation of an analog to digital converter according to aspects of the present disclosure.

FIG. 7B illustrates another exemplary implementation of an analog to digital converter according to aspects of the present disclosure. In the exemplary implementation of FIG. 7B, an analog to digital converter 730 includes a sensor circuit 732, a charge adjustment circuit 734, and a summation circuit 736. The sensor circuit 732 is configured to determine a variation in voltage across a capacitor 738. The charge adjustment circuit 734 is configured to adjust charges in the capacitor based on the variation in voltage across the capacitor and based on a reference charge unit. The summation circuit 736 is configured to represent a digital value of the charges adjusted in response to the variation in voltage across the capacitor. The reference charge unit includes a product of a reference current unit and a reference time unit.

The sensor circuit 732 includes a voltage sensor 740 configured to determine the variation in voltage across the capacitor with respect to an initial voltage of the capacitor 738, where the variation in voltage across the capacitor 738 is within a range of a minimum voltage and a maximum voltage across the capacitor 738 as shown in FIG. 9A; and a reference voltage generator 742 configured to produce a set of intermediate reference voltages configured to indicate levels in the variations of the charges, as indicated by the dots alone Point A to Point and Point B to Point C of FIG. 9A, in the capacitor 738.

The charge adjustment circuit 734 includes a subtraction circuit 744 configured to draw charges from the capacitor 738. The subtraction circuit 734 includes a plurality of voltage comparators, labelled as 746p through 746z, where each voltage comparator in the plurality of voltage comparators is configured to compare the voltage across the capacitor 738 and a corresponding reference voltage in a first set of reference voltages, namely $VRef_P$ through $VRef_Z$. The subtraction circuit 744 further includes a set of current sources, labelled as 748p through 748z, configured to draw charges from the capacitor, where each current source is controlled based on the comparison between the voltage across the capacitor 738 and the corresponding reference voltage in the first set of reference voltages.

The charge adjustment circuit 734 further includes an addition circuit 745 configured to add charges to the capacitor 738. The addition circuit 745 includes a plurality of voltage comparators, labelled as 754a through 754n, where each voltage comparator in the plurality of voltage comparators is configured to compare the voltage across the capacitor 738 and a corresponding reference voltage in a second set of intermediate reference voltages, namely $VRef_1$ through $VRef_N$. The addition circuit 745 further includes a set of current sources, labelled as 756a through 756n, configured to add charges to the capacitor 738, where each current source is controlled based on the comparison between the voltage across the capacitor and the corresponding reference voltage in the second set of intermediate reference voltages.

The summation circuit 736 includes a plurality of counters, labelled as 750a through 750n, corresponding to the plurality of voltage comparators, where the plurality of counters are configured to count a number of reference time units, where one reference time unit is represented by $T_U$ in FIG. 7B, the corresponding current source in the set of current sources has drawn charges from the capacitor or has added charges to the capacitor. The summation circuit further includes an adder 752 configured to sum values of the plurality of counters that represent a digital value of the charges adjusted in response to the variation in voltage across the capacitor 738.

According to aspects of the present disclosure, besides the advantages of improved performance, using less area, and lower power consumption, the scalable matrix computation circuit enables either operand to be repeatedly used, which further improves the performance over conventional methods of computing a sum of product pairs. This improvement is gained by reducing the number of updating and/or loading of the operands. In addition, the aggregator circuit can be enabled to aggregate from either the columns or rows of the scalable matrix computation circuit, which further improves the repeated use of the operands. Furthermore, disclosed scalable matrix computation circuit can be configured to handle either positive or negative operands, which provides further performance improvement over the conventional approaches.

FIG. 8A illustrates an exemplary method of performing scalable matrix computation according to aspects of the present disclosure. In the example of FIG. 8A, in block 802, the method stores, in a plurality of first operand memory, a first set of input operands of the matrix computation circuit, where the first set of input operands are programmable by a controller. In block 804, the method stores, in a plurality of second operand memory, a second set of input operands of the matrix computation circuit, where the second set of input operands are programmable by the controller. In block 806, the method arranges a plurality of multiplier circuits arranged in a plurality of rows and plurality of columns, where each row receives a corresponding operand from the first set of operands, and each column receives a corresponding operand from the second set of operands, and the each corresponding operand from the each row is used multiple times by the multiplier circuits in that row. In block 808, the method controls the plurality of multiplier circuits, by the controller, to perform multiplications using the first set of operands and the second set of operands. In block 810, the method stores, by a plurality of aggregator circuits, charges produced by the plurality of multiplier circuits.

According to aspects of the present disclosure, the method further includes reusing, by the multiplier circuit, the each corresponding operand from the each column multiple times. The storing of the first and second sets of input operands of the matrix computation circuit includes storing a set of first operands corresponding to its position in a first matrix vector at each first operand memory in the plurality of first operand memory, and storing a set of second operands corresponding to its position in a second matrix vector at each second operand memory in the plurality of second operand memory. The storing of the charges produced by the plurality of multiplier circuits includes aggregating charges from the plurality of columns of the matrix computation circuit by a plurality of column aggregator circuits, and aggregating charges from the plurality of rows of the matrix computation circuit by a plurality of row aggregator circuits. The controlling of the plurality of multiplier circuits includes selectively activating each column aggregator circuit in the plurality of column aggregator circuits or each row aggregator circuit in the plurality of row aggregator circuits, respectively.

Figure 8B:
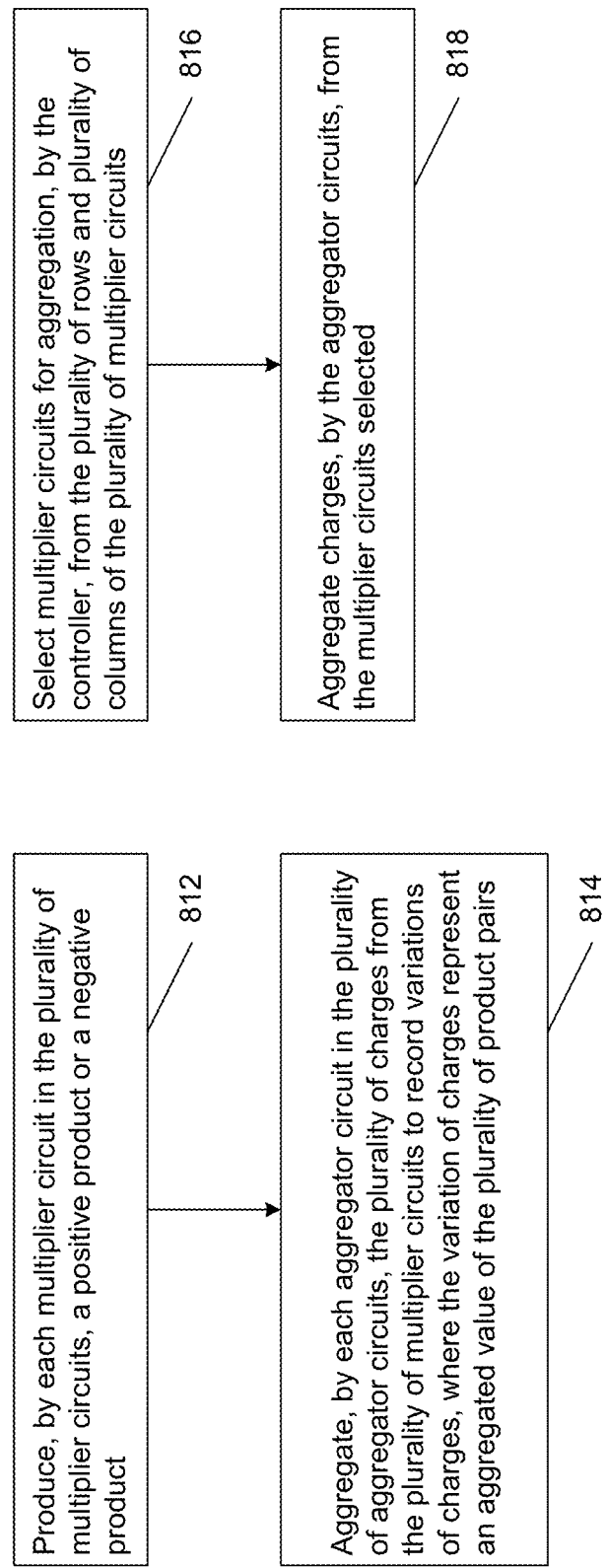
FIG. 8B illustrates another exemplary method of performing scalable matrix computation according to aspects of the present disclosure.

FIG. 8B illustrates another exemplary method of performing scalable matrix computation according to aspects of the present disclosure. As shown in FIG. 8B, in block 812, the method produces, by each multiplier circuit in the plurality of multiplier circuits, a positive product or a negative product. In block 814, the method aggregates, by each aggregator circuit in the plurality of aggregator circuits, the plurality of charges from the plurality of multiplier circuits to record variations of charges, where the variation of charges represent an aggregated value of the plurality of product pairs. In block 816, the method selects multiplier circuits for aggregation, by the controller, from the plurality of rows and plurality of columns of the plurality of multiplier circuits. In block 818, the method aggregates charges, by the aggregator circuits, from the multiplier circuits selected.

Figure 8C:
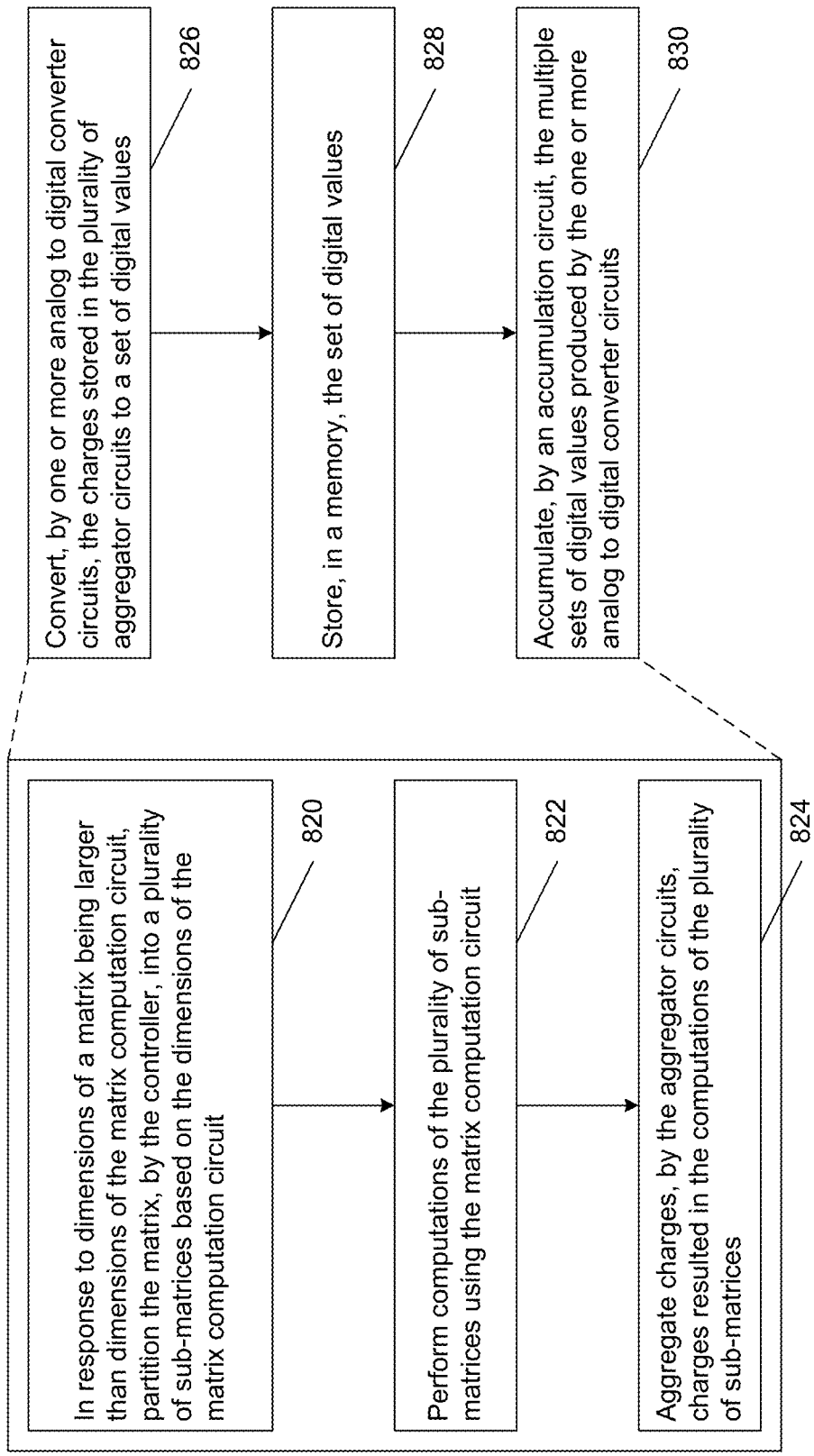
FIG. 8C illustrates yet another exemplary method of performing scalable matrix computation according to aspects of the present disclosure.

FIG. 8C illustrates yet another exemplary method of performing scalable matrix computation according to aspects of the present disclosure. In the exemplary implementation of FIG. 8C, in block 820, in response to dimensions of a matrix being larger than dimensions of the matrix computation circuit, the method partitions the matrix, by the controller, into a plurality of sub-matrices based on the dimensions of the matrix computation circuit. In block 822, the method performs computations of the plurality of sub-matrices using the matrix computation circuit. In block 824, the method aggregates charges, by the aggregator circuits, charges resulted in the computations of the plurality of sub-matrices.

In some implementations, the methods performed in blocks 820, 822, and 824 may optionally or additionally include the methods performed in blocks 826, 828, and 830. In block 826, the method converts, by one or more analog to digital converter circuits, the charges stored in the plurality of aggregator circuits to a set of digital values. In block 828, the method stores, in a memory, the set of digital values. In block 830, the method accumulates, by an accumulation circuit, the multiple sets of digital values produced by the one or more analog to digital converter circuits.

FIG. 9A illustrates an exemplary representation of variations in voltage across a capacitor of a sensor circuit according to aspects of the present disclosure. In the example shown in FIG. 9A, during computation, voltage across a capacitor of a sensor circuit, such as capacitor 708 of FIG. 7A or capacitor 738 of FIG. 7B, may vary. According to aspects of the present disclosure, the voltage may be controlled to stay with a range, such as $V_{MIN}$ and $V_{MAX}$, and an initial voltage $V_{INIT}$ may be measured. In this example, as charges are added to a capacitor, the voltage across the capacitor may increase from Point A to Point B, where the dots along line AB represent the various levels of the voltage across the capacitor. As charges are subtracted from the capacitor, the voltage across the capacitor may decrease from Point B to Point C, where the dots along line BC represent the various levels of the voltage across the capacitor.

FIG. 9B illustrates an exemplary representation of variations in voltage across a capacitor of a sensor circuit according to aspects of the present disclosure. Similar to FIG. 9A, during computation, voltage across a capacitor of a sensor circuit, such as capacitor 708 of FIG. 7A or capacitor 738 of FIG. 7B, may vary. According to aspects of the present disclosure, the voltage may be controlled to stay with a range, such as $V_{MIN}$ and $V_{MAX}$, and an initial voltage $V_{INIT}$ may be measured. For example, as charges are added to a capacitor, the voltage across the capacitor may increase from Point A to Point B and then from Point C to Point D. As charges are subtracted from the capacitor, the voltage across the capacitor may decrease from Point B to Point C and from Point D to Point G. As the rate of charges being added to or subtracted from the capacitor changes, the rate of change of the voltage across the capacitor may also change. The amount of charges being added or subtracted from the capacitor may be controlled by an addition circuit (such as 744 of FIG. 7B) or a subtraction circuit (such as 745 of FIG. 7B), where the current sources (such as $748p$ through $748z$, or $756a$ through $756n$ of FIG. 7B) are controlled to add charges or subtract charges from the capacitor.

According to aspects of the present disclosure, as the voltage across the capacitor approaches its initial value of $V_{INIT}$, it may take multiple trials to reach the level of $V_{INIT}$, represented by Points G, H, I, J, and K. In some implementations, depending on the desire precision, a stabilization range may be specified to allow a certain percentage of deviation from $V_{INIT}$, this percentage of deviation may be adjustable through a programmable parameter of the circuit to support an analog to digital converter of higher precision with a lower percentage of deviation from $V_{INIT}$, or to support a faster analog to digital converter with a higher percentage of deviation from $V_{INIT}$.

FIG. 10A illustrates an exemplary implementation of a voltage comparator circuit according to aspects of the present disclosure. In the exemplary implementation of FIG. 10A, the voltage comparator circuit includes a NMOS transistor $M_1$ and a PMOS transistor $M_2$. $V_{OUT}$ is configured to be pulled down when $V_{IN}$ is larger than the average of $V_{Trigger\ 2}+V_{Trigger\ 1}$; or $V_{OUT}$ is configured to be pulled up when $V_{IN}$ is smaller than the average of $V_{Trigger\ 2}+V_{Trigger\ 1}$. This voltage comparator circuit enables a fast comparison between $V_{IN}$ and VTrigger, which is the average of $V_{Trigger\ 2}+V_{Trigger\ 1}$.

FIG. 10B illustrates another exemplary implementation of a voltage comparator circuit according to aspects of the present disclosure. In the example shown in FIG. 10B, the voltage comparator circuit includes a NMOS transistor $M_3$, a PMOS transistor $M_4$, and a reference voltage stabilizer circuit 1002. The voltage stabilizer circuit 1002 is configured to stabilize a reference voltage to be used as an intermediate reference voltage or as a reference voltage as shown in FIG. 7A and FIG. 7B. In this example, $V_{OUT}$ is configured to be pulled down when $V_{IN}$ is larger than $V_{REF}$. This voltage comparator circuit enables a fast comparison between $V_{IN}$ and $V_{REF}$.

FIG. 10C illustrates an exemplary implementation of a reference voltage stabilizer circuit according to aspects of the present disclosure. In the example of FIG. 10C, the reference voltage stabilizer circuit includes a first NMOS transistor ($M_5$) having a drain terminal coupled to a power supply and a source terminal coupled to a circuit ground through a first leaker resistor ($R_1$), and a gate terminal is coupled to the intermediate reference voltage. The reference voltage stabilizer circuit further includes a second NMOS transistor ($M_6$) having a drain terminal coupled to the power supply and a source terminal coupled to the circuit ground through a second leaker resistor ($R_2$), and a gate terminal is coupled to the source terminal of the first NMOS transistor. The reference voltage stabilizer circuit further includes a PMOS transistor ($M_7$) having a drain terminal coupled to a power supply through third leaker resistor ($R_3$) and a source terminal coupled to the circuit ground, and a gate terminal is coupled to the source terminal of the second NMOS transistor, where the drain terminal of the PMOS transistor produces the corresponding reference voltage. In this example, an input reference voltage $V_{REF}$ at the gate terminal of $M_5$, the voltage at the source terminal of $M_5$ would be at $V_{REF}-V_T$. Similarly, the voltage at the source terminal of $M_6$ would be at $V_{REF}-2*V_T$; and the voltage at the drain terminal of $M_7$ would be at $V_{REF}-V_T$. As a result, a reference voltage is produced at $V_{REF}-V_T$.

FIG. 11A illustrates an exemplary implementation of a voltage comparator according to aspects of the present disclosure. As shown in FIG. 11A, a voltage comparator includes a first PMOS transistor $M_1$ having a drain terminal coupled to power supply, a gate terminal coupled to an input terminal, and a source terminal coupled to an output terminal; a first NMOS transistor $M_2$ having a drain terminal coupled to the source terminal of the first PMOS transistor, a gate terminal coupled to the input terminal; a second NMOS transistor $M_3$ having a drain terminal couple to a source terminal of the first NMOS transistor, a gate terminal coupled to the input terminal, and a source terminal coupled to a circuit ground; a third NMOS transistor $M_4$ having a drain terminal coupled to the power supply, a gate terminal coupled to the output terminal, and a source terminal coupled to the drain terminal of the second NMOS transistor; where the input terminal receives an input voltage $V_{IN}$ to be compared, the second NMOS $M_3$ and the third NMOS transistor $M_4$ form a reference voltage generator to produce a reference voltage at the drain terminal of the second NMOS transistor $M_3$, and the output terminal $V_{OUT}$ produces a control signal in response to a comparison between the input voltage and the reference voltage.

FIG. 11B illustrates another exemplary implementation of a voltage comparator according to aspects of the present disclosure. In the exemplary implementation of FIG. 11B, a voltage comparator includes a first NMOS transistor $M_7$ having a drain terminal coupled to an output terminal $V_{OUT}$, a gate terminal coupled to an input terminal $V_{IN}$, and a source terminal coupled to a circuit ground; a first PMOS transistor $M_5$ having a drain terminal coupled to a power supply, a gate terminal coupled to the input terminal $V_{IN}$; a second PMOS transistor $M_6$ having a drain terminal couple to a source terminal of the first PMOS transistor $M_5$, a gate terminal coupled to the input terminal $V_{IN}$, and a source terminal coupled to the drain terminal of the first NMOS transistor $M_7$; a third PMOS transistor $M_8$ having a drain terminal coupled to the source terminal of the first PMOS transistor $M_5$, a gate terminal coupled to the output terminal $V_{OUT}$, and a source terminal coupled to the circuit ground; where the input terminal $V_{IN}$ receives an input voltage to be compared, the first PMOS $M_5$ and the third PMOS transistor $M_8$ form a reference voltage generator to produce a reference voltage at the source terminal of the first PMOS transistor $M_5$, and the output terminal $V_{OUT}$ produces a control signal in response to a comparison between the input voltage $V_{IN}$ and the reference voltage.

FIG. 11C illustrates yet another exemplary implementation of a voltage comparator according to aspects of the present disclosure. In the example shown in FIG. 11C, the voltage comparator includes NMOS transistors $M_{13}$, $M_{14}$, and $M_{16}$ as well as PMOS transistors $M_{11}$, $M_{12}$, and $M_{15}$ connected in the manner shown in FIG. 11C. This voltage comparator is a combination of the voltage comparators described in FIG. 11A and FIG. 11B.

In this example, the input terminal $V_{IN}$ receives an input voltage to be compared. $M_{11}$ and $M_{15}$ form a reference voltage generator to produce a reference voltage at the source terminal of $M_{12}$; similarly $M_{14}$ and $M_{16}$ form a reference voltage generator to produce a reference voltage at the source terminal of $M_{13}$. The output terminal $V_{OUT}$ produces a control signal in response to a comparison between the input voltage $V_{IN}$ and the reference voltage, either at the source terminal of $M_{12}$ or at the source terminal of $M_{13}$.

According to aspects of the present disclosure, there are a number of benefits of the disclosed analog to digital converter over conventional analog to digital converters. For example, the disclosed analog to digital converter achieves magnitudes of performance improvement by using a reference charge unit, which may be represented by a reference current unit and a reference time unit. The performance of the analog to digital converter as well as the associated matrix computation circuit may be further enhanced as the disclosed analog to digital converter may be operated in parallel with the multiplications of the associated matrix computation circuit. Another benefit of the analog to digital converter is that it supports coarse or fine adjustments to allow over estimate or under estimate of an output value prior to reaching a final output value of the disclosed analog to digital converter.

Figures 12A, 12B:
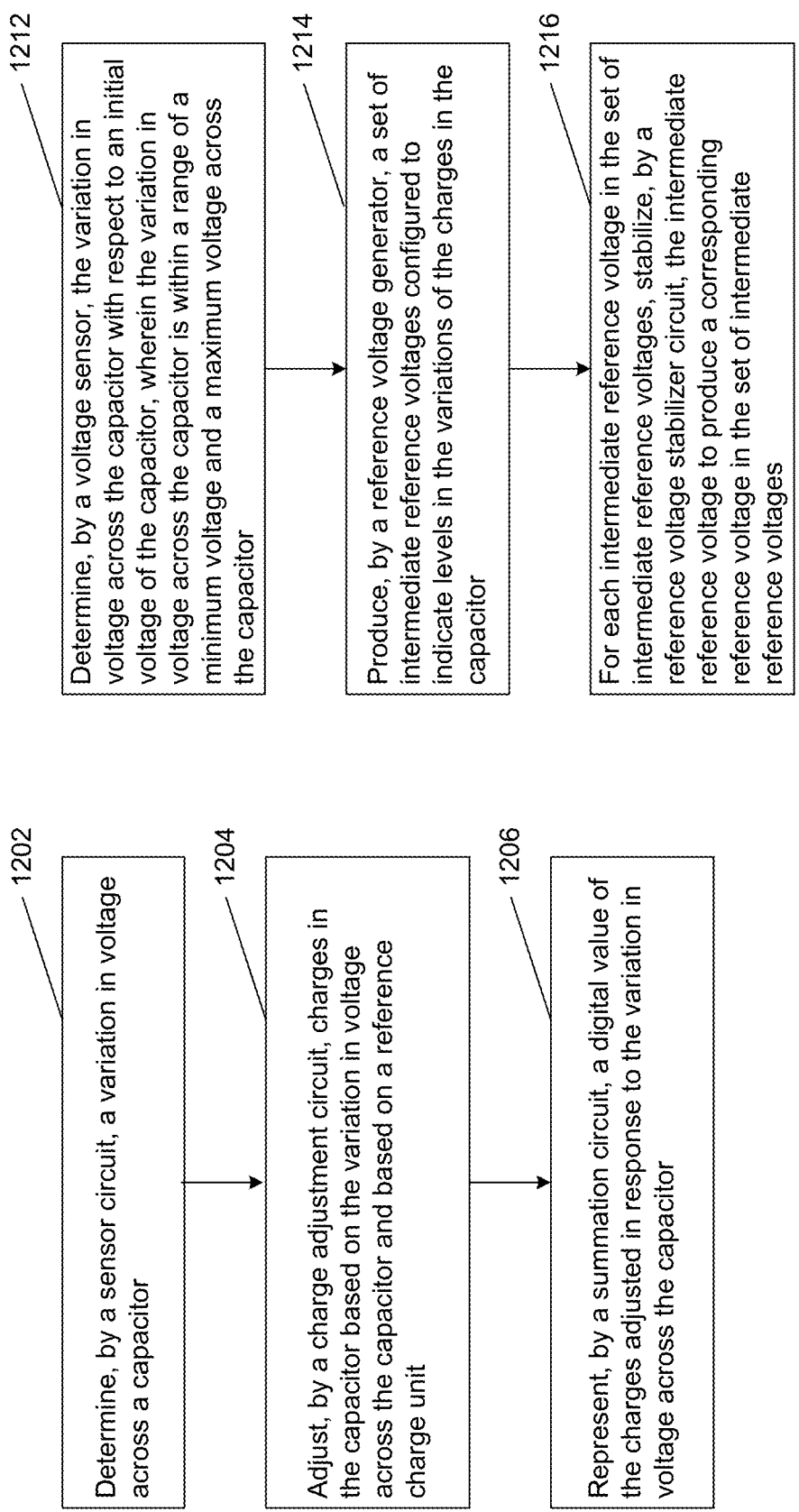
FIG. 12A illustrates an exemplary method of performing analog to digital conversion according to aspects of the present disclosure.
FIG. 12B illustrates an exemplary method of determining a variation in voltage across a capacitor according to aspects of the present disclosure.

FIG. 12A illustrates an exemplary method of performing analog to digital conversion according to aspects of the present disclosure. In the example of FIG. 12A, in block 1202, the method determines, by a sensor circuit, a variation in voltage across a capacitor. In block 1204, the method adjusts, by a charge adjustment circuit, charges in the capacitor based on the variation in voltage across the capacitor and based on a reference charge unit. In block 1206, the method represents, by a summation circuit, a digital value of the charges adjusted in response to the variation in voltage across the capacitor.

According to aspects of the present disclosure, the reference charge unit may include a product of a reference current unit and a reference time unit. The method of representing the digital value of the charges adjusted may include counting, by a plurality of counters corresponding to the plurality of voltage comparators, a number of reference time units the corresponding current source in the set of current sources has drawn charges from the capacitor or has added charges to the capacitor, and summing, by an adder, values of the plurality of counters that represent a digital value of the charges adjusted in response to the variation in voltage across the capacitor.

FIG. 12B illustrates an exemplary method of determining a variation in voltage across a capacitor according to aspects of the present disclosure. As shown in FIG. 12B, in block 1212, the method determining, by a voltage sensor, the variation in voltage across the capacitor with respect to an initial voltage of the capacitor, where the variation in voltage across the capacitor is within a range of a minimum voltage and a maximum voltage across the capacitor. In block 1214, the method producing, by a reference voltage generator, a set of intermediate reference voltages configured to indicate levels in the variations of the charges in the capacitor.

In some implementations, the methods performed in block 1212 and block 1214 may optionally or additionally include the methods performed in block 1216. In block

1216, for each intermediate reference voltage in the set of intermediate reference voltages, the method stabilizing, by a reference voltage stabilizer circuit, the intermediate reference voltage to produce a corresponding reference voltage in the set of intermediate reference voltages.

Figure 12C:
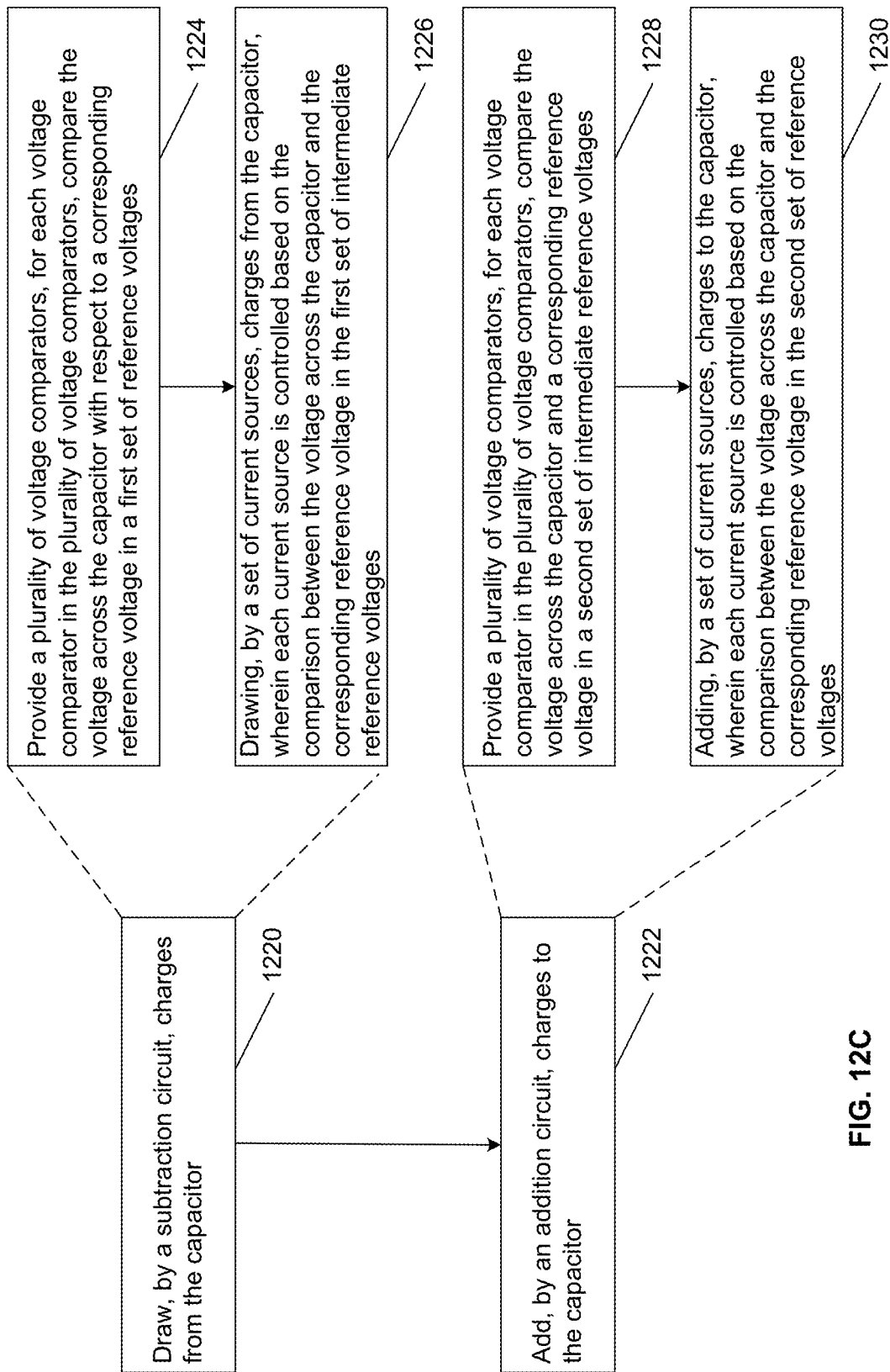
FIG. 12C illustrates an exemplary method of adjusting charges in a capacitor according to aspects of the present disclosure.

FIG. 12C illustrates an exemplary method of adjusting charges in a capacitor according to aspects of the present disclosure. In the exemplary implementation of FIG. 12C, in block 1220, the method draws, by a subtraction circuit, charges from the capacitor. In block 1222, the method adding, by an addition circuit, charges to the capacitor.

In some implementations, the method performed in block 1220 may optionally or additionally include the methods performed in block 1224 and block 1226. The method performed in block 1222 may optionally or additionally include the methods performed in block 1228 and block 1230. In block 1224, the method provides a plurality of voltage comparators. For each voltage comparator in the plurality of voltage comparators, the method compares the voltage across the capacitor with respect to a corresponding reference voltage in a first set of reference voltages. In block 1226, the method draws, by a set of current sources, charges from the capacitor, where each current source is controlled based on the comparison between the voltage across the capacitor and the corresponding reference voltage in the first set of intermediate reference voltages. In block 1228, the method provides a plurality of voltage comparators. For each voltage comparator in the plurality of voltage comparators, the method compares the voltage across the capacitor and a corresponding reference voltage in a second set of intermediate reference voltages. In block 1230, the method adds, by a set of current sources, charges to the capacitor, where each current source is controlled based on the comparison between the voltage across the capacitor and the corresponding reference voltage in the second set of reference voltages.

Figure 13A:
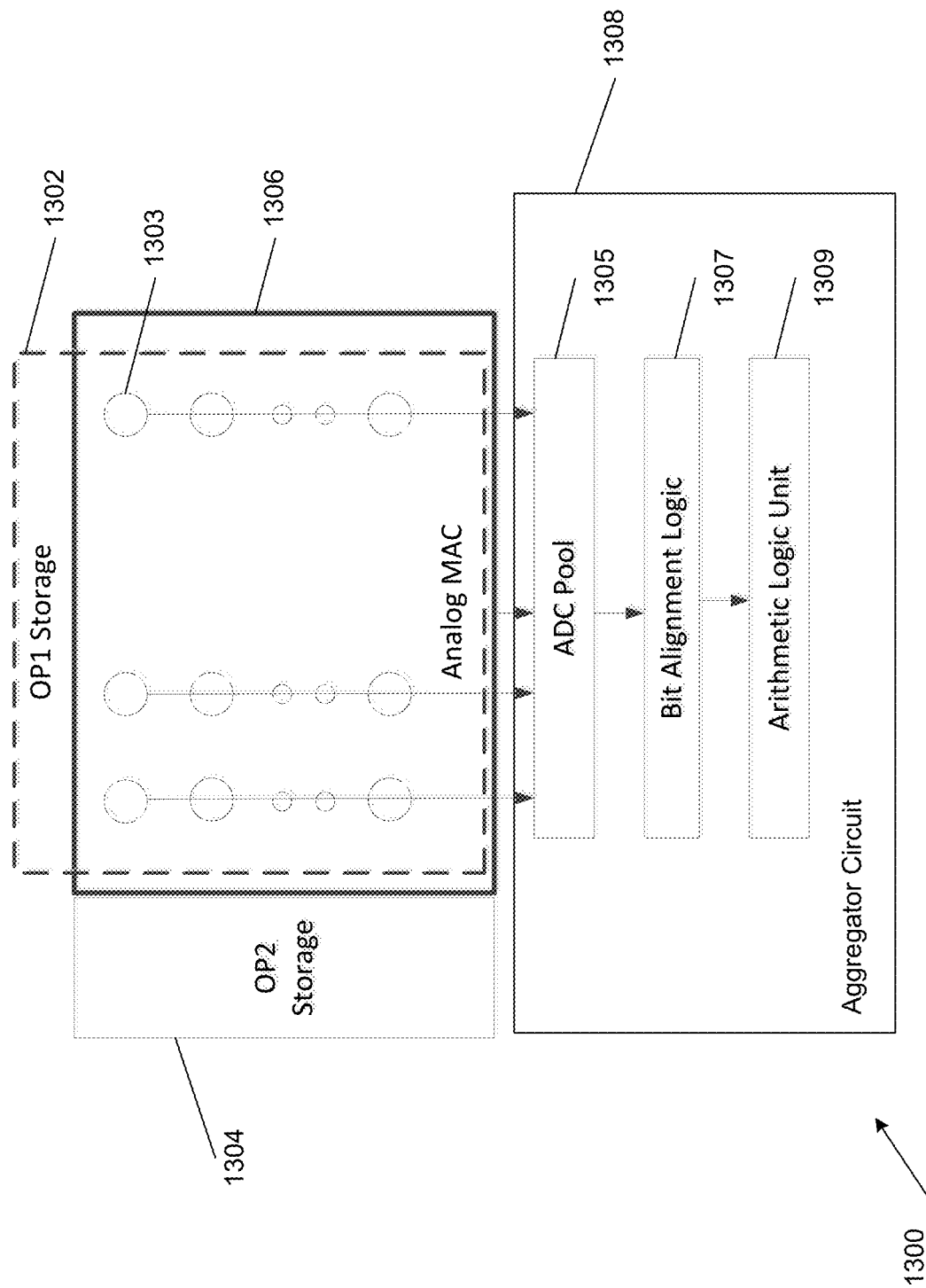
FIG. 13A illustrates an exemplary implementation of a scalable precision analog matrix computation circuit according to aspects of the present disclosure.

FIG. 13A illustrates an exemplary implementation of a matrix computation circuit according to aspects of the present disclosure. As shown in FIG. 13A, a matrix computation circuit 1300 may include a plurality of first operand memory 1302 (represented by the dotted box) configured to store a first set of input operands of the matrix computation circuit, and a plurality of second operand memory 1304 configured to store a second set of input operands of the matrix computation circuit, where the first set of input operands and the second set of input operands are programmable by a controller (not shown).

The matrix computation circuit 1300 may further include a plurality of multiplier circuits 1306 arranged in a plurality of rows and plurality of columns, where each row receives a corresponding operand from the first set of operands, and each column receives a corresponding operand from the second set of operands. The controller is configured to control the plurality of multiplier circuits to perform multiplications using the first set of operands and the second set of operands, where each multiplier circuit, represented by circle 1303, in the plurality of multiplier circuits performs a multiplication using one bit from a first operand and one bit from a second operand. The matrix computation circuit 1300 may further include an aggregator circuit 1308 configured to aggregate analog outputs of the plurality of multiplier circuits to produce a result of the matrix computation circuit.

The aggregator circuit 1308 may include an analog to digital converter (ADC) pool 1305 that includes one or more analog to digital converters configured to convert analog outputs of the plurality of multiplier circuits into one or more groups of digital values, a bit alignment logic 1307 configured to align the one or more groups of digital values according to a corresponding bit position of the first operand and a corresponding bit position of the second operand, and an arithmetic logic unit 1309 configured to perform shift and accumulate operations on the aligned one or more groups of digital values to produce the result of the matrix computation circuit.

Figure 13B:
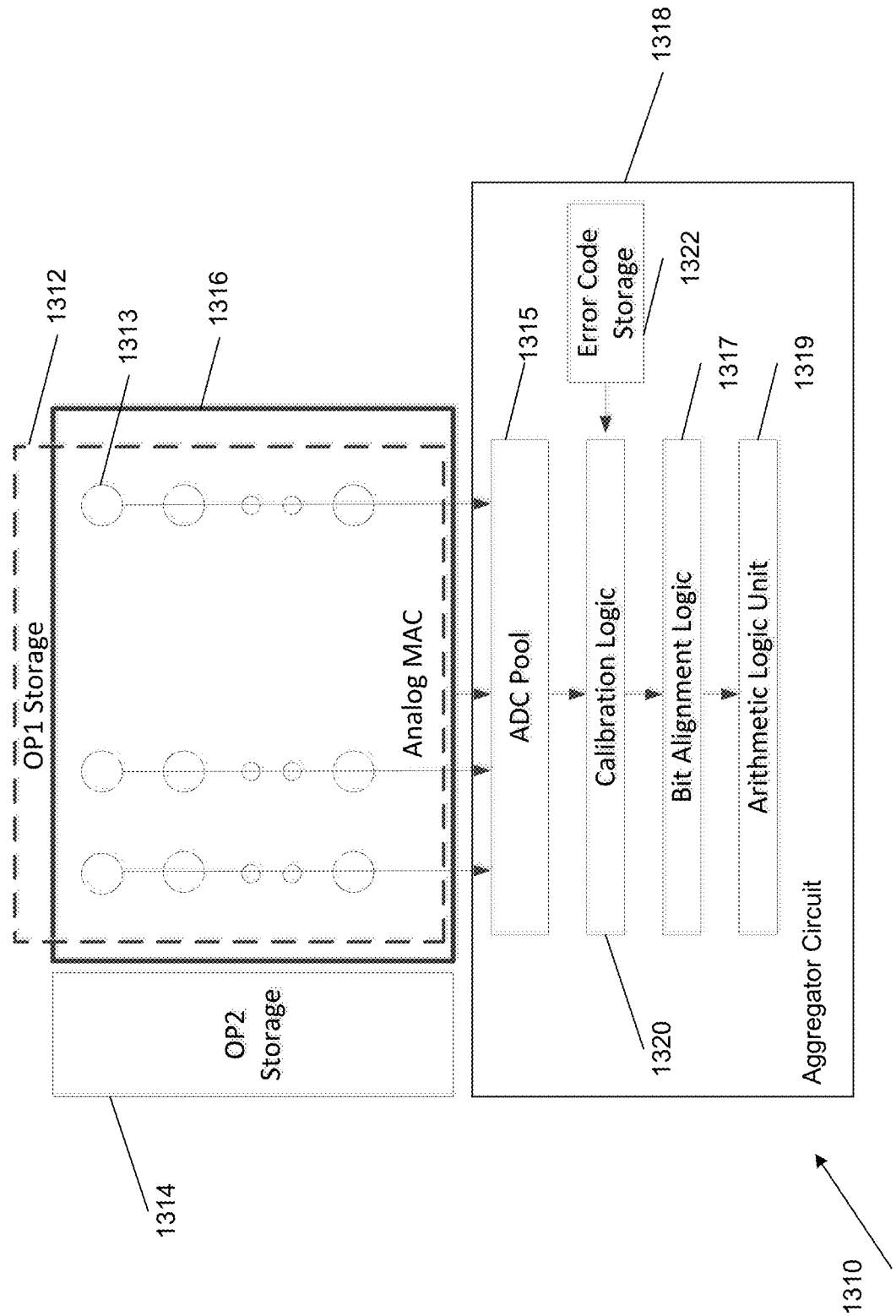
FIG. 13B illustrates another exemplary implementation of a scalable precision analog matrix computation circuit according to aspects of the present disclosure.

FIG. 13B illustrates another exemplary implementation of a scalable precision analog matrix computation circuit according to aspects of the present disclosure. Similar to the exemplary implementation of FIG. 13A, a matrix computation circuit 1310 may include a plurality of first operand memory 1312 (represented by the dotted box) configured to store a first set of input operands of the matrix computation circuit, and a plurality of second operand memory 1314 configured to store a second set of input operands of the matrix computation circuit, where the first set of input operands and the second set of input operands are programmable by a controller (not shown).

The matrix computation circuit 1310 may further include a plurality of multiplier circuits 1316 arranged in a plurality of rows and plurality of columns, where each row receives a corresponding operand from the first set of operands, and each column receives a corresponding operand from the second set of operands. The controller is configured to control the plurality of multiplier circuits 1316 to perform multiplications using the first set of operands and the second set of operands, where each multiplier circuit, represented by circle 1313, in the plurality of multiplier circuits performs a multiplication using one bit from a first operand and one bit from a second operand. The matrix computation circuit 1310 may further include an aggregator circuit 1318 configured to aggregate analog outputs of the plurality of multiplier circuits to produce a result of the matrix computation circuit.

The aggregator circuit 1318 may include an analog to digital converter (ADC) pool 1315 that includes one or more analog to digital converters configured to convert analog outputs of the plurality of multiplier circuits into one or more groups of digital values, a bit alignment logic 1317 configured to align the one or more groups of digital values according to a corresponding bit position of the first operand and a corresponding bit position of the second operand, and an arithmetic logic unit 1319 configured to perform shift and accumulate operations on the aligned one or more groups of digital values to produce the result of the matrix computation circuit.

In some implementations, the aggregator circuit 1318 may optionally or additionally include a calibration logic 1320 which operates using predetermined reference error codes stored in an error code storage 1322. The calibration logic 1320 may be configured to receive a digital value from an analog to digital converter in the one or more analog to digital converters, adjust the digital value based on a set of predetermined reference error codes, and provide an adjusted digital value to the bit alignment logic.

Figures 13C, 13D:
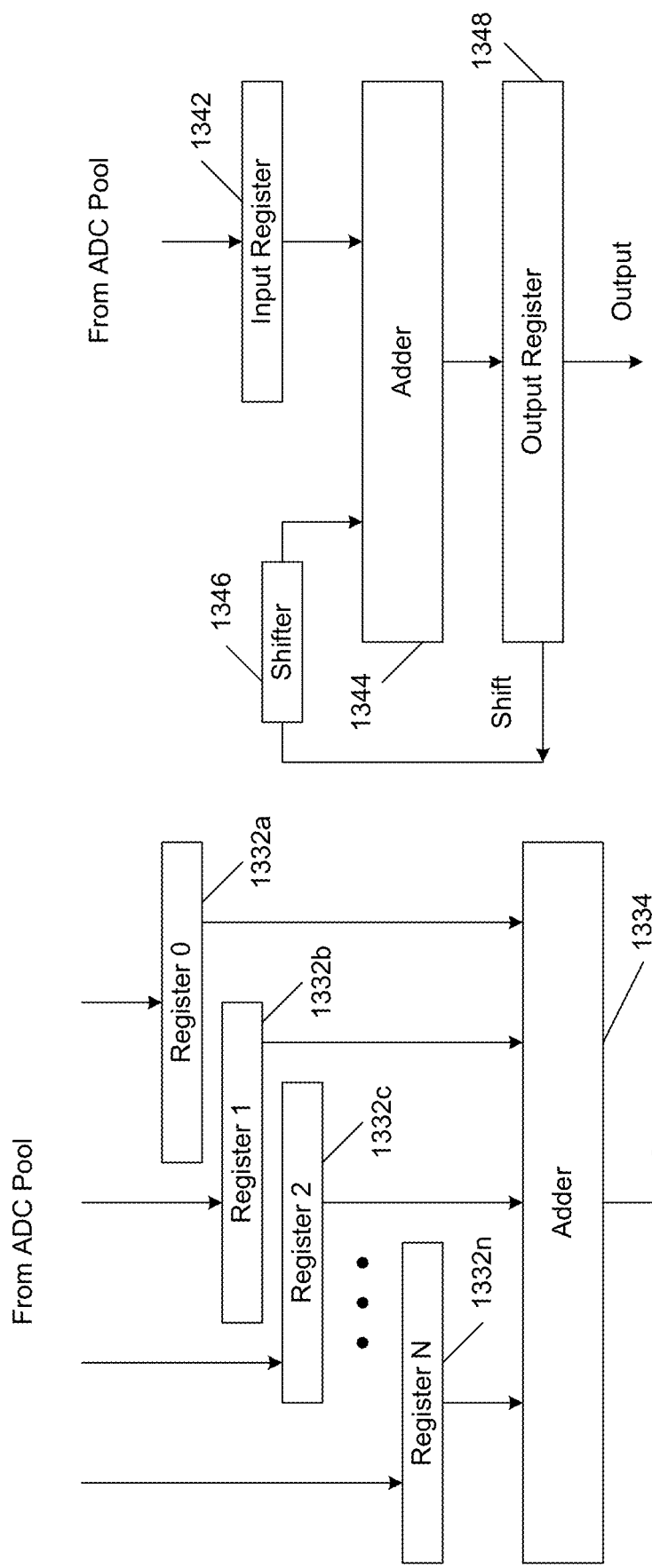
FIG. 13C illustrates an exemplary implementation of a bit alignment logic and an arithmetic logic unit according to aspects of the present disclosure.
FIG. 13D illustrates another exemplary implementation of a bit alignment logic and an arithmetic logic unit according to aspects of the present disclosure.

FIG. 13C illustrates an exemplary implementation of a bit alignment logic and an arithmetic logic unit according to aspects of the present disclosure. In the example shown in FIG. 13C, a bit alignment logic may include a set of registers, 1332a through 1332n, configured to store output digital values from the one or more analog to digital converters according to the corresponding bit position of the first operand and the corresponding bit position of the second operand. The output digital values from the set of registers (1332a through 1332n) are provided to an arithmetic logic unit, such as adder 1334, based on bit positions represented by the set of registers.

FIG. 13D illustrates another exemplary implementation of a bit alignment logic and an arithmetic logic unit according to aspects of the present disclosure. As shown in FIG. 13D, a bit alignment logic may include an input register 1342 configured to receive outputs from one or more analog to digital converters sequentially, where each sequentially received value from the one or more analog to digital converters is accumulated in the arithmetic logic unit. In some implementations, the arithmetic logic unit may be implemented by an adder 1344, a shifter 1346 and an output register 1348, to produce an accumulated value stored in the output register. The shifter 1346 is configured to shift the accumulated value based on bit positions represented by the accumulated value to produce a shifted accumulated value, where the shifted accumulated value is summed with a subsequent value received from the one or more analog to digital converters in the arithmetic logic unit.

Figure 14A:
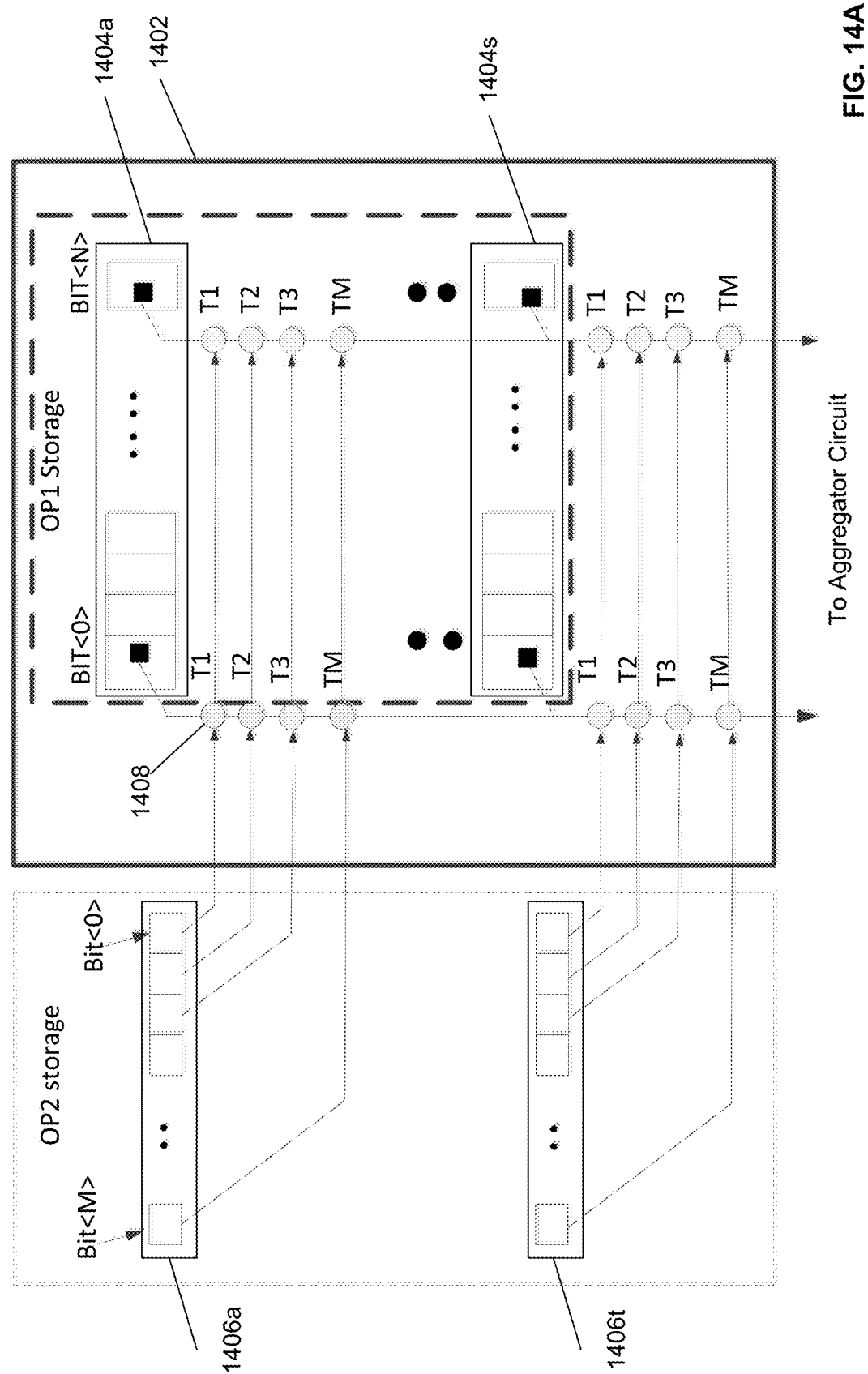
FIG. 14A illustrates an exemplary implementation of a plurality of multiplier circuits according to aspects of the present disclosure. In the example shown in FIG. 14A.

FIG. 14A illustrates an exemplary implementation of a plurality of multiplier circuits according to aspects of the present disclosure. In the example shown in FIG. 14A, a plurality of multiplier circuits 1402 may be arranged in a plurality of rows and plurality of columns, where each row receives a corresponding operand from a first set of operands, such as 1404a through 1404s, and each column receives a corresponding operand from a second set of operands such as 1406a through 1406t. The plurality of multiplier circuits 1402 may be configured to perform multiplications using the first set of operands 1404a through 1404s, and the second set of operands 1406a through 1406t, where each multiplier circuit, represented by circle 1408 in the plurality of multiplier circuits performs a multiplication using one bit from a first operand and one bit from a second operand.

As shown in FIG. 14A, in cycle T1, bit 0 from a second operand 1406a is multiplied to bit 0 through bit N of a first operand 1404a; and bit 0 from another second operand 1406t is multiplied to bit 0 through bit N of another first operand 1404s in parallel. In cycle T2, bit 1 from a second operand 1406a is multiplied to bit 0 through bit N of a first operand 1404a; and bit 1 from another second operand 1406t is multiplied to bit 0 through bit N of another first operand 1404s in parallel. In cycle T3, bit 2 from a second operand 1406a is multiplied to bit 0 through bit N of a first operand 1404a; and bit 2 from another second operand 1406t is multiplied to bit 0 through bit N of another first operand 1404s in parallel. Similarly, in cycle TM, bit M from a second operand 1406a is multiplied to bit 0 through bit N of a first operand 1404a; and bit M from another second operand 1406t is multiplied to bit 0 through bit N of another first operand 1404s in parallel. In other words, the plurality of multiplier circuits 1402 may be configured to multiply each bit from a second operand to a width of bits of a first operand sequentially, where the performance of the each set of the sequential multiplication is separated by a reference time interval based on a first set of design criteria of the matrix computation circuit. The plurality of multiplier circuits 1402 may be configured to multiply two or more first operands to two or more second operands in parallel. The results of the multiplications may be collected by an aggregator circuit, such as aggregator circuit 1308 or aggregator circuit 1318.

Figure 14B:
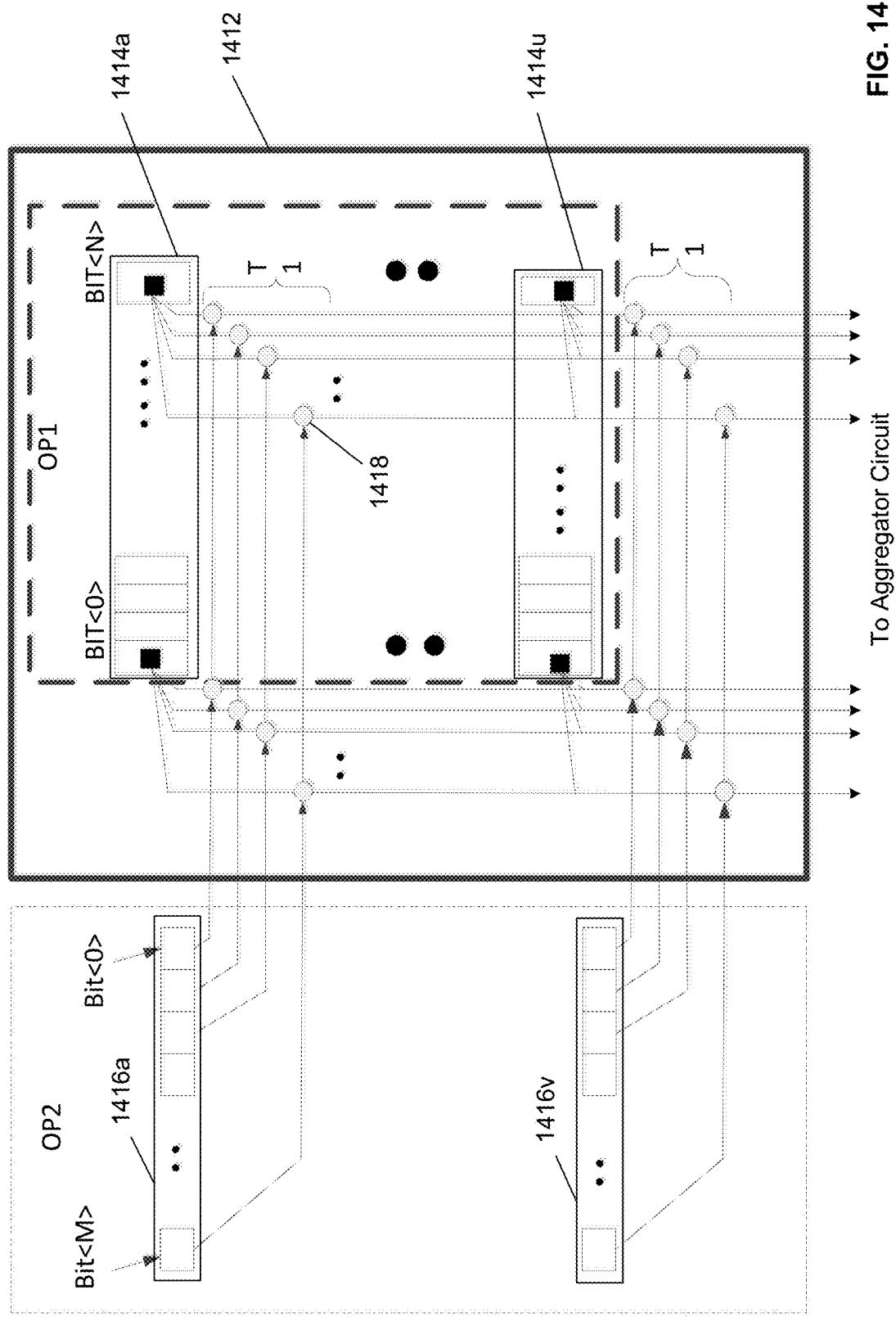
FIG. 14B illustrates another exemplary implementation of a plurality of multiplier circuits according to aspects of the present disclosure. In the example of FIG. 14B.

FIG. 14B illustrates another exemplary implementation of a plurality of multiplier circuits according to aspects of the present disclosure. Similar to the example of FIG. 14A, a plurality of multiplier circuits 1412 may be arranged in a plurality of rows and plurality of columns, where each row receives a corresponding operand from a first set of operands such as 1404a through 1404u, and each column receives a corresponding operand from a second set of operands such as 1406a through 1406v. The plurality of multiplier circuits 1412 may be configured to perform multiplications using the first set of operands 1404a through 1404u, and the second set of operands 1406a through 1406v, where each multiplier circuit, represented by circle 1418 in the plurality of multiplier circuits performs a multiplication using one bit from a first operand and one bit from a second operand.

As shown in FIG. 14B, in cycle T1, bit 0 through bit M from a second operand 1406a may be multiplied to bit 0 through bit N of a first operand 1404a; and bit 0 through bit M from another second operand 1406v is multiplied to bit 0 through bit N of another first operand 1404u in parallel. In other words, the plurality of multiplier circuits 1412 may be configured to multiply a width of bits from a second operand to a width of bits of a first operand in parallel, where the performance of the each set of the parallel multiplications may be separated by a reference time interval, labelled as T1, based on a first set of design criteria of the plurality of multiplier circuits. The plurality of multiplier circuits 1412 may be configured to multiply two or more first operands to two or more second operands in parallel. The results of the multiplications may be collected by an aggregator circuit, such as aggregator circuit 1308 or aggregator circuit 1318.

According to aspects of the present disclosure, a multiplier circuit, such as multiplier circuit 1303 in FIG. 13A, in the plurality of multiplier circuits may be configured to produce a voltage representing an output of the multiplication in accordance with the one bit from a first operand and one bit from a second operand. An aggregator circuit, such as aggregator circuit 1308 or aggregator circuit 1318, may be configured to convert the voltage to a digital value and aggregate the digital value with outputs of multiplications occurred within a referenced clock period to produce an aggregated output. In addition, the aggregator circuit may be further configured to aggregate the voltage with outputs of multiplications occurred within a referenced clock period to produce an aggregated voltage and convert the aggregated voltage to produce an aggregated output.

According to aspects of the present disclosure, the disclosed precision matrix computation circuit has a number of benefits. For example, besides the improved performance over the conventional methods of computing sum of multiple product pairs described above, the disclosed precision matrix computation circuit can be configured to perform the matrix computations based on positions of one or more bits of the operands. As a result, the disclosed approach reduces errors of the computation and reduces complexity of associated analog to digital converters. In addition, the disclosed precision matrix computation circuit can be implemented in less area and consumes less power during operation because of the reduction or elimination in computational logic and intermediate storage registers in the computation process.

FIG. 15A illustrates an exemplary implementation of a matrix computation circuit according to aspects of the present disclosure. In the example of FIG. 15A, in block 1502, the method stores, in a plurality of first operand memory, a first set of input operands of the matrix computation circuit, and stores, in a plurality of second operand memory, a second set of input operands of the matrix computation circuit, where the first set of input operands and the second set of input operands are programmable by a controller. In block 1504, the method arranges a plurality of multiplier circuits in a plurality of rows and plurality of columns, where each row receives a corresponding operand from the first set of operands, and each column receives a corresponding operand from the second set of operands. In block 1506, the method controls, by the controller, the plurality of multiplier circuits to perform multiplications using the first set of operands and the second set of operands, where each multiplier circuit in the plurality of multiplier circuits performs a multiplication using one bit from a first operand and one bit from a second operand. In block 1508, the method aggregates, by an aggregator circuit, analog outputs of the plurality of multiplier circuits to produce a result of the matrix computation circuit.

FIG. 15B illustrates an exemplary implementation of controlling the plurality of multiplier circuits to perform multiplications according to aspects of the present disclosure. As shown in FIG. 15B, in block 1512, the method multiplies each bit from a second operand to a width of bits of a first operand sequentially. The performance of the each set of the sequential multiplication is separated by a reference time interval based on a first set of design criteria of the matrix computation circuit. In block 1514, the method multiplies two or more first operands to two or more second operands in parallel.

Figure 15C:
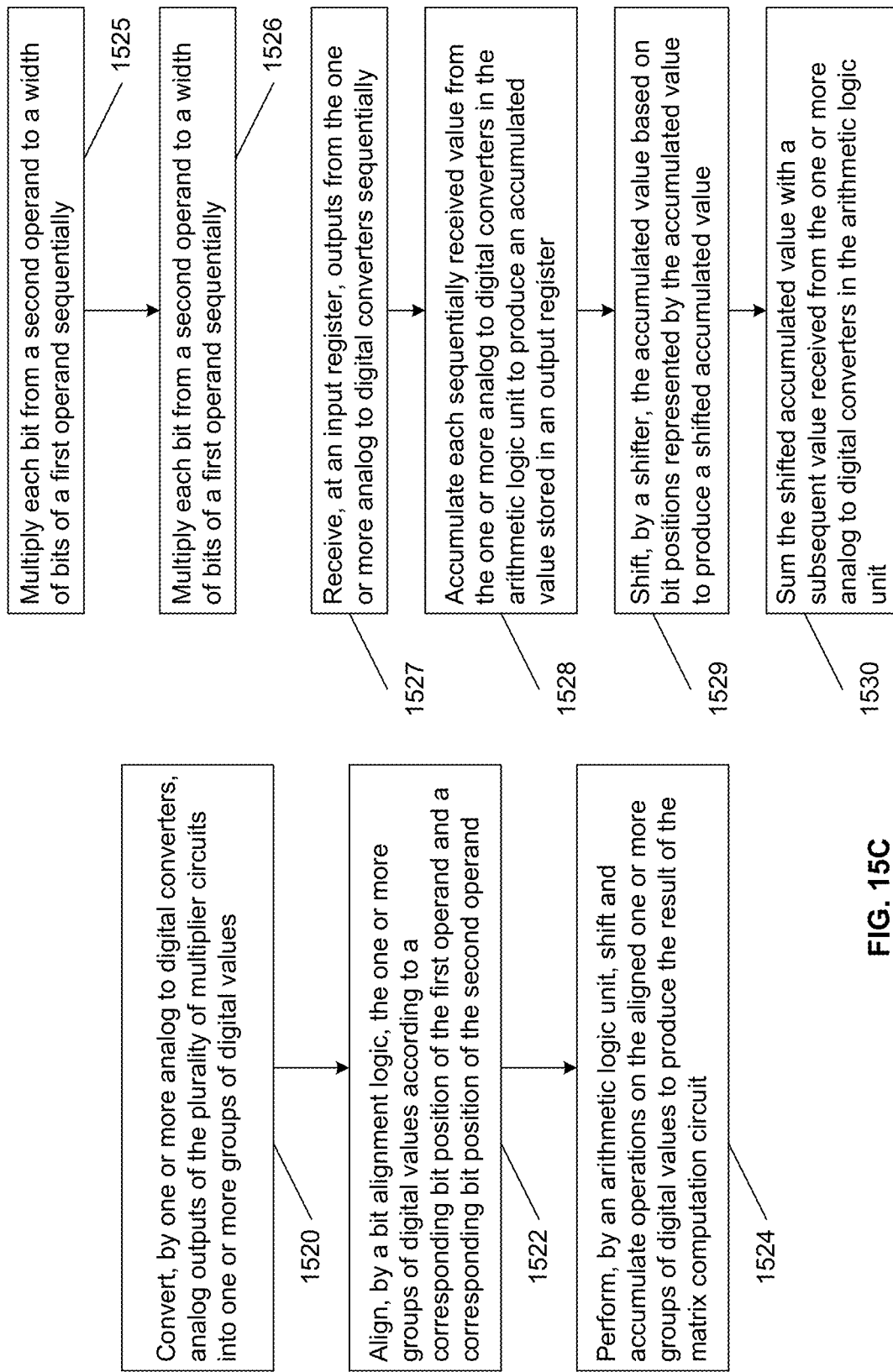
FIG. 15C illustrates an exemplary implementation of aggregating analog outputs of a set of multiplier circuits according to aspects of the present disclosure.
Figure 15D:
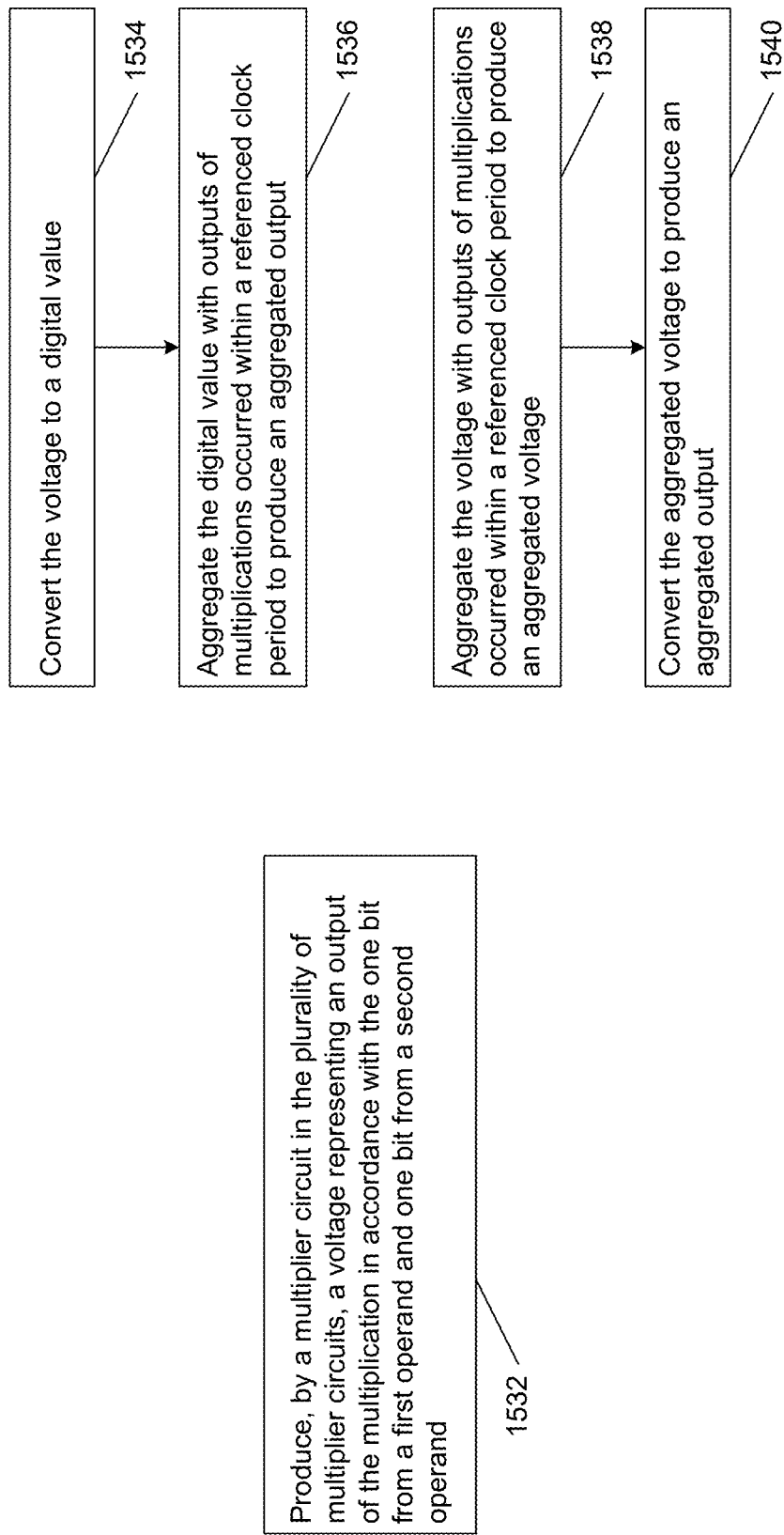
FIG. 15D illustrates another exemplary implementation of a matrix computation circuit according to aspects of the present disclosure.

FIG. 15C illustrates an exemplary implementation of aggregating analog outputs of a set of multiplier circuits according to aspects of the present disclosure. In the exemplary implementation of FIG. 15C, in block 1520, the method converts, by one or more analog to digital converters, analog outputs of the plurality of multiplier circuits into one or more groups of digital values. In block 1522, the method aligns, by a bit alignment logic, the one or more groups of digital values according to a corresponding bit position of the first operand and a corresponding bit position of the second operand. In block 1524, the method performs, by an arithmetic logic unit, shift and accumulate operations on the aligned one or more groups of digital values to produce the result of the matrix computation circuit.

In some implementations, the methods performed in block 1522 may optionally or additionally include the methods performed in block 1525 and block 1526. In block 1525, the method stores, in a set of registers, output digital values from the one or more analog to digital converters according to the corresponding bit position of the first operand and the corresponding bit position of the second operand. In block 1526, the method provides the output digital values to the arithmetic logic unit based on bit positions represented by the set of registers.

In some other implementations, the methods performed in block 1522 and block 1524 may optionally or additionally include the methods performed in block 1527, block 1528, block 1529 and block 1530. In block 1527, the method receives, at an input register, outputs from the one or more analog to digital converters sequentially. In block 1528, the method accumulates each sequentially received value from the one or more analog to digital converters in the arithmetic logic unit to produce an accumulated value stored in an output register. In block 1529, the method shifts, by a shifter, the accumulated value based on bit positions represented by the accumulated value to produce a shifted accumulated value. In block 1530, the method sums the shifted accumulated value with a subsequent value received from the one or more analog to digital converters in the arithmetic logic unit.

According to aspects of the present disclosure, the method of aggregating analog outputs of the plurality of multiplier circuits may further include receiving, at a calibration logic, a digital value from an analog to digital converter in the one or more analog to digital converters, adjusting, by the calibration logic, the digital value based on a set of predetermined reference error codes, and providing an adjusted digital value to the bit alignment logic.

FIG. 15D illustrates another exemplary implementation of a matrix computation circuit according to aspects of the present disclosure. As shown in the example of FIG. 15D, in block 1532, the method producing, by a multiplier circuit in the plurality of multiplier circuits, a voltage representing an output of the multiplication in accordance with the one bit from a first operand and one bit from a second operand.

In some implementations, the methods performed in block 1532 may optionally or additionally include the methods performed in block 1534 and block 1536. In block 1534, the method converts the voltage to a digital value. In block 1536, the method aggregates the digital value with outputs of multiplications occurred within a referenced clock period to produce an aggregated output. In some other implementations, the methods performed in block 1532 may optionally or additionally include the methods performed in block 1538 and block 1540. In block 1538, the method aggregates the voltage with outputs of multiplications occurred within a referenced clock period to produce an aggregated voltage. In block 1540, the method converts the aggregated voltage to produce an aggregated output.

Figure 16A:
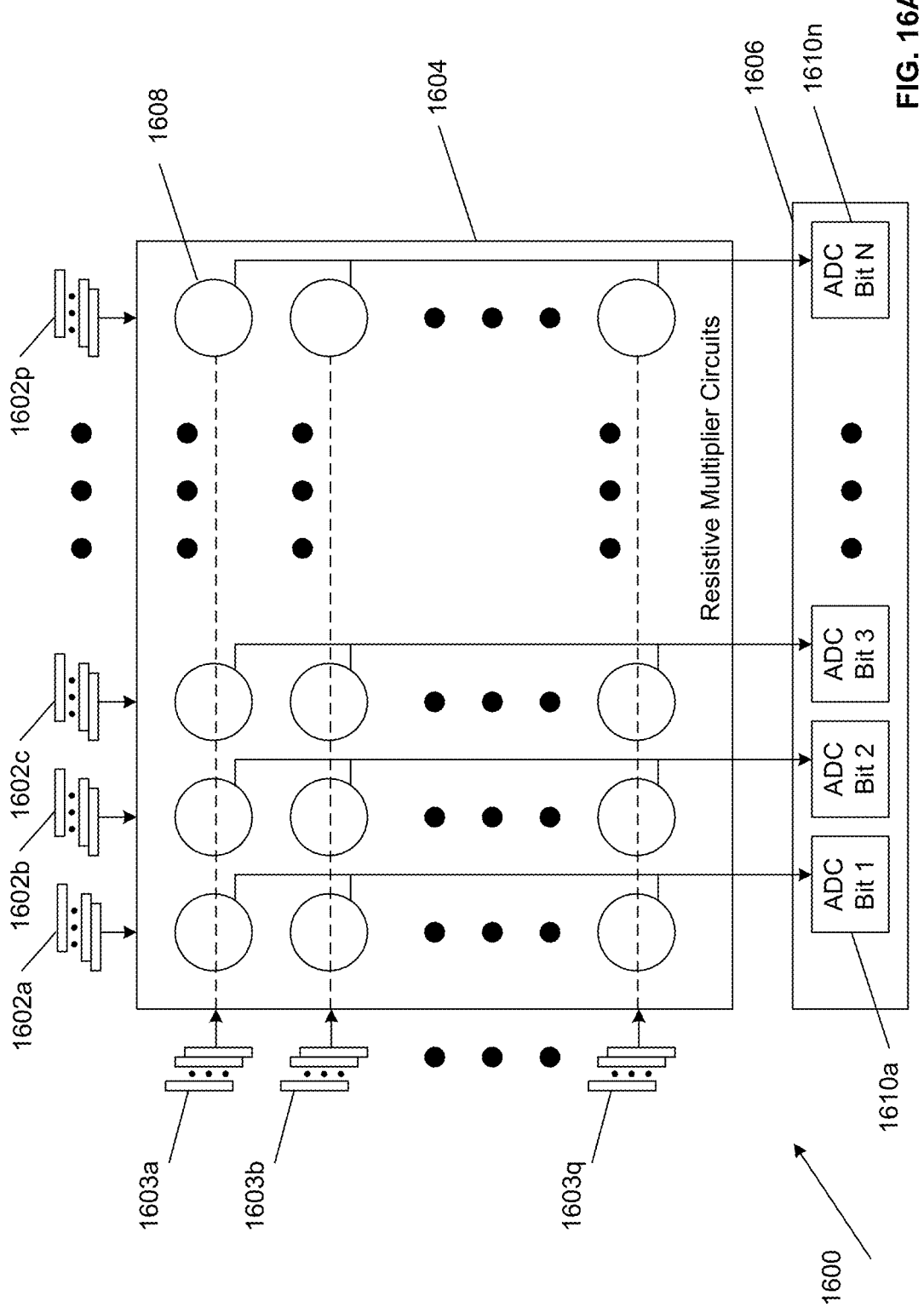
FIG. 16A illustrates an exemplary implementation of a resistive matrix computation circuit according to aspects of the present disclosure.

FIG. 16A illustrates an exemplary implementation of a resistive matrix computation circuit according to aspects of the present disclosure. As shown in FIG. 16A, the resistive matrix computation circuit 1600 may include a memory configured to store a first set of operands (labeled as 1602$a$ through 1602$p$) and a second set of operands (labeled as 1603$a$ through 1603$q$). The first set of input operands and the second set of input operands are programmable by a controller (not shown), and the first set of operands and the second set of operands are cross-multiplied to form a plurality of product pairs. The resistive matrix computation circuit 1600 may further include a plurality of resistive multiplier circuits 1604 configured to generate a plurality of output voltages according to the plurality of product pairs. The controller is configured to control the plurality of resistive multiplier circuits to perform multiplications using the first set of operands and the second set of operands. A resistive multiplier circuit is shown as a circle, for example circle 1608.

The resistive matrix computation circuit 1600 may further include an aggregator circuit 1606 configured to aggregate the plurality of output voltages from the plurality of resistive multiplier circuits. The plurality of analog output voltages may be converted to their corresponding digital value using a plurality of analog to digital converters (ADC), for example 1610$a$ through 1610$n$. The digital value of the plurality of output voltages represents an aggregated value of the plurality of product pairs. In some implementations, a resistive multiplier circuit 1608 may be configured to perform bitwise multiplication, and the corresponding analog and digital convert for a set of resistive multiplier circuits may be configured to produce a digital value of the output voltages from the set of resistive multiplier circuits.

In some implementations, the aggregator circuit 1606 may include one or more analog to digital converters configured to convert analog outputs of the plurality of multiplier circuits into one or more groups of digital values, a bit alignment logic configured to align the one or more groups of digital values according to a corresponding bit position of the first operand and a corresponding bit position of the second operand, and an arithmetic unit configured to perform shift and accumulate operations on the aligned one or more groups of digital values to produce the result of the resistive matrix computation circuit.

Figure 16C:
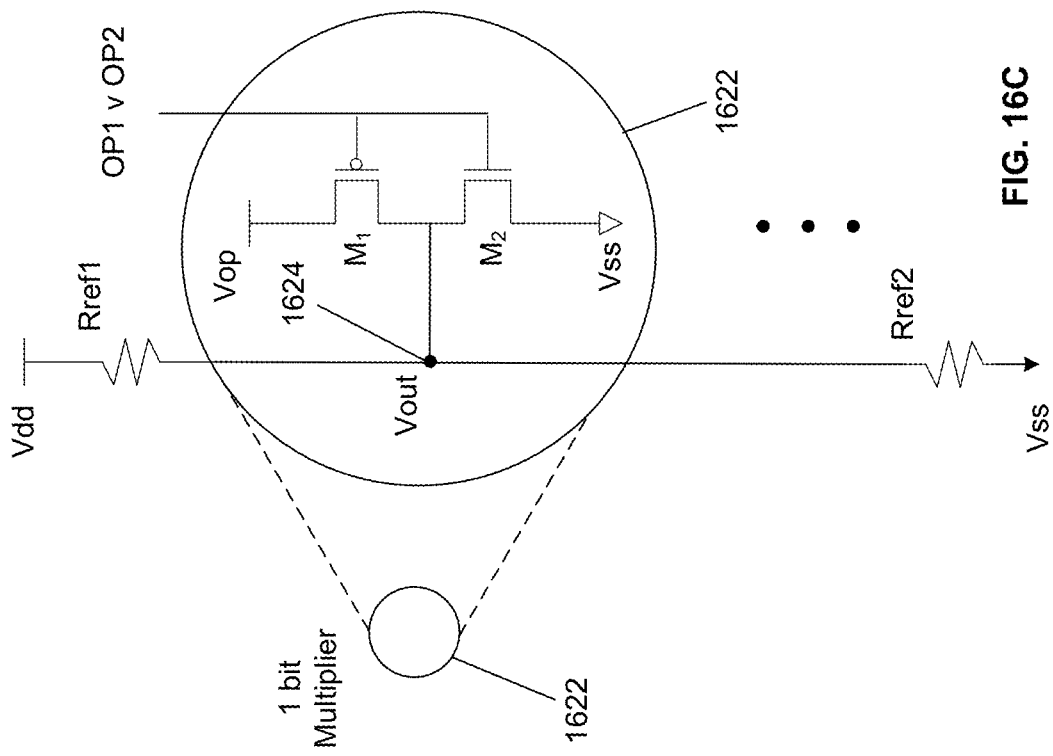
FIG. 16C illustrates another exemplary implementation of a resistive multiplier circuit according to aspects of the present disclosure.
Figure 16B:
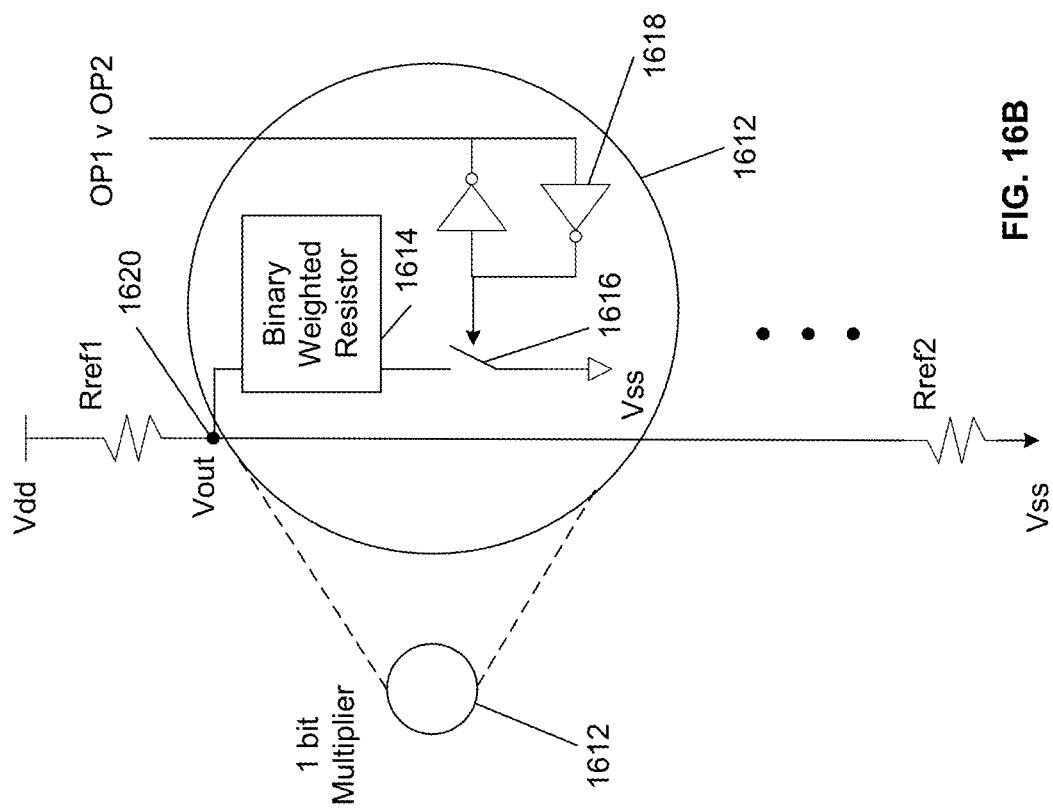
FIG. 16B illustrates an exemplary implementation of a resistive multiplier circuit according to aspects of the present disclosure.

FIG. 16B illustrates an exemplary implementation of a resistive multiplier circuit according to aspects of the present disclosure. In the exemplary implementation of FIG. 16B, the resistive multiplier circuit 1612 may include a binary weighted resistor 1614, a switch 1616 controlled by a result of a logical or of a first bit from the first operand and a second bit from the second operand, a pair of cross-coupled inverters 1618 configured to hold the re result of a logical or of a first bit from the first operand and a second bit from the second operand in the each resistive multiplier circuit. The resistive multiplier circuit 1612 is configured to generate an output voltage at node 1620 based on the binary weighted resistor, the first bit from the first operand and the second bit from the second operand.

In this example, the switch may be controlled to be closed when either OP1 or OP2 has a value of logical 1, and produces a current from the Vout node 1620 through the binary weighted resistor 1614 to circuit ground, thus the resistive multiplier circuit 1612 affects the voltage at the Vout node 1620 proportional to the binary weighted resistance value of the resistor 1614. Similarly, the switch may be controlled to be open when both OP1 and OP2 has a value of logical 0, and thus no current may flow from the Vout node 1620 through the binary weighted resistor 1614 to circuit ground. The Rref1 and/or Rref2 (optional) may be configured to set the output voltages from a group of resistive multiplier circuits within a range of voltages, which is further described in association with FIG. 16E.

In some implementations, a resistor configured to represent a resistance value associated with a bit location of an operand may include at least one of: 1) a resistor configured to represent a resistance value associated with a bit location of the second operand; 2) multiple parallel connected resistors configured to represent the resistance value associated with the bit location of the second operand, where each of the parallel connected resistor has same resistance value, and a number of the multiple parallel connected resistors may be in power of two; 3) a transistors configured to represent the resistance associated with the bit location of the second operand based on a ratio of channel width to channel length of the transistor; or 4) multiple parallel connected transistors configured to represent the resistance value associated with the bit location of the second operand, where each of the parallel connected transistor has same resistance value, and a number of the multiple parallel connected transistors is in power of two. The resistance value associated with each bit location of the second operand is expressed in the form of power of two.

FIG. 16C illustrates another exemplary implementation of a resistive multiplier circuit according to aspects of the present disclosure. In the example of FIG. 16C, the resistive multiplier circuit 1622 may include a first transistor $M_1$ and a second transistor $M_2$ controlled by a result of a logical or of a first bit from the first operand and a second bit from the second operand. Both of the first transistor $M_1$ and the second transistor $M_2$ are designed to produce substantially the same binary weighted resistance value corresponding to the bit position(s) of the first bit from the first operand and the second bit from the second operand. The resistive multiplier circuit 1622 is configured to generate an output voltage at node 1624 based on the first bit from the first operand and the second bit from the second operand.

In this example, the first transistor $M_1$ is implemented using a PMOS transistor and a second transistor $M_2$ is implemented using a NMOS transistor. The PMOS transistor has a source terminal coupled to a programmable operating voltage, a gate terminal coupled to an input representing logical or of a first bit from the first operand and a second bit from the second operand, and a drain terminal coupled to an output of the resistive multiplier circuit, where the PMOS transistor is configured to perform as a binary weighted resistor. The NMOS transistor has a source terminal coupled to a circuit ground, a gate terminal coupled to the input representing logical or of the first bit from the first operand and the second bit from the second operand, a drain terminal couple to the output of the resistive multiplier circuit, where the NMOS transistor is also configured to perform as a binary weighted resistor. Each of the PMOS transistor and the NMOS transistor is configured to produce a same resistance value, and the PMOS transistor and the NMOS transistor are configured to generate an output voltage based on the first bit from the first operand and the second bit from the second operand.

In the example of FIG. 16C, when either OP1 or OP2 has a value of logical 1, the Vout node 1624 is pulled down to circuit ground through the transistor $M_2$, thus the resistive multiplier circuit 1622 affects the voltage at the Vout node 1624 proportional to the binary weighted resistance value of the transistor $M_2$. Similarly, when both OP1 and OP2 has a value of logical 0, the Vout node 1624 is pulled up to a programmable operating voltage Vop through the transistor $M_1$, thus the resistive multiplier circuit 1622 affects the voltage at the Vout node 1624 proportional to the binary weighted resistance value of the transistor $M_1$. The Rref1 and/or Rref2 (optional) may be configured to set the output voltages from a group of resistive multiplier circuits within a range of voltages, which is further described in association with FIG. 16E.

According to aspects of the present disclosure, transistor $M_1$ and transistor $M_2$ are biased to reduce errors caused by the transistors and to reduce power consumption of the transistors. For example, the voltage differential between the gate terminal and the source terminal is set to as high as allowed by the particular design of the resistive computation circuit to reduce the adverse impact due to transistor variations, such as variations of the threshold voltage of the transistors. In addition, the voltage differential between the drain terminal and the source terminal is set to as low as allowed by the particular design of the resistive computation circuit to keep the transistors operating in the linear region. Operating in the linear region also ensures the transistors to produce a substantially constant resistance value during operation. In addition, a low voltage differential between the drain terminal and the source terminal also reduces the gain of the transistor, which in turn reduces errors associated with variations of the threshold voltage of the transistors. Furthermore, a low voltage differential between the drain terminal and the source terminal enables the resistive matrix computation circuit to consume less power.

In the example of FIG. 16C, the voltage differential between the drain terminal and the source terminal of transistor $M_1$ and the voltage differential between the drain terminal and the source terminal of transistor $M_2$ are affected by the setting of the programmable operating voltage Vop, which may be set externally. In some implementations, the setting of Vop can be a design tradeoff between error tolerance and the design complexity of the analog to digital converts used in the resistive matrix computation circuit. For example, a smaller Vop would require a higher resolution analog to digital converter to detect the smaller changes in voltages (also referred to as smaller step sizes) produced at the outputs of the resistive multiplier circuits; on the other hand, a larger Vop would require a lower resolution analog to digital converter to detect the larger changes in voltages (also referred to as larger step sizes) produced at the outputs of the resistive multiplier circuits. Circuit simulations may be performed to select the appropriate design tradeoff prior to the circuit being manufactured.

Figures 16D, 16E:
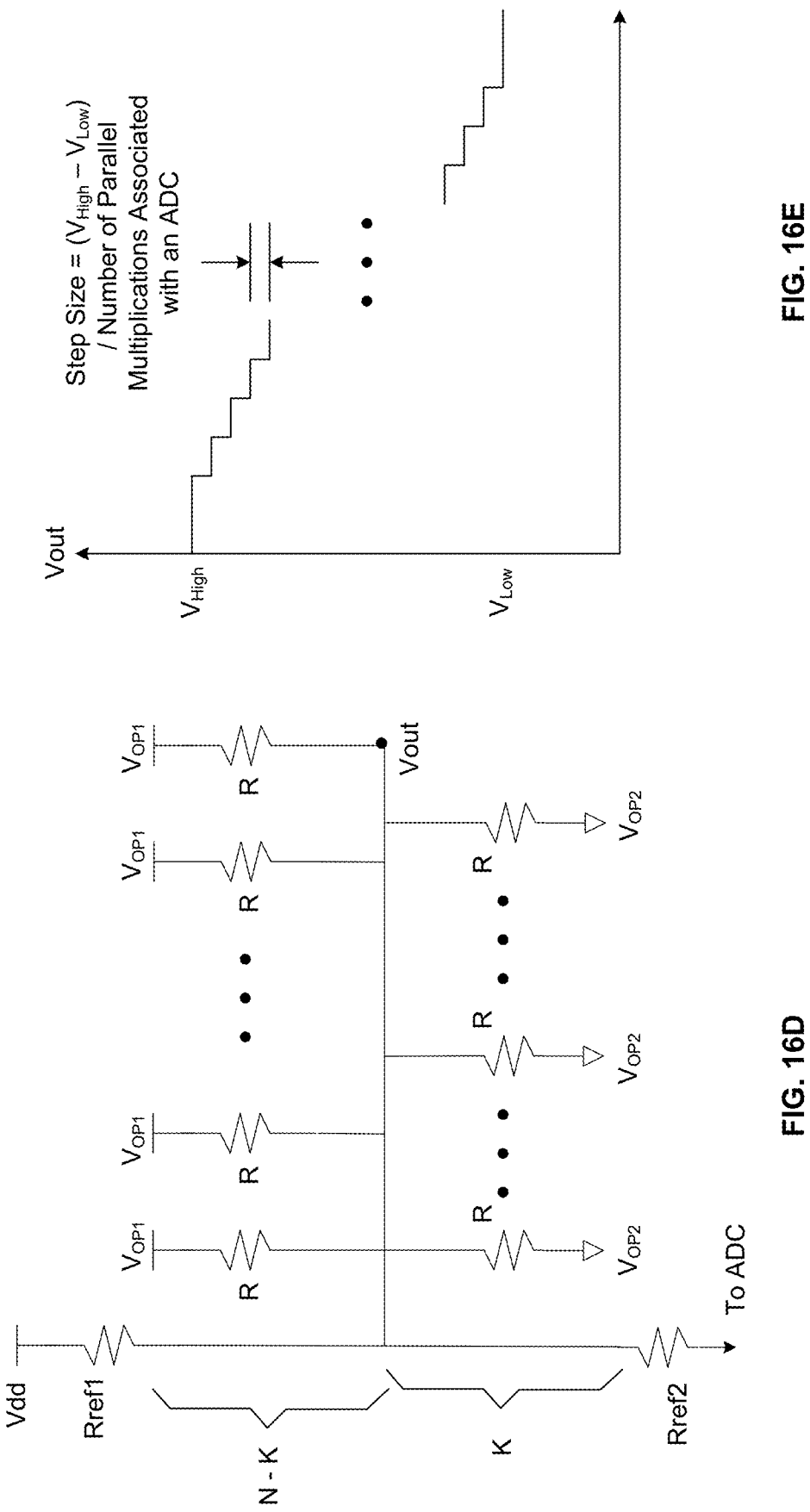
FIG. 16D illustrates an exemplary representation of output voltages according to aspects of the present disclosure.
FIG. 16E illustrates an exemplary representation of a step size of output voltages according to aspects of the present disclosure.

FIG. 16D illustrates an exemplary representation of output voltages according to aspects of the present disclosure. As in the examples of FIG. 16B and FIG. 16C, since each output of the plurality of resistive multiplier circuits are connected in parallel, the effect of the plurality of resistive multiplier circuits may be represented as shown in FIG. 16D. During operation, depending on values of the operands, certain resistive multiplier circuits may be represented as one or more pull up resistors, and certain resistive multiplier circuits may be represented as one or more pull down resistors. Thus, the voltage at the Vout node may be represented as a ratio of number of pull up resistors and number of pull down resistors. Note that since the pull up and pull down resistors may be implemented with binary weighted resistors, one benefit of this implementation is that the reliance on an exact resistance value of a resistor is eliminated because the output voltage is now based on the number of pull up resistors and the number of pull down resistors.

In the particular example of FIG. 16D, there may be (N–K) pull up resistors and K pull down resistors for a particular result of multiplications between two operands. This result is gathered by an analog to digital converter circuit in an aggregator circuit for further processing. Note that in some situations, the number of pull up resistors may be zero; and in some other situations, the number of pull down resistors may be zero, both of these situations are not shown in FIG. 16D.

In the example of FIG. 16D, the voltages Vop1 and Vop2 may be programmable, and may be set externally. In some implementations, the setting of voltages Vop1 and Vop2 can be a design tradeoff between error tolerance and the design complexity of the analog to digital converts used in the resistive matrix computation circuit. For example, a smaller voltage differential between voltages Vop1 and Vop2 would require a higher resolution analog to digital converter to detect the smaller changes in voltages (also referred to as smaller step sizes) produced at the outputs of the resistive multiplier circuits; on the other hand, a larger voltage differential between voltages Vop1 and Vop2 would require a lower resolution analog to digital converter to detect the larger changes in voltages (also referred to as larger step sizes) produced at the outputs of the resistive multiplier circuits. Circuit simulations may be performed to select the appropriate design tradeoff prior to the circuit being manufactured.

FIG. 16E illustrates an exemplary representation of a step size of output voltages according to aspects of the present disclosure. In the example of FIG. 16E, the output voltages may be configured to be in a range between a low voltage $V_{Low}$ and a high voltage $V_{High}$. A step size of the plurality of output voltages may be configured to equal to a difference between the high voltage $V_{High}$ and the low voltage $V_{Low}$ divided by a number of the plurality of multiplier circuits operated in parallel, where the step size of the plurality of output voltages is configured to be even. In some implementations, the number of the plurality of multiplier circuits operated in parallel may be a bit width of an operand.

Figure 16F:
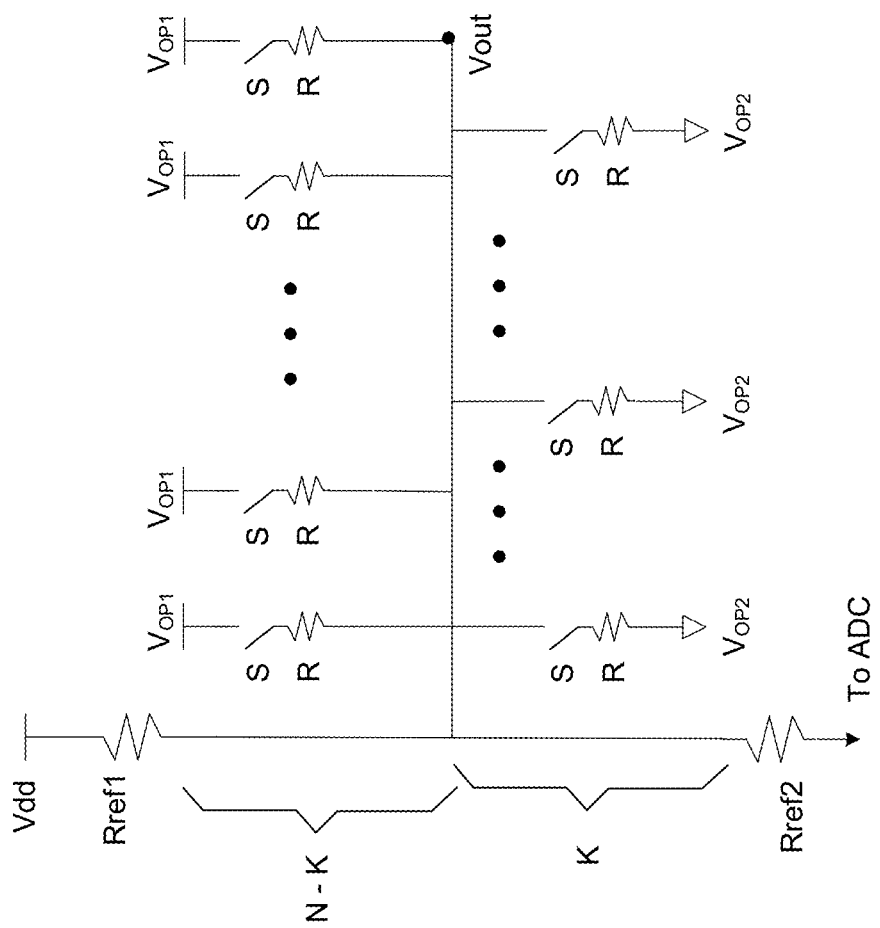
FIG. 16F illustrates another exemplary representation of output voltages according to aspects of the present disclosure.

FIG. 16F illustrates another exemplary representation of output voltages according to aspects of the present disclosure. Similar to the example of FIG. 16D, there may be (N–K) pull up resistors and K pull down resistors for a particular result of multiplications between two operands. This result is gathered by an analog to digital converter circuit in an aggregator circuit for further processing. In this particular implementation, each resistor may be controlled by a corresponding switch, labelled as S. The operation of the pull up resistors and pull down resistors are similar to that of FIG. 16D; the description of the operation is not repeated here. Note that in some situations, the number of pull up resistors may be zero; and in some other situations, the number of pull down resistors may be zero, both of these situations are not shown in FIG. 16F.

Figures 17A, 17B:
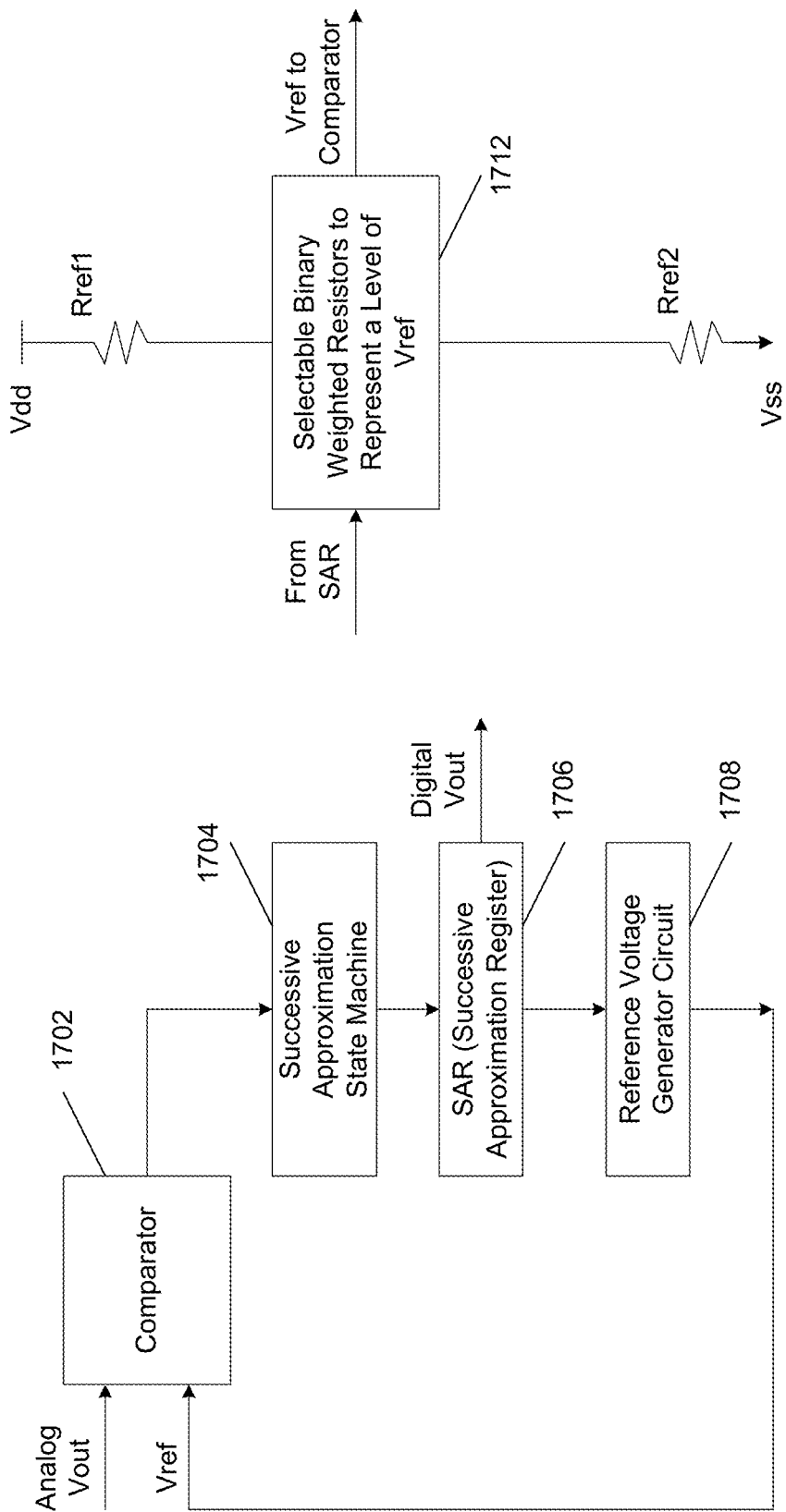
FIG. 17A illustrates an exemplary implementation of an analog to digital converter according to aspects of the present disclosure.
FIG. 17B illustrates an exemplary implementation of a reference voltage generator circuit of the analog to digital converter of FIG. 17A according to aspects of the present disclosure.

FIG. 17A illustrates an exemplary implementation of an analog to digital converter according to aspects of the present disclosure. In the exemplary implementation of FIG. 17A, an analog to digital converter, such as 1610a of FIG. 16A, may include a comparator 1702 configured to compare an analog output voltage from the plurality of multiplier circuits to an adjustable reference voltage, a successive approximation register 1706 configured to store intermediate digital voltages and an output digital voltage of the analog to digital converter, a successive approximation state machine 1704 configured to set an intermediate digital voltage or the output digital voltage based on the adjustable reference voltage and a comparison result from the comparator, and a reference voltage generator circuit 1708 configured to generate the adjustable reference voltage using the intermediate digital voltage. The process represented by the loop from 1708 to 1702 with an adjustable Vref is repeated until the analog output voltage and the adjustable reference voltage are the same, the intermediate digital voltage may then become the output digital voltage of the analog to digital converter, indicated as digital Vout in FIG. 17A.

In some implementations, based on the comparison result from the comparator 1702 and the previous value in the successive approximation register (SAR) 1706, the successive approximation state machine 1704 may generate an updated value to store in the successive approximation register. Note that from the information described in FIG. 16A through FIG. 16E, the successive approximation state machine may already know the range of the analog Vout and the number of step sizes (i.e. number of possible levels associated with the analog Vout). With this approach, the successive approximation state machine may be configured to match the value of the analog Vout in a binary search manner. For example, if there are 32 levels with step size of 1, and assuming the analog Vout has a digital equivalent value of 14, the successive approximation state machine may use an initial SAR value of 16 in the first iteration; an updated SAR value of 8 in the second iteration; another updated SAR value of 12 in the third iteration; and another updated SAR value of 14 in the fourth iteration. In the first three iterations, the comparator is configured to inform the successive approximation state machine there is no match and whether the adjusted Vref may be high or low as compared to the analog Vout. This information is used to generate the intermediate SAR values to be used by the reference voltage generator circuit 1708. In the fourth iteration, the comparator has found a match between the analog Vout and the adjusted Vref. Then, the value in the SAR becomes the output of the digital to analog converter.

FIG. 17B illustrates an exemplary implementation of a reference voltage generator circuit of the analog to digital converter of FIG. 17A according to aspects of the present disclosure. As shown in FIG. 17B, the reference voltage generator circuit includes a circuit structure replicating the plurality of multiplier circuits, and a set of selectable binary weighted resistors 1712 configured to represent a level of the adjustable reference voltage based on the intermediate digital voltage (also referred to as an updated SAR value) stored in the successive approximation register.

According to aspects of the present disclosure, the disclosed resistive matrix computation circuit has a number of benefits. For example, using the method of aggregating output voltages, from multiple resistive multiplier circuits, to represent a sum of multiple product pairs in analog circuits can be magnitudes faster than the conventional methods of computing sum of multiple product pairs using combinatorial logic, general/specialized processors, and/or software. In addition, the disclosed resistive matrix computation circuit can further improve precision by performing bitwise multiplications by taking one bit from either operands, and represent the output voltage as a ratio of resistors associated with the associated bit position. In addition, the disclosed approach reduces the complexity of the supporting analog to digital converters by generating the output voltages within a range and making the distribution of step sizes of the output voltages even within the range.

Figure 18A:
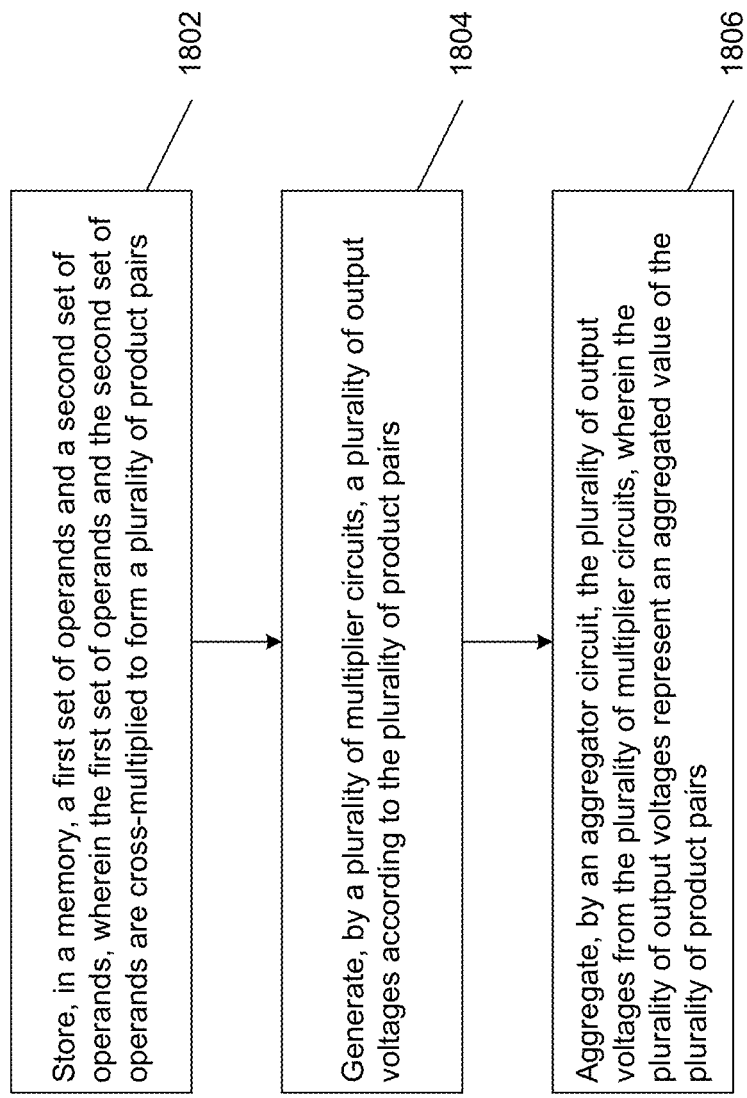
FIG. 18A illustrates an exemplary implementation of a resistive matrix computation circuit according to aspects of the present disclosure.

FIG. 18A illustrates an exemplary implementation of a resistive matrix computation circuit according to aspects of the present disclosure. In the example shown in FIG. 18A, in block 1802, the method stores, in a memory, a first set of operands and a second set of operands, where the first set of operands and the second set of operands are cross-multiplied to form a plurality of product pairs. In block 1804, the method generates, by a plurality of multiplier circuits, a plurality of output voltages according to the plurality of product pairs. In block 1806, the method aggregates, by an aggregator circuit, the plurality of output voltages from the plurality of multiplier circuits, where the plurality of output voltages represent an aggregated value of the plurality of product pairs.

Figures 18B, 18C:
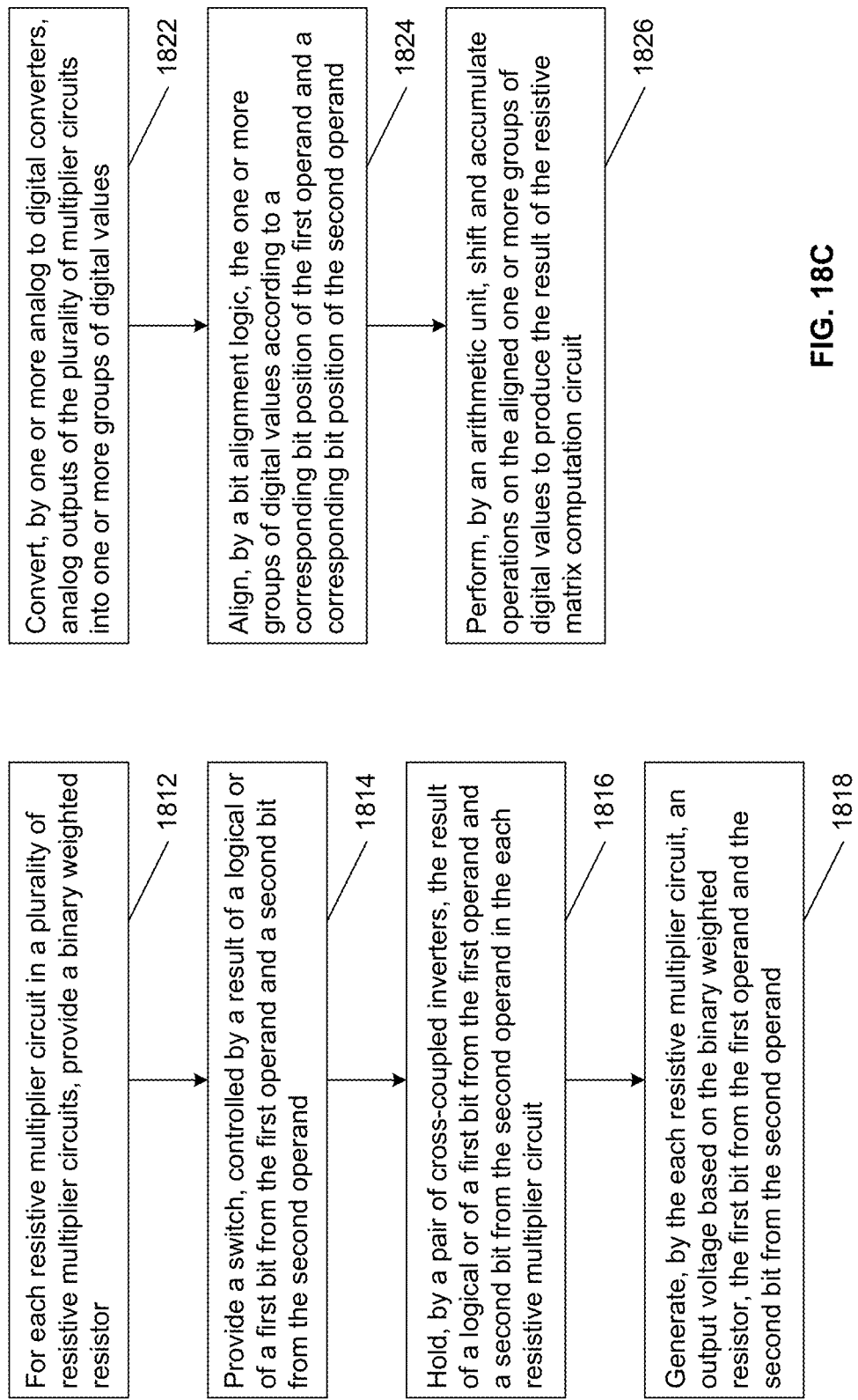
FIG. 18B illustrates an exemplary implementation of generating a set of output voltages in a resistive matrix computation circuit according to aspects of the present disclosure.
FIG. 18C illustrates an exemplary implementation of aggregating a set of output voltages from a corresponding set of multiplier circuits according to aspects of the present disclosure.

FIG. 18B illustrates an exemplary implementation of generating a set of output voltages in a resistive matrix computation circuit according to aspects of the present disclosure. As shown in FIG. 18B, in block 1812, for each resistive multiplier circuit in a plurality of resistive multiplier circuits, the method provides a binary weighted resistor. In block 1814, the method provides a switch, controlled by a result of a logical or of a first bit from the first operand and a second bit from the second operand. In block 1816, the method holds, by a pair of cross-coupled inverters, the result of a logical or of a first bit from the first operand and a second bit from the second operand in the each resistive multiplier circuit. In block 1818, the method generates, by the each resistive multiplier circuit, an output voltage based on the binary weighted resistor, the first bit from the first operand and the second bit from the second operand.

In some implementations, the binary weighted resistor may include at least one of: 1) a resistor configured to represent a resistance value associated with a bit location of the second operand; 2) multiple parallel connected resistors configured to represent the resistance value associated with the bit location of the second operand, where each of the parallel connected resistor has same resistance value, and a number of the multiple parallel connected resistors is in power of two; 3) a transistors configured to represent the resistance associated with the bit location of the second operand based on a ratio of channel width to channel length of the transistor; or 4) multiple parallel connected transistors configured to represent the resistance value associated with the bit location of the second operand, where each of the parallel connected transistor has same resistance value, and a number of the multiple parallel connected transistors is in power of two. The resistance value of the binary weighted resistor associated with each bit location of the second operand is expressed in the form of power of two.

According to aspects of the present disclosure, a programmable operating voltage may be set based on design criteria of an analog to digital converter circuit in the aggregator circuit. The method of performing resistive matrix computation may further include representing the plurality of output voltages based on a ratio of number of pull up resistors and number of pull down resistors. In addition, the plurality of output voltages may be generated to be within a range of output voltages between a high voltage and a low voltage by a plurality of resistive multiplier circuits. A step size of the plurality of output voltages equals to a difference between the high voltage and the low voltage divided by a number of the plurality of multiplier circuits operated in parallel, and where the step size of the plurality of output voltages is configured to be even.

FIG. 18C illustrates an exemplary implementation of aggregating a set of output voltages from a corresponding set of multiplier circuits according to aspects of the present disclosure. In the exemplary implementation shown in FIG. 18C, in block 1822, the method converts, by one or more analog to digital converters, analog outputs of the plurality of multiplier circuits into one or more groups of digital values. In block 1824, the method aligns, by a bit alignment logic, the one or more groups of digital values according to a corresponding bit position of the first operand and a corresponding bit position of the second operand. In block 1826, the method performs, by an arithmetic unit, shift and accumulate operations on the aligned one or more groups of digital values to produce the result of the resistive matrix computation circuit.

FIG. 18D illustrates an exemplary implementation of converting analog outputs of a set of multiplier circuits into one or more groups of digital values according to aspects of the present disclosure. As shown in FIG. 18D, in block 1830, for each analog to digital converter in one or more analog to digital converters, the method compares, by a comparator, an analog output voltage from the plurality of multiplier circuits to an adjustable reference voltage. In block 1832, the method stores, in a successive approximation register, intermediate digital voltages and an output digital voltage of the analog to digital converter. In block 1834, the method sets, by a successive approximation state machine, an intermediate digital voltage or the output digital voltage based on the adjustable reference voltage and a comparison result from the comparator. In block 1836, the method generates, by a reference voltage generator circuit, the adjustable reference voltage using the intermediate digital voltage. In block 1838, the method repeats the above process until the analog output voltage and the adjustable reference voltage are the same, where the intermediate digital voltage is the output digital voltage of the analog to digital converter.

FIG. 18E illustrates an exemplary implementation of generating an adjustable reference voltage according to aspects of the present disclosure. As shown in the example of FIG. 18E, in block 1840, the method replicating a circuit structure of a plurality of multiplier circuits. In block 1842, the method representing, by a set of selectable binary weighted resistors, a level of the adjustable reference voltage based on the intermediate digital voltage stored in the successive approximation register.

Figure 19B:
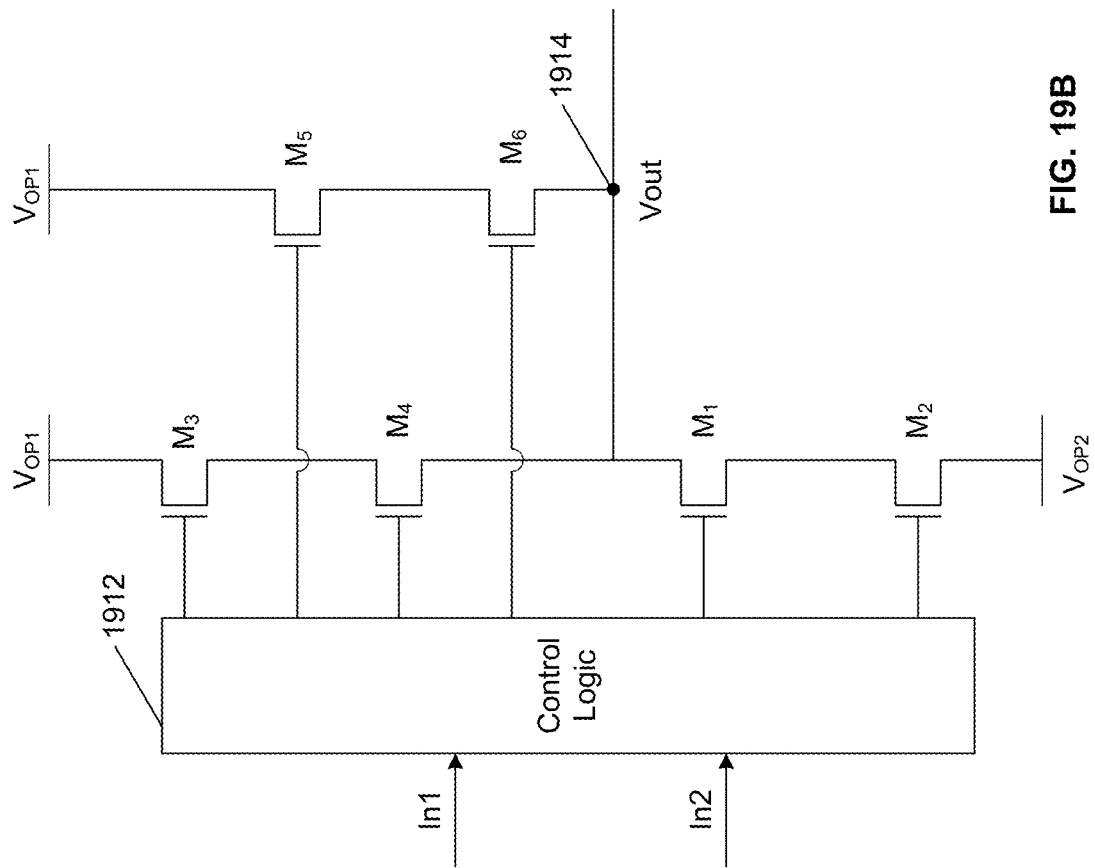
FIG. 19A-FIG. 19F illustrate exemplary implementations of a resistive multiplier circuit using NMOS transistors according to aspects of the present disclosure.
Figure 19A:
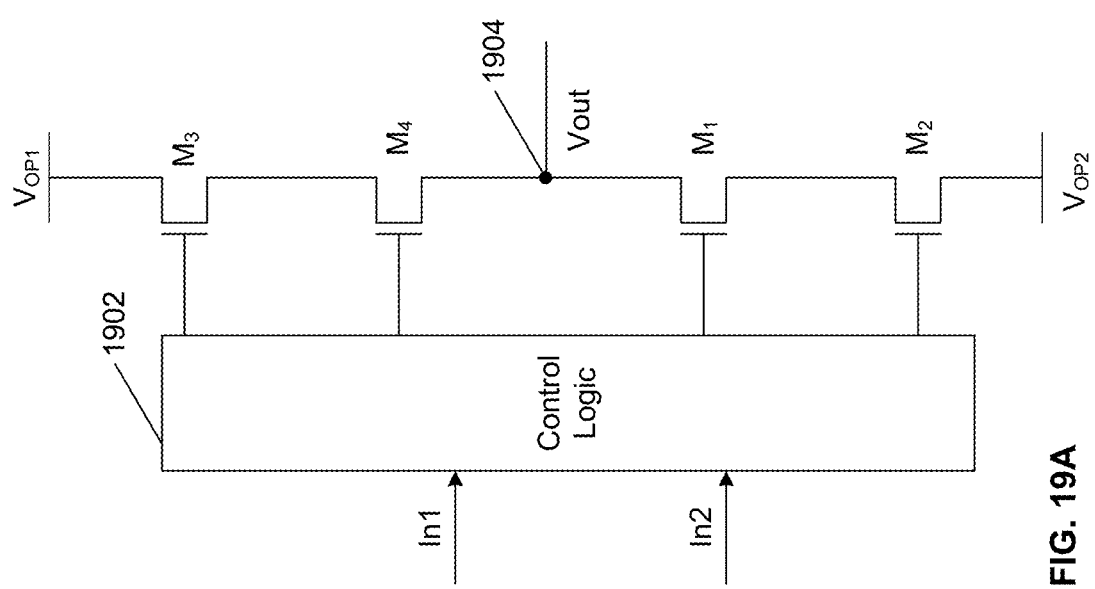

FIG. 19A illustrates an exemplary implementation of a resistive multiplier circuit using NMOS transistors according to aspects of the present disclosure. As shown in the example of FIG. 19A, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 19A. Each of the transistor is configured to produce a substantially the same binary weighted resistance value.

The resistive multiplier circuit further includes a control logic 1902 configured to control the plurality of transistors $M_1$, $M_2$, $M_3$, and $M_4$ to produce an output voltage at node 1904 according to the truth table below.

| In1 | In2 | Vout |
|-----|-----|------|
| 1 | 1 | Pull down to $V_{OP2}$ |
| 1 | 0 | Pull up to $V_{OP1}$ |
| 0 | 1 | Pull up to $V_{OP1}$ |
| 0 | 0 | Pull up to $V_{OP1}$ |

In other words, the control logic 1902 configured to control the plurality of transistors $M_1$, $M_2$, $M_3$, and $M_4$ to produce an output voltage at node 1904 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, and $M_4$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that the logic implementation that represent the above truth table may be reversed, which is a matter of design choice, as long as the design choice is adopted consistently across the implementation of the resistive matrix computation circuit.

According to aspects of the present disclosure, the transistors $M_1$, $M_2$, $M_3$, and $M_4$ may be biased to reduce errors and to reduce power consumption of the transistors. For example, the voltage differential between the gate terminal and the source terminal of a transistor is set to as high as allowed by the particular design of the resistive computation circuit to reduce the adverse impact due to transistor variations, such as variations of the threshold voltage of the transistors. In addition, the voltage differential between the drain terminal and the source terminal of a transistor is set to as low as allowed by the particular design of the resistive computation circuit to keep the transistors operating in the linear region. Operating in the linear region also ensures the transistors to produce a substantially constant resistance value during operation. In addition, a low voltage differential between the drain terminal and the source terminal also reduces the gain of the transistor, which in turn reduces errors associated with variations of the threshold voltage of the transistors. Furthermore, a low voltage differential between the drain terminal and the source terminal enables the resistive matrix computation circuit to consume less power. The programmable $V_{OP1}$ and $V_{OP2}$ may be set according to a design tradeoff between error tolerance and the design complexity of the analog to digital converts used in the resistive matrix computation circuit. Circuit simulations may be performed to select the appropriate design tradeoff prior to the circuit being manufactured.

FIG. 19B illustrates another exemplary implementation of a resistive multiplier circuit using NMOS transistors according to aspects of the present disclosure. As shown in FIG. 19B, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 19B. Each of the transistor is configured to produce a substantially the same binary weighted resistance value.

The resistive multiplier circuit further includes a control logic 1912 configured to control the plurality of transistors $M_1$, $M_2$, $M_3$, $M_4$, $M_5$, and $M_6$ to produce an output voltage at node 1914 according to the truth table shown above in association with the description of FIG. 19A. In other words, the control logic 1912 configured to control the plurality of transistors $M_1$, $M_2$, $M_3$, $M_4$, $M_5$, and $M_6$ to produce an output voltage at node 1914 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, $M_4$, $M_5$, and $M_6$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that in situations where there is a pull up of the node 1914, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

Figure 19D:
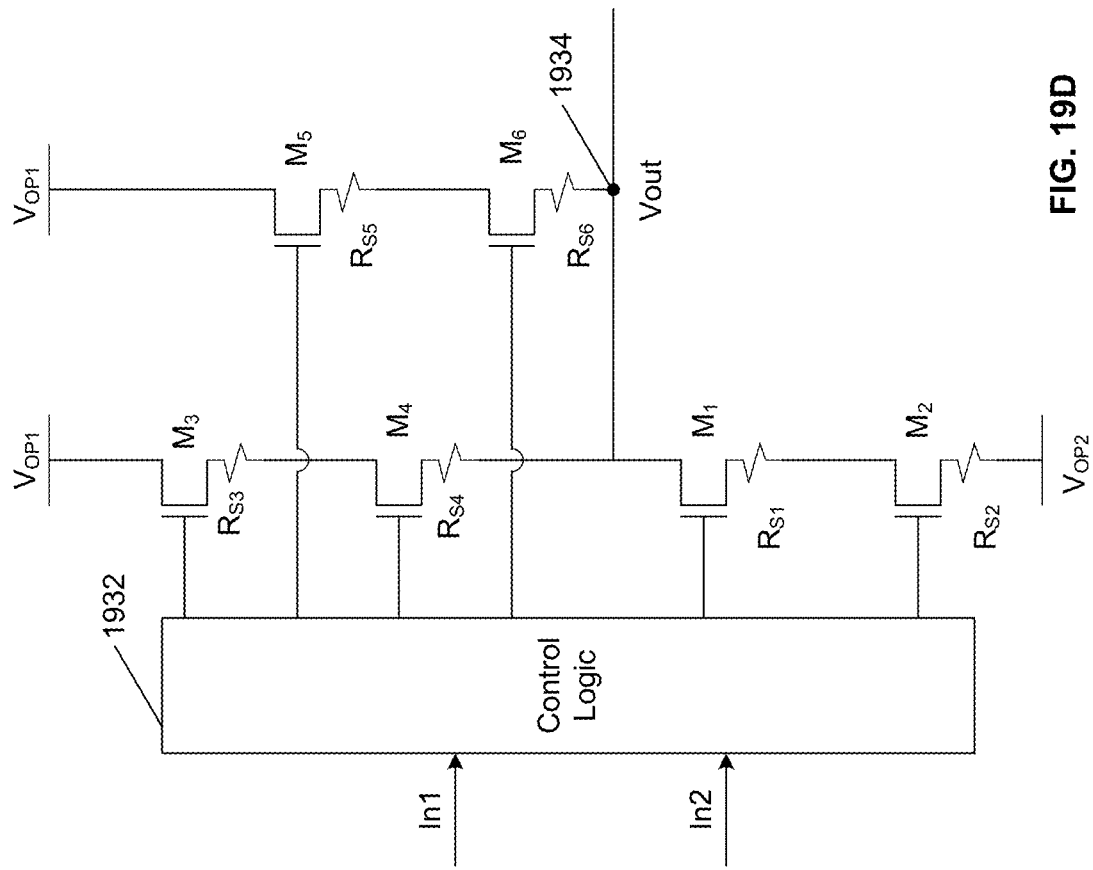
Figure 19C:
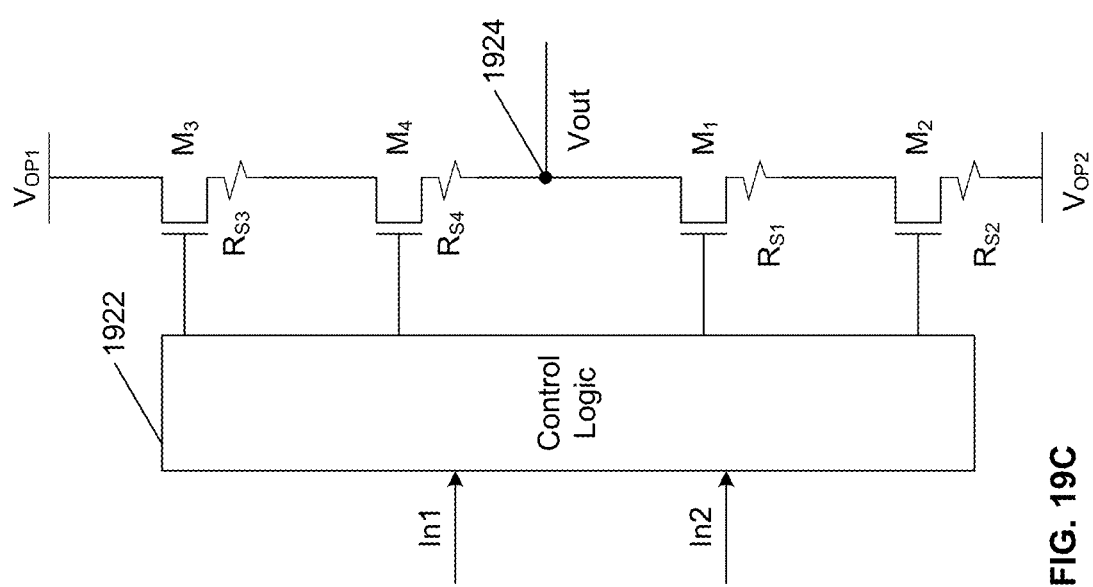

FIG. 19C illustrates yet another exemplary implementation of a resistive multiplier circuit using NMOS transistors according to aspects of the present disclosure. Similar to the circuit structure of FIG. 19A, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 19C. Each of the transistor is configured to produce a substantially the same binary weighted resistance value.

The resistive multiplier circuit further includes a control logic 1922 configured to control the plurality of transistors $M_1$, $M_2$, $M_3$, and $M_4$ to produce an output voltage at node 1924 according to the truth table shown above in association with the description of FIG. 19A.

In addition, for each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$.

FIG. 19D illustrates yet another exemplary implementation of a resistive multiplier circuit using NMOS transistors according to aspects of the present disclosure. In the exemplary implementation of FIG. 19D, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 19D. Each of the transistor is configured to produce a substantially the same binary weighted resistance value.

The resistive multiplier circuit further includes a control logic 1932 configured to control the plurality of transistors $M_1$, $M_2$, $M_3$, $M_4$, $M_5$, and $M_6$ to produce an output voltage at node 1934 according to the truth table shown above in association with the description of FIG. 19A. In other words, the control logic 1932 configured to control the plurality of transistors $M_1$, $M_2$, $M_3$, $M_4$, $M_5$, and $M_6$ to produce an output voltage at node 1934 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, $M_4$, $M_5$, and $M_6$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that in situations where there is a pull up of the node 1934, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

In addition, for each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$.

Figure 19F:
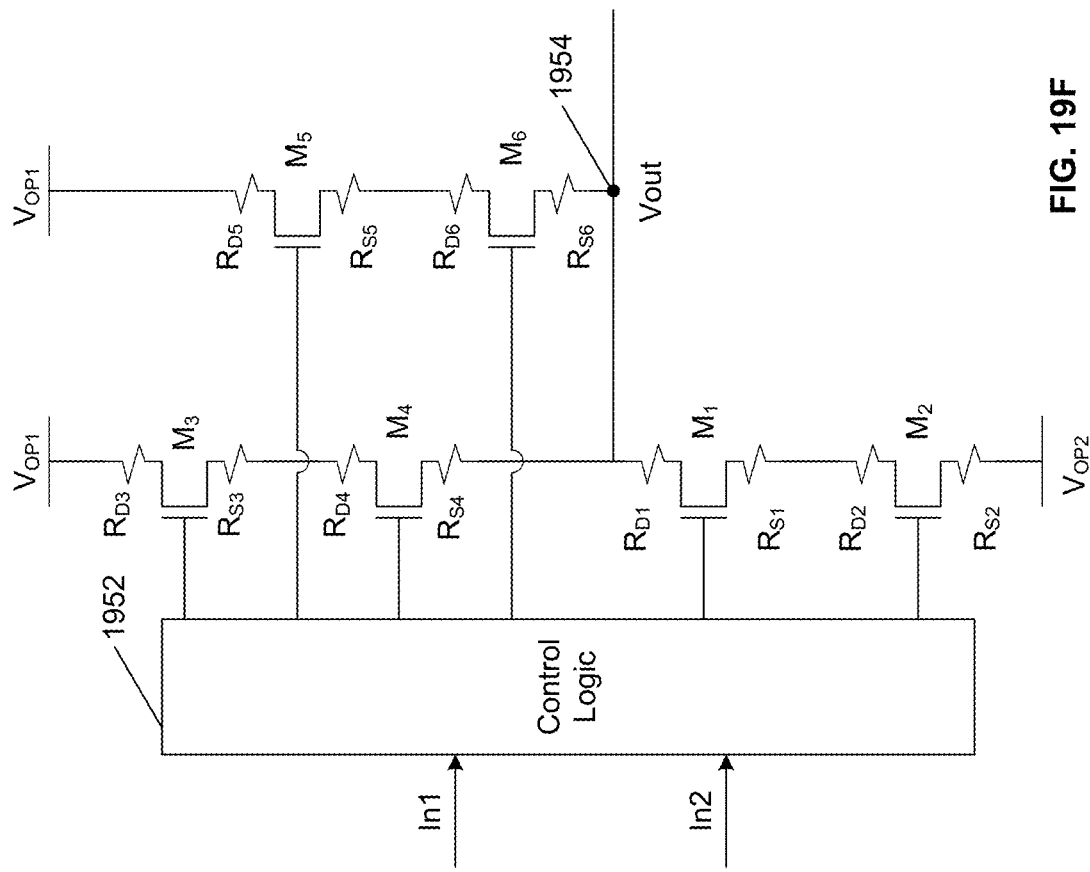
Figure 19E:
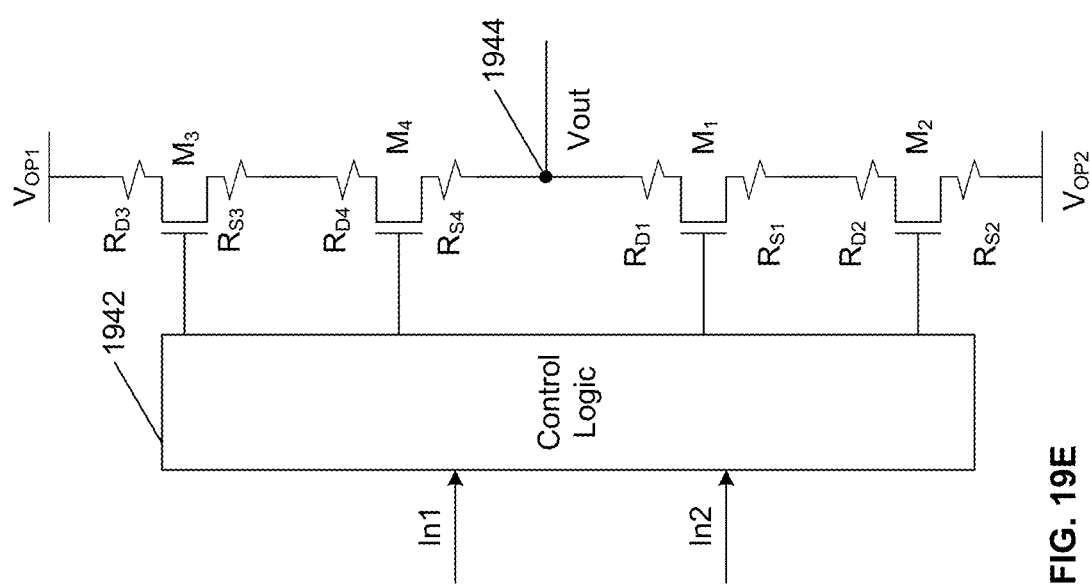

FIG. 19E illustrates yet another exemplary implementation of a resistive multiplier circuit using NMOS transistors according to aspects of the present disclosure. As shown in FIG. 19E, similar to the circuit structure of FIG. 19C, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 19E. Each of the transistor is configured to produce a substantially the same binary weighted resistance value.

The resistive multiplier circuit further includes a control logic 1942 configured to control the plurality of transistors $M_1$, $M_2$, $M_3$, and $M_4$ to produce an output voltage at node 1944 according to the truth table shown above in association with the description of FIG. 19A.

For each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$. In addition, for each transistor in the plurality of transistors, a drain resistor, which is coupled to a drain terminal of the transistor, where the drain resistor, for example $R_{D3}$ of transistor $M_3$, is configured to provide a drain resistance to enhance linearity of the transistor $M_3$.

FIG. 19F illustrates yet another exemplary implementation of a resistive multiplier circuit using NMOS transistors according to aspects of the present disclosure. Similar to the example of FIG. 19D, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 19F. Each of the transistor is configured to produce a substantially the same binary weighted resistance value.

The resistive multiplier circuit further includes a control logic 1952 configured to control the plurality of transistors $M_1$, $M_2$, $M_3$, $M_4$, $M_5$, and $M_6$ to produce an output voltage at node 1954 according to the truth table shown above in association with the description of FIG. 19A. In other words, the control logic 1952 configured to control the plurality of transistors $M_1$, $M_2$, $M_3$, $M_4$, $M_5$, and $M_6$ to produce an output voltage at node 1954 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, $M_4$, $M_5$, and $M_6$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that in situations where there is a pull up of the node 1954, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

For each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$. In addition, for each transistor in the plurality of transistors, a drain resistor, which is coupled to a drain terminal of the transistor, where the drain resistor, for example $R_{D3}$ of transistor $M_3$, is configured to provide a drain resistance to enhance linearity of the transistor $M_3$.

FIG. 20A illustrates an exemplary implementation of a resistive multiplier circuit using PMOS transistors according to aspects of the present disclosure. As shown in the example of FIG. 20A, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 20A. Each of the transistor is configured to produce a substantially the same binary weighted resistance value.

The resistive multiplier circuit further includes a control logic 2002 configured to control the plurality of transistors $M_1$, $M_2$, $M_3$, and $M_4$ to produce an output voltage at node 2004 according to the truth table described above in association with FIG. 19A.

In other words, the control logic 2002 configured to control the plurality of transistors $M_1$, $M_2$, $M_3$, and $M_4$ to produce an output voltage at node 2004 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, and $M_4$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that the logic implementation that represent the truth table may be reversed, which is a matter of design choice, as long as the design choice is adopted consistently across the implementation of the resistive matrix computation circuit.

According to aspects of the present disclosure, the transistors $M_1$, $M_2$, $M_3$, and $M_4$ may be biased to reduce errors and to reduce power consumption of the transistors. For example, the voltage differential between the gate terminal and the source terminal of a transistor is set to as high as allowed by the particular design of the resistive computation circuit to reduce the adverse impact due to transistor variations, such as variations of the threshold voltage of the transistors. In addition, the voltage differential between the drain terminal and the source terminal of a transistor is set to as low as allowed by the particular design of the resistive computation circuit to keep the transistors operating in the linear region. Operating in the linear region also ensures the transistors to produce a substantially constant resistance value during operation. In addition, a low voltage differential between the drain terminal and the source terminal also reduces the gain of the transistor, which in turn reduces errors associated with variations of the threshold voltage of the transistors. Furthermore, a low voltage differential between the drain terminal and the source terminal enables the resistive matrix computation circuit to consume less power. The programmable $V_{OP1}$ and $V_{OP2}$ may be set according to a design tradeoff between error tolerance and the design complexity of the analog to digital converts used in the resistive matrix computation circuit. Circuit simulations may be performed to select the appropriate design tradeoff prior to the circuit being manufactured.

FIG. 20B illustrates another exemplary implementation of a resistive multiplier circuit using PMOS transistors according to aspects of the present disclosure. As shown in FIG. 20B, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 20B. Each of the transistor is configured to produce a substantially the same binary weighted resistance value.

The resistive multiplier circuit further includes a control logic 2012 configured to control the plurality of transistors $M_1$, $M_2$, $M_3$, $M_4$, $M_5$, and $M_6$ to produce an output voltage at node 2014 according to the truth table shown above in association with the description of FIG. 19A. In other words, the control logic 2012 configured to control the plurality of transistors $M_1$, $M_2$, $M_3$, $M_4$, $M_5$, and $M_6$ to produce an output voltage at node 2014 that is pulled up to a first programmable operating voltage $V_{OP1}$ when both input bits, In1 and In2, of the resistive multiplier has a value of logical one, where the output voltage is proportional to a resistance value of pull up transistors. The control logic is further configured to control the plurality of transistors $M_1$, $M_2$, $M_3$, $M_4$, $M_5$, and $M_6$ to produce the output voltage that is pulled down to a second programmable operating voltage $V_{OP2}$ when at least one of the input bits of the resistive multiplier has a value of logical zero, where in the output voltage is proportional to a resistance value of pull down transistors in the plurality of transistors. The resistance value of the pull up transistors and the resistance value of the pull down transistors are designed to be substantially the same. Note that in situations where there is a pull up of the node 2014, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

Figure 20D:
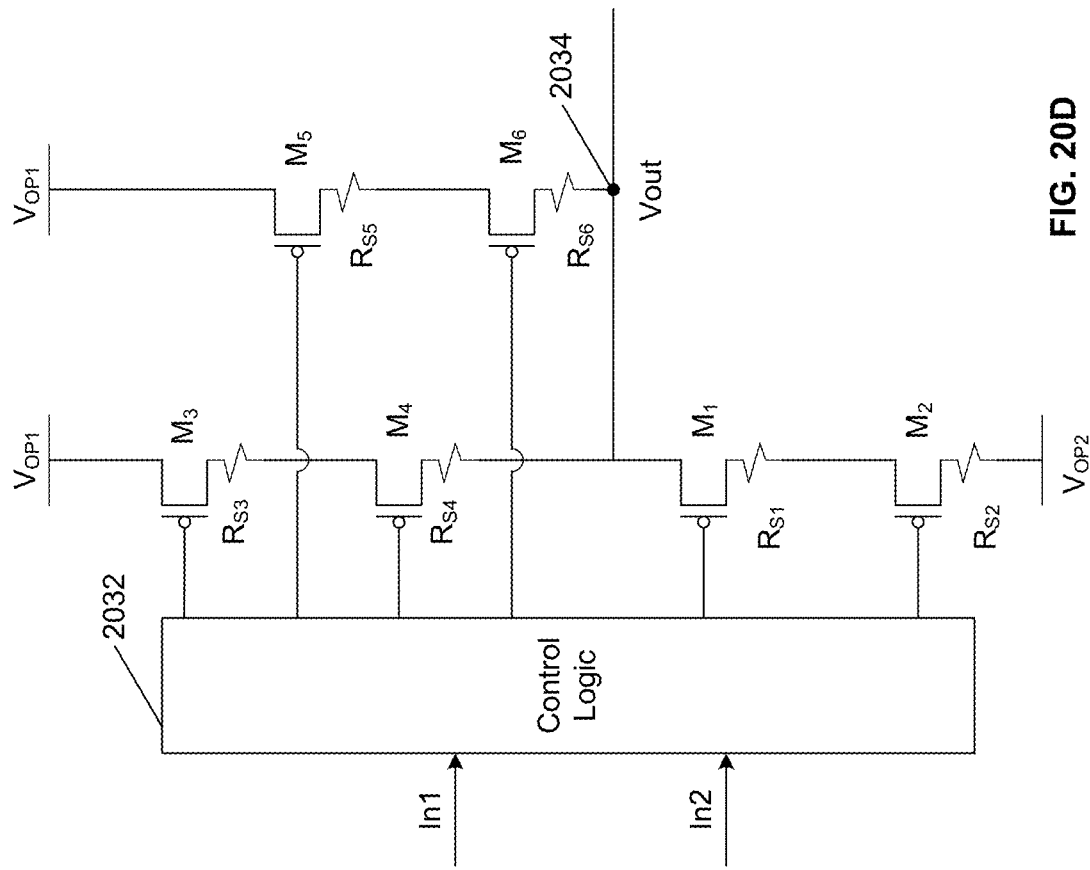
Figure 20C:
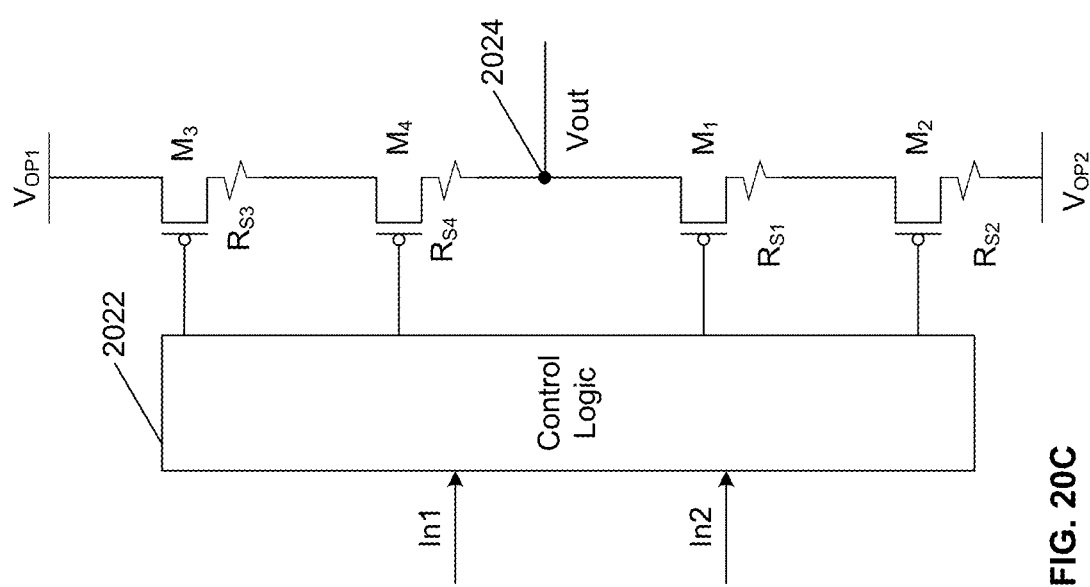

FIG. 20C illustrates yet another exemplary implementation of a resistive multiplier circuit using PMOS transistors according to aspects of the present disclosure. Similar to the circuit structure of FIG. 20A, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 20C. Each of the transistor is configured to produce a substantially the same binary weighted resistance value.

The resistive multiplier circuit further includes a control logic 2022 configured to control the plurality of transistors $M_1$, $M_2$, $M_3$, and $M_4$ to produce an output voltage at node 2024 according to the truth table shown above in association with the description of FIG. 19A.

In addition, for each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$.

FIG. 20D illustrates yet another exemplary implementation of a resistive multiplier circuit using PMOS transistors according to aspects of the present disclosure. In the exemplary implementation of FIG. 20D, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 20D. Each of the transistor is configured to produce a substantially the same binary weighted resistance value.

The resistive multiplier circuit further includes a control logic 2032 configured to control the plurality of transistors $M_1$, $M_2$, $M_3$, $M_4$, $M_5$, and $M_6$ to produce an output voltage at node 2034 according to the truth table shown above in association with the description of FIG. 19A. The resistance value of the pull up transistors and the resistance value of the pull down transistors are designed to be substantially the same. Note that in situations where there is a pull up of the node 2034, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

In addition, for each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$.

Figure 20F:
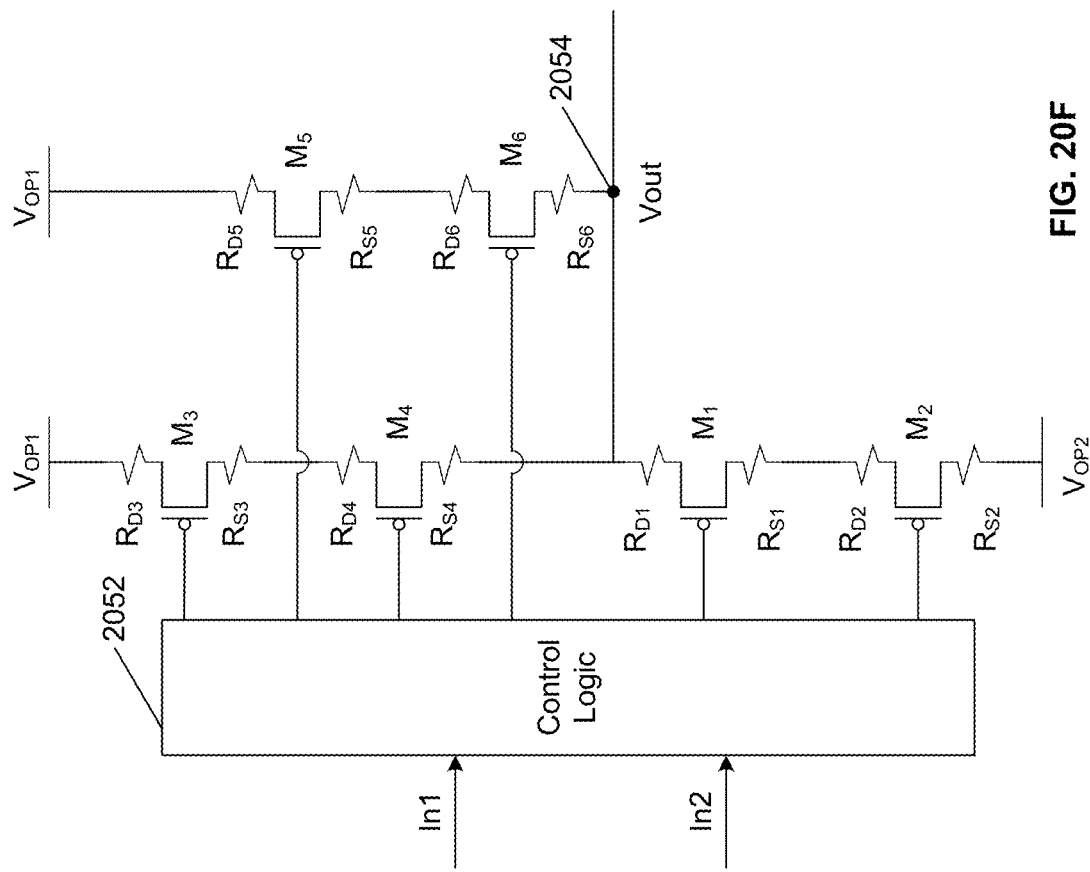
Figure 20E:
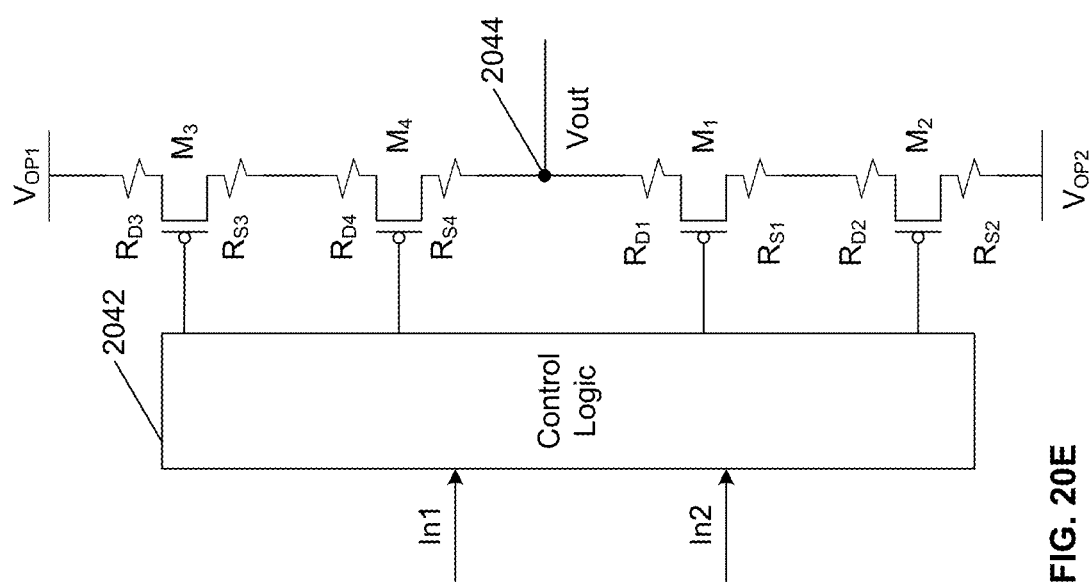

FIG. 20E illustrates yet another exemplary implementation of a resistive multiplier circuit using PMOS transistors according to aspects of the present disclosure. As shown in FIG. 20E, similar to the circuit structure of FIG. 20C, the resistive multiplier circuit includes a plurality of transistors, namely $M_1$, $M_2$, $M_3$, and $M_4$, each transistor in the plurality of transistors can be biased to operate in the linear region of the transistor. The transistors $M_1$, $M_2$, $M_3$, and $M_4$ are connected in the manner as shown in FIG. 20E. Each of the transistor is configured to produce a substantially the same binary weighted resistance value.

The resistive multiplier circuit further includes a control logic 2042 configured to control the plurality of transistors $M_1$, $M_2$, $M_3$, and $M_4$ to produce an output voltage at node 2044 according to the truth table shown above in association with the description of FIG. 19A.

For each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$. In addition, for each transistor in the plurality of transistors, a drain resistor, which is coupled to a drain terminal of the transistor, where the drain resistor, for example $R_{D3}$ of transistor $M_3$, is configured to provide a drain resistance to enhance linearity of the transistor $M_3$.

FIG. 20F illustrates yet another exemplary implementation of a resistive multiplier circuit using PMOS transistors according to aspects of the present disclosure. Similar to the example of FIG. 20D, the resistive multiplier circuit includes a plurality of transistors, namely $M_1$, $M_2$, $M_3$, $M_4$, $M_5$, and $M_6$, each transistor in the plurality of transistors can be biased to operate in the linear region of the transistor. The transistors $M_1$, $M_2$, $M_3$, $M_4$, $M_5$, and $M_6$ are connected in the manner as shown in FIG. 20F. Each of the transistor is configured to produce a substantially the same binary weighted resistance value.

The resistive multiplier circuit further includes a control logic 2052 configured to control the plurality of transistors $M_1$, $M_2$, $M_3$, $M_4$, $M_5$, and $M_6$ to produce an output voltage at node 2054 according to the truth table shown above in association with the description of FIG. 19A. The resistance value of the pull up transistors and the resistance value of the pull down transistors are designed to be substantially the same. Note that in situations where there is a pull up of the node 1954, only one of the pull up path is enabled.

According to aspects of the present disclosure, the transistors $M_1$, $M_2$, $M_3$, $M_4$, $M_5$, and $M_6$ may be biased to reduce errors and to reduce power consumption of the transistors, similar to the manner of biasing transistors $M_1$, $M_2$, $M_3$, $M_4$ described in association with FIG. 19A.

For each transistor in the plurality of transistors, the resistive multiplier circuit further includes a source resistor, which is coupled to a source terminal of the transistor, where the source resistor, for example $R_{S1}$ of transistor $M_1$, is configured to provide a de-generation resistance to enhance linearity of the transistor $M_1$. In addition, for each transistor in the plurality of transistors, a drain resistor, which is coupled to a drain terminal of the transistor, where the drain resistor, for example $R_{D3}$ of transistor $M_3$, is configured to provide a drain resistance to enhance linearity of the transistor $M_3$.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A resistive matrix computation circuit, comprising:
    a memory configured to store a first set of operands and a second set of operands, wherein the first set of input operands and the second set of input operands are programmable by a controller, wherein the first set of operands and the second set of operands are cross-multiplied to form a plurality of product pairs;
    a plurality of resistive multiplier circuits configured to generate a plurality of output voltages according to the plurality of product pairs; the controller is configured to control the plurality of resistive multiplier circuits to perform multiplications using the first set of operands and the second set of operands; and
    an aggregator circuit configured to aggregate the plurality of output voltages from the plurality of resistive multiplier circuits, wherein the plurality of output voltages represent an aggregated value of the plurality of product pairs.

2. The resistive matrix computation circuit of claim 1, wherein each resistive multiplier circuit in the plurality of resistive multiplier circuits comprises:
    a binary weighted resistor;
    a switch, controlled by a result of a logical OR of a first bit from the first operand and a second bit from the second operand; and
    a pair of cross-coupled inverters configured to hold the result of a logical OR of a first bit from the first operand and a second bit from the second operand in the each resistive multiplier circuit,
    wherein the each resistive multiplier circuit is configured to generate an output voltage based on the binary weighted resistor, the first bit from the first operand and the second bit from the second operand.

3. The resistive matrix computation circuit of claim 2, wherein the binary weighted resistor comprises at least one of:
    a resistor configured to represent a resistance value associated with a bit location of the second operand;
    multiple parallel connected resistors configured to represent the resistance value associated with the bit location of the second operand, wherein each of the parallel connected resistor has same resistance value, and a number of the multiple parallel connected resistors is in power of two;
    a transistor configured to represent the resistance associated with the bit location of the second operand based on a ratio of channel width to channel length of the transistor; or
    multiple parallel connected transistors configured to represent the resistance value associated with the bit location of the second operand, wherein each of the parallel connected transistor has same resistance value, and a number of the multiple parallel connected transistors is in power of two;

wherein the resistance value associated with each bit location of the second operand is expressed in the form of power of two.

4. The resistive matrix computation circuit of claim 1, wherein each resistive multiplier circuit in the plurality of resistive multiplier circuits further comprises:

a PMOS transistor having a source terminal coupled to a programmable operating voltage, a gate terminal coupled to an input representing logical OR of a first bit from the first operand and a second bit from the second operand, and a drain terminal coupled to an output of the resistive multiplier circuit, wherein the PMOS transistor is configured to perform as a binary weighted resistor; and a NMOS transistor having a source terminal coupled to a circuit ground, a gate terminal coupled to the input representing logical OR of the first bit from the first operand and the second bit from the second operand, a drain terminal couple to the output of the resistive multiplier circuit, wherein the NMOS transistor is configured to perform as a binary weighted resistor;

wherein each of the PMOS transistor and the NMOS transistor is configured to produce a same resistance value, and the PMOS transistor and the NMOS transistor are configured to generate an output voltage based on the first bit from the first operand and the second bit from the second operand, and wherein the programmable operating voltage is set based on design criteria of an analog to digital converter circuit in the aggregator circuit.

5. The resistive matrix computation circuit of claim 1, wherein each resistive multiplier circuit in the plurality of resistive multiplier circuits further comprises:

a plurality of transistors, wherein each transistor in the plurality of transistors is biased to operate in the linear region of the transistor;

a control logic configured to control the plurality of transistors to produce an output voltage that is pulled up to a first programmable operating voltage when both input bits of the resistive multiplier has a value of logical one, wherein the output voltage is proportional to a resistance value of pull up transistors in the plurality of transistors; and the control logic is further configured to control the plurality of transistors to produce the output voltage that is pulled down to a second programmable operating voltage when at least one of the input bits of the resistive multiplier has a value of logical zero, wherein the output voltage is proportional to a resistance value of pull down transistors in the plurality of transistors.

6. The resistive matrix computation circuit of claim 5, further comprises:

for each transistor in the plurality of transistors, a source resistor, coupled to a source terminal of the transistor, wherein the source resistor is configured to provide a de-generation resistance to enhance linearity of the transistor.

7. The resistive matrix computation circuit of claim 6, further comprises:

for each transistor in the plurality of transistors, a drain resistor, coupled to a drain terminal of the transistor, wherein the drain resistor is configured to provide a drain resistance to enhance linearity of the transistor.

8. The resistive matrix computation circuit of claim 1, wherein the plurality of output voltages are represented based on a ratio of number of pull up resistors and number of pull down resistors.

9. The resistive matrix computation circuit of claim 1, wherein the plurality of output voltages generated by the plurality of resistive multiplier circuits are configured to be within a range of output voltages between a high voltage and a low voltage, and a step size of the plurality of output voltages equals to a difference between the high voltage and the low voltage divided by a number of the plurality of multiplier circuits operated in parallel, wherein the step size of the plurality of output voltages is configured to be even.

10. The resistive matrix computation circuit of claim 1, wherein the aggregator circuit comprises:

one or more analog to digital converters configured to convert analog outputs of the plurality of multiplier circuits into one or more groups of digital values;

a bit alignment logic configured to align the one or more groups of digital values according to a corresponding bit position of the first operand and a corresponding bit position of the second operand; and an arithmetic unit configured to perform shift and accumulate operations on the aligned one or more groups of digital values to produce the result of the resistive matrix computation circuit.

11. The resistive matrix computation circuit of claim 10, wherein an analog to digital converter in the one or more analog to digital converters comprises:

a comparator configured to compare an analog output voltage from the plurality of multiplier circuits to an adjustable reference voltage;

a successive approximation register configured to store intermediate digital voltages and an output digital voltage of the analog to digital converter;

a successive approximation state machine configured to set an intermediate digital voltage or the output digital voltage based on the adjustable reference voltage and a comparison result from the comparator; and a reference voltage generator circuit configured to generate the adjustable reference voltage using the intermediate digital voltage, wherein the above process is repeated until the analog output voltage and the adjustable reference voltage are the same, and wherein the intermediate digital voltage is the output digital voltage of the analog to digital converter.

12. The resistive matrix computation circuit of claim 11, wherein the reference voltage generator circuit comprises:

a circuit structure replicating the plurality of multiplier circuits; and a set of selectable binary weighted resistors configured to represent a level of the adjustable reference voltage based on the intermediate digital voltage stored in the successive approximation register.

13. A method performing resistive matrix computation, comprising:

storing, in a memory, a first set of operands and a second set of operands, wherein the first set of operands and the second set of operands are cross-multiplied to form a plurality of product pairs;

generating, by a plurality of multiplier circuits, a plurality of output voltages according to the plurality of product pairs; and aggregating, by an aggregator circuit, the plurality of output voltages from the plurality of multiplier circuits, wherein the plurality of output voltages represent an aggregated value of the plurality of product pairs.

14. The method of claim 13, wherein generating a plurality of output voltages comprises:
for each resistive multiplier circuit in the plurality of resistive multiplier circuits,
providing a binary weighted resistor;
providing a switch, controlled by a result of a logical OR of a first bit from the first operand and a second bit from the second operand; and
holding, by a pair of cross-coupled inverters, the result of a logical OR of a first bit from the first operand and a second bit from the second operand in the each resistive multiplier circuit,
generating, by the each resistive multiplier circuit, an output voltage based on the binary weighted resistor, the first bit from the first operand and the second bit from the second operand.

15. The method of claim 14, wherein the binary weighted resistor comprises at least one of:
a resistor configured to represent a resistance value associated with a bit location of the second operand;
multiple parallel connected resistors configured to represent the resistance value associated with the bit location of the second operand, wherein each of the parallel connected resistor has same resistance value, and a number of the multiple parallel connected resistors is in power of two;
a transistor configured to represent the resistance associated with the bit location of the second operand based on a ratio of channel width to channel length of the transistor; or
multiple parallel connected transistors configured to represent the resistance value associated with the bit location of the second operand, wherein each of the parallel connected transistor has same resistance value, and a number of the multiple parallel connected transistors is in power of two;
wherein the resistance value associated with each bit location of the second operand is expressed in the form of power of two.

16. The method of claim 13, wherein each resistive multiplier circuit in the plurality of resistive multiplier circuits further comprises:
a PMOS transistor having a source terminal coupled to a programmable operating voltage, a gate terminal coupled to an input representing logical OR of a first bit from the first operand and a second bit from the second operand, and a drain terminal coupled to an output of the resistive multiplier circuit, wherein the PMOS transistor is configured to perform as a binary weighted resistor; and
a NMOS transistor having a source terminal coupled to a circuit ground, a gate terminal coupled to the input representing logical OR of the first bit from the first operand and the second bit from the second operand, a drain terminal couple to the output of the resistive multiplier circuit, wherein the NMOS transistor is configured to perform as a binary weighted resistor;
wherein each of the PMOS transistor and the NMOS transistor is configured to produce a same resistance value, and the PMOS transistor and the NMOS transistor are configured to generate an output voltage based on the first bit from the first operand and the second bit from the second operand, and wherein the programmable operating voltage is set based on design criteria of an analog to digital converter circuit in the aggregator circuit.

17. The method of claim 13, wherein each resistive multiplier circuit in the plurality of resistive multiplier circuits further comprises:
a plurality of transistors, wherein each transistor in the plurality of transistors is biased to operate in the linear region of the transistor;
a control logic configured to control the plurality of transistors to produce an output voltage that is pulled up to a first programmable operating voltage when both input bits of the resistive multiplier has a value of logical one, wherein the output voltage is proportional to a resistance value of pull up transistors in the plurality of transistors; and
the control logic is further configured to control the plurality of transistors to produce the output voltage that is pulled down to a second programmable operating voltage when at least one of the input bits of the resistive multiplier has a value of logical zero, wherein the output voltage is proportional to a resistance value of pull down transistors in the plurality of transistors.

18. The method of claim 17, further comprises:
for each transistor in the plurality of transistors, a source resistor, coupled to a source terminal of the transistor, wherein the source resistor is configured to provide a de-generation resistance to enhance linearity of the transistor.

19. The method of claim 18, further comprises:
for each transistor in the plurality of transistors, a drain resistor, coupled to a drain terminal of the transistor, wherein the drain resistor is configured to provide a drain resistance to enhance linearity of the transistor.

20. The method of claim 13, further comprising:
representing the plurality of output voltages based on a ratio of number of pull up resistors and number of pull down resistors.

21. The method of claim 13, further comprising:
generating, by the plurality of resistive multiplier circuits, the plurality of output voltages to be within a range of output voltages between a high voltage and a low voltage,
wherein a step size of the plurality of output voltages equals to a difference between the high voltage and the low voltage divided by a number of the plurality of multiplier circuits operated in parallel, and
wherein the step size of the plurality of output voltages is configured to be even.

22. The method of claim 13, wherein aggregating the plurality of output voltages from the plurality of multiplier circuits comprises:
converting, by one or more analog to digital converters, analog outputs of the plurality of multiplier circuits into one or more groups of digital values;
aligning, by a bit alignment logic, the one or more groups of digital values according to a corresponding bit position of the first operand and a corresponding bit position of the second operand; and
performing, by an arithmetic unit, shift and accumulate operations on the aligned one or more groups of digital values to produce the result of the resistive matrix computation circuit.

23. The method of claim 22, wherein converting analog outputs of the plurality of multiplier circuits comprises:
for each analog to digital converter in the one or more analog to digital converters,
comparing, by a comparator, an analog output voltage from the plurality of multiplier circuits to an adjustable reference voltage;
storing, in a successive approximation register, intermediate digital voltages and an output digital voltage of the analog to digital converter;
setting, by a successive approximation state machine, an intermediate digital voltage or the output digital voltage based on the adjustable reference voltage and a comparison result from the comparator;
generating, by a reference voltage generator circuit, the adjustable reference voltage using the intermediate digital voltage; and
repeating the above process until the analog output voltage and the adjustable reference voltage are the same, wherein the intermediate digital voltage is the output digital voltage of the analog to digital converter.

24. The method of claim 23, wherein generating the adjustable reference voltage comprises:
replicating a circuit structure of the plurality of multiplier circuits; and
representing, by a set of selectable binary weighted resistors, a level of the adjustable reference voltage based on the intermediate digital voltage stored in the successive approximation register.

* * * * *